US009086955B2

(12) United States Patent
Jiang et al.

(10) Patent No.: US 9,086,955 B2
(45) Date of Patent: Jul. 21, 2015

(54) RANK-MODULATION REWRITING CODES FOR FLASH MEMORIES

(71) Applicants: California Institute of Technology, Pasadena, CA (US); Texas A&M University System, College Station, TX (US)

(72) Inventors: Anxiao Jiang, College Station, TX (US); Eyal En Gad, Pasadena, CA (US); Jehoshua Bruck, Pasadena, CA (US); Eitan Yaakobi, Pasadena, CA (US)

(73) Assignees: California Institute of Technology, Pasadena, CA (US); Texas A&M University System, College Station, TX (US)

( * ) Notice: Subject to any disclaimer, the term of this patent is extended or adjusted under 35 U.S.C. 154(b) by 149 days.

(21) Appl. No.: 13/791,823

(22) Filed: Mar. 8, 2013

(65) Prior Publication Data

US 2013/0254466 A1    Sep. 26, 2013

Related U.S. Application Data

(60) Provisional application No. 61/608,245, filed on Mar. 8, 2012, provisional application No. 61/608,465, filed on Mar. 8, 2012, provisional application No. 61/725,347, filed on Nov. 12, 2012.

(51) Int. Cl.
*G06F 12/02* (2006.01)
*H03M 13/13* (2006.01)
(Continued)

(52) U.S. Cl.
CPC .......... *G06F 12/0246* (2013.01); *G11C 7/1006* (2013.01); *G11C 11/5628* (2013.01); *G11C 16/10* (2013.01); *H03M 13/13* (2013.01); *G11C 2211/5649* (2013.01)

(58) Field of Classification Search
None
See application file for complete search history.

(56) References Cited

U.S. PATENT DOCUMENTS 7,656,706 B2 * 2/2010 Jiang et al. ............... 365/185.03
8,225,180 B2    7/2012 Jiang et al.
(Continued)

FOREIGN PATENT DOCUMENTS

WO    2011156750 A2    12/2011

OTHER PUBLICATIONS

Jiang, A., Mateescu, R., Schwartz, M. and J. Bruck. (2009) "Rank Modulation for Flash Memories." IEEE Transactions on Information Theory, vol. 55, No. 6.*
(Continued)

*Primary Examiner* — Christian P Chace
*Assistant Examiner* — Tracy A Warren
(74) *Attorney, Agent, or Firm* — Turk IP Law, LLC

(57) ABSTRACT

Rank modulation has been recently proposed as a scheme for storing information in flash memories. Three improved aspects are disclosed. In one aspect the minimum push-up scheme, for storing data in flash memories is provided. It aims at minimizing the cost of changing the state of the memory. In another aspect, multi-cells, used for storing data in flash memories is provided. Each transistor is replaced with a multi-cell of mm transistors connected in parallel. In yet another aspect, multi-permutations, are provided. The paradigm of representing information with permutations is generalized to the case where the number of cells in each level is a constant greater than one. In yet another aspect, rank-modulation rewriting schemes which take advantage of polar codes, are provided for use with flash memory.

33 Claims, 18 Drawing Sheets

(51) Int. Cl.
G11C 16/10 (2006.01)
G11C 7/10 (2006.01)
G11C 11/56 (2006.01)

(56) References Cited

U.S. PATENT DOCUMENTS

| | | | |
|---|---|---|---|
| 8,245,094 B2 | 8/2012 | Jiang et al. | |
| 2009/0132758 A1* | 5/2009 | Jiang et al. | 711/103 |
| 2009/0132895 A1* | 5/2009 | Jiang et al. | 714/781 |

OTHER PUBLICATIONS

Jiang, A., Bohossian, V. and J. Bruck. (2010) "Rewriting Codes for Joint Information Storage in Flash Memories." IEEE Transactions on Information Theory, vol. 56, No. 10.*
Jiang, A. and J. Bruck. (2009) "Information Representations and Coding for Flash Memories." IEEE Pacific Rim Conference on Communications, Computers and Signal Processing, pp. 920-925.*
Jiang et al. (Jiang, A., Mateescu, R., Schwartz, M. and J. Bruck. (2009) "Rank Modulation for Flash Memories." IEEE Transactions on Information Theory, vol. 55, No. 6.).*
Jaing et al. (Jiang, A., Bohossian, V. and J. Bruck. (2010) "Rewriting Codes for Joint Information Storage in Flash Memories." IEEE Transactions on Information Theory, vol. 56, No. 10.).*
Jaing et al. (Jiang, A. and J. Bruck. (2009) "Information Representations and Coding for Flash Memories." IEEE Pacific Rim Conference on Communications, Computers and Signal Processing, pp. 920-925.).*
Mazumdar et al., "Constructions of Rank Modulation Codes", IEEE International Symposium on Information Theory Proceedings, vol. 59, Issue 2, pp. 869-873, Oct. 2012.
Zhang et al., "LDPC Codes for Rank Modulation in Flash Memories", pp. 859-863, ISIT, Austin, Texas, U.S.A, Jun. 13-18, 2010.
Knuth, "Efficient Balanced Codes", IEEE Transactions on Information Theory, vol. 32, No. 1, pp. 51-53, Jan. 1986.
Heegard, "On the Capacity of Permanent Memory", IEEE Transaction on Information Theory, vol. 31, No. 1, pp. 34-42, Jan. 1985.
Farnoud et al., "Rank Modulation for Translocation Error Correction", IEEE Information Theory Proceedings (ISIT), pp. 2988-2992, Jul. 2012.
Burshtein et al., "Polar write once memory codes", IEEE International Symposium on Information Theory Proceedings, pp. 1972-1976, Jul. 2012.
Fiat et al., "Generalized "Write-Once" Memories", IEEE Transaction on Information Theory, vol. 30, No. 3, pp. 470-480, May 1984.
"NVM Technology Overview," available at https://web.archive.org/web/20090217124831/http://www.saifun.com/content.asp?id=113, copyright 2003-2009, accessed on Feb. 20, 2015.
En Gad, E. et al., "On a construction for constant-weight Gray codes for local rank modulation," IEEE 26th Convention of Electrical and Electronics Engineers in Israel, p. 996, Nov. 17-20, 2010.
Jiang, A. et al., "Rank modulation for flash memories," IEEE Transactions on Information Theory, pp. 2659-2673, Jun. 2009.
Jiang, A. et al., "Correcting charge-constrained errors in the rank-modulation scheme," IEEE Transactions on Information Theory, vol. 56, Issue 5, pp. 2112-2120, May 2010.
Klove, T., "Spheres of permutations under the infinity norm—permutations with limited displacement," University of Bergen, Bergen, Norway, Technical Report No. 376, p. 38, Nov. 2008.
Schwartz, M., "Constant-weight Gray codes for local rank modulation," IEEE International Symposium on Information Theory Proceedings (ISIT), pp. 869-873, Jun. 13-18, 2010.
Tamo, I. and Schwartz, M., "Correcting limited-magnitude errors in the rank-modulation scheme," IEEE Transactions on Information Theory, vol. 56, No. 6, pp. 2551-2560, Jun. 2010.
Wang, Z. et al., "On the capacity of bounded rank modulation for flash memories," IEEE International Symposium on Information Theory, pp. 1234-1238, Jun. 28-Jul. 3, 2009.

En Gad, E. et al., "Compressed encoding for rank modulation," IEEE International Symposium on Information Theory Proceedings, pp. 884-888, Jul. 31-Aug. 5, 2011.
Fiat, A. and Shamir, A., "Generalized "write-once" memories," IEEE Transactions on Information Theory, vol. 30, Issue 3, pp. 470-480, May 1984.
Fu, F.W. and Vinck, A.J. H., "On the capacity of generalized write-once memory with state transitions described by an arbitrary directed acyclic graph," IEEE Transactions on Information Theory, vol. 45, No. 1, pp. 308-313, Jan. 1999.
Rivest, R.L. and Shamir, A., "How lo reuse a "write-once" memory," Information and Control, vol. 55, No. 1-3, pp. 1-19, 1982.
Arikan, E. and Telatar, I.E., "On the rate of channel polarization," IEEE International Symposium on Information Theory, pp. 1493-1495, Jun. 28-Jul. 3, 2009.
Arikan, E., "Channel polarization: A method for constructing capacity achieving codes for symmetric binary-input memoryless channels," IEEE Transactions on Information Theory, vol. 55, No. 7, pp. 3051-3073, Jul. 2009.
Barg, A. and Mazumdar, A., "Codes in permutations and error correction for rank modulation," IEEE Transactions on Information Theory, vol. 56, No. 7, pp. 3158-3165, Jul. 2010.
Burshtein, D. and Strugatski, A., "Polar write once memory codes," IEEE Transactions on Information Theory, vol. 59, Issue 8, pp. 5088-5101, Aug. 2013.
Farnoud, F. et al., "Rank modulation for translocation correction," IEEE International Symposium on Information Theory Proceedings, pp. 2988-2992, Jul. 1-6, 2012.
Heegard, C., "On the capacity of permanent memory," IEEE Transactions on Information Theory, vol. 31, No. 1, pp. 34-42, Jan. 1985.
Knuth, D.E., "Efficient balanced codes," IEEE Transactions on Information Theory, vol. 32, No. 1, pp. 51-53, Jan. 1986.
Korada, S.B. and Urbanke, R.L., "Polar codes are optimal for lossy source coding," IEEE Transactions on Information Theory, vol. 56, No. 4, pp. 1751-1768, Apr. 2010.
International Search Report and Written Opinion for International Patent Application No. PCT/US2013/030043 mailed Jun. 27, 2013.
Zhang, F. et al. "LDPC Codes for Rank Modulation in Flash Memories," IEEE International Symposium on Information Thoery Proceedings, pp. 859-863, Jun. 13-18, 2010.
Mazumdar, A. et al., "Constructions of Rank Modulation Codes," IEEE International Symposium on Information Theory Proceedings, pp. 869-873, Jul. 31-Aug. 5, 2011.
Wu, Y. et al., "Position Modulation Code for Rewriting Write-Once Memories," IEEE Transactions on Information Theory, vol. 57, No. 6, pp. 3692-3697, Jun. 2011.
Jiang, A. et al.,. "Universal rewriting in constrained memories," IEEE International Symposium on Information Theory, pp. 1219-1223, Jun. 28-Jul. 3, 2009.
Web site of Web-Feet Research, Inc; www.web-feetresearch.com, retrieved on Feb. 18, 2015.
"SanDisk launches 64 gigabyte solid state drives for notebook PCs, meeting needs for higher capacity", New Products on Display at Computex 2007, Taiwan's International Information Technology Show, Jun. 4, 2007. http://www.sandisk.com/about-sandisk/press-room/press-releases/2007/2007-06-04-sandisk-launches-64-gigabyte-solid-state-drives-for-notebook-pcs,-meeting-needs-for-higher-capacity/.
Barr, "PQI unveils 256GB solid state drive", SlashGear, May 31, 2007 http://www.slashgear.com/pqi-unveils-256gb-ssd-drive-315520/.
Aritome et al., "Reliability Issues of Flash Memory Cells", Proceedings of the IEEE, vol. 81, Issue 5, pp. 776-788, May 1993.
Pavan et al., "Flash Memory Cells—An Overview", Proceedings of the IEEE, vol. 85, Issue 8, pp. 1248-1271, Aug. 1997.
Gal et al., "Algorithms and Data Structures for Flash Memories", ACM Computing Surveys (CSUR), vol. 37, Issue 2, Jun. 2005.
Wang et al., "Partial Rank Modulation for Flash Memories", IEEE International Symposium on Information Theory Proceedings (ISIT), pp. 864-868, Jun. 13-18, 2010.

* cited by examiner

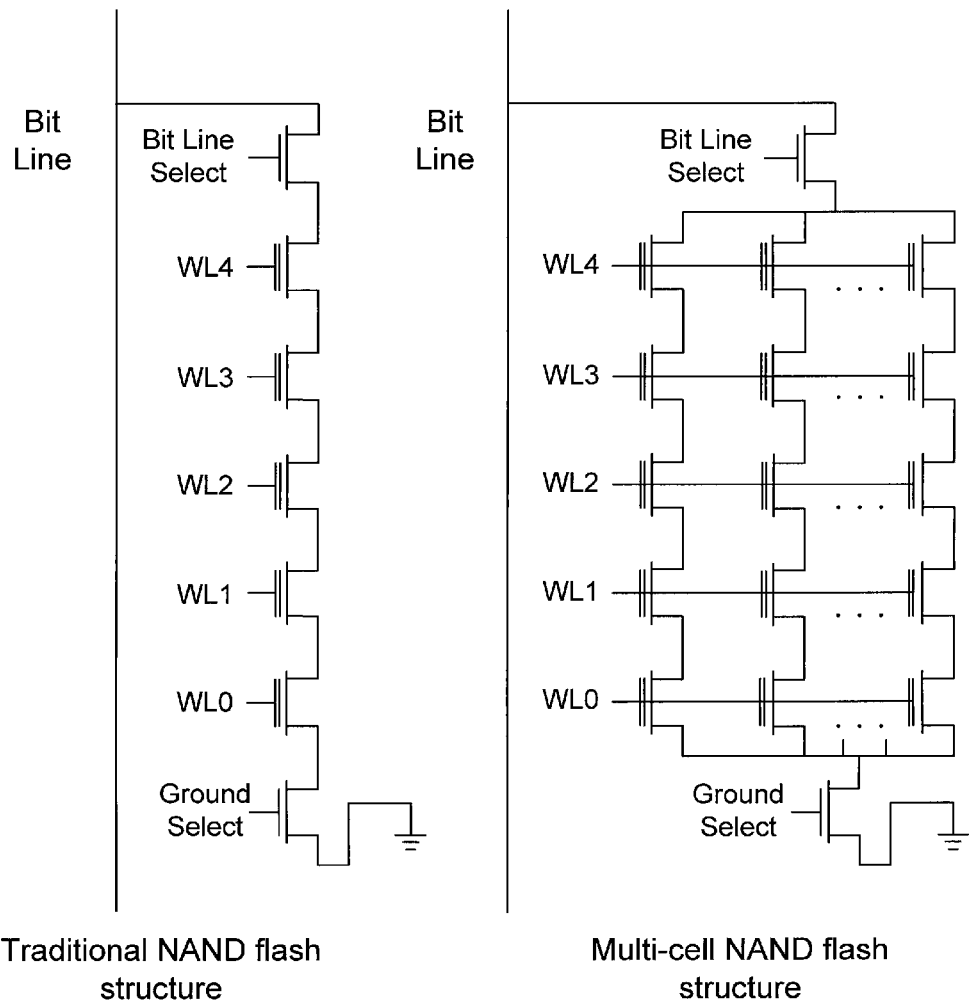
FIG. 7A — Traditional NAND flash structure
FIG. 7B — Multi-cell NAND flash structure

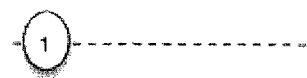
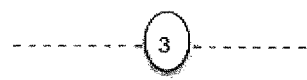
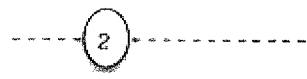
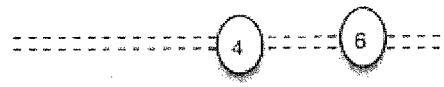
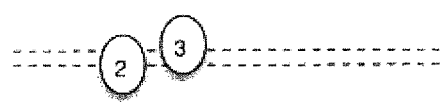
FIG. 9  FIG. 10

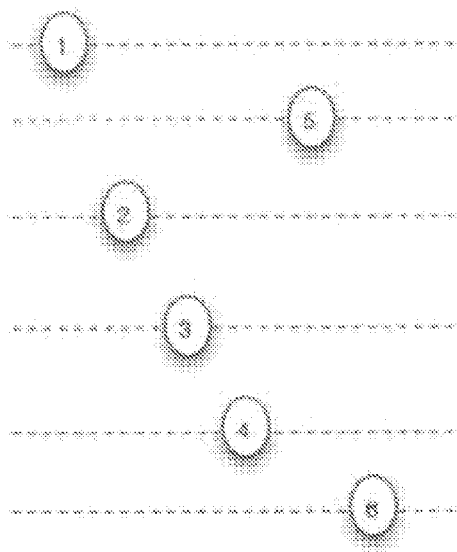
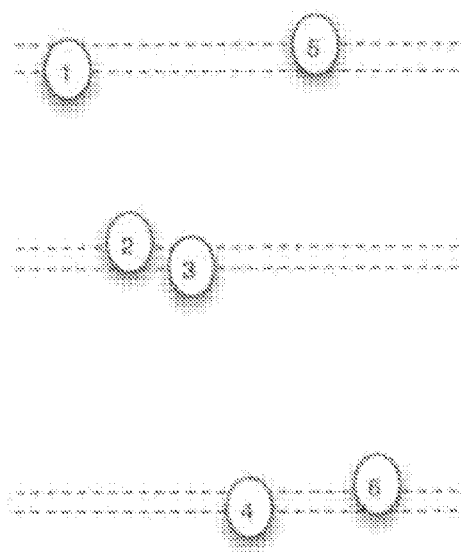
FIG. 11  FIG. 12
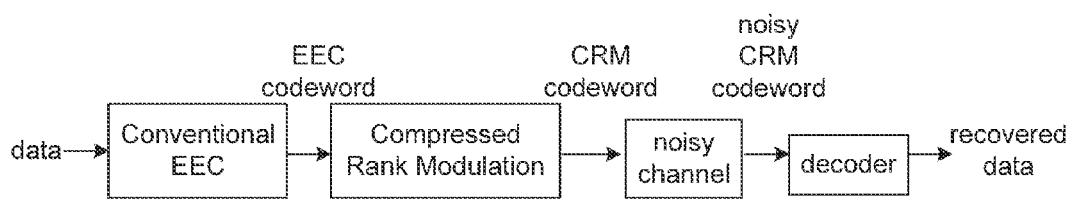
FIG. 13

RANK-MODULATION REWRITING CODES FOR FLASH MEMORIES

CROSS-REFERENCES TO RELATED APPLICATIONS

This application claims the benefit under 35 U.S.C. §119 (e) of U.S. Provisional Application Ser. No. 61/608245 entitled "Compressed Encoding for Rank Modulation" by Anxiao Jiang, Eyal En Gad and Jehoshua Bruck filed on Mar. 8, 2012, U.S. Provisional Application Ser. No. 61/608465 entitled "Multi-Cell memories and compressed Rank Modulation" by Anxiao Jiang, Eyal En Gad, and Jehoshua Bruck filed on Mar. 8, 2012, and U.S. Provisional Application Ser. No. 61/725347 entitled "Rank-Modulation Rewriting Codes for Flash Memories" by Anxiao Jiang, Eyal En Gad, Eitan Yaakobie and Jehoshua Bruck filed on Nov. 12, 2012. Priority of the filing dates is hereby claimed, and the disclosures of the prior applications are hereby incorporated by reference for all purposes.

FEDERAL FUNDING STATEMENT

This invention was made with government support under ECCS0802107 and CCF0747415 awarded by the National Science Foundation. The government has certain rights in the invention.

BACKGROUND

The present disclosure generally relates to data storage devices, systems and methods. In various examples, data modulation techniques in data storage devices such as flash memory devices are described.

Flash memories are one type of electronic non-volatile memories (NVMs), accounting for nearly 90% of the present NVM market. See, for example, the Web site of Saifun Semiconductors Ltd. (available at www.saifun.com) and Web-Feet Research, Inc. (available at www.web-feetresearch.com). Today, billions of flash memories are used in mobile, embedded, and mass-storage systems, mainly because of their high performance and physical durability. See, for example, P. Cappelletti et al., Chapter 5, "Memory Architecture and Related Issues" in Flash memories, Kluwer Academic Publishers, 1st Edition, 1999, and E. Gal and S. Toledo, *ACM Computing Surveys*, 37(2):138-163 (2005). Example applications of flash memories include cell phones, digital cameras, USB flash drives, computers, sensors, and many more. Flash memories are now sometimes used to replace magnetic disks as hard disks, such as the 64 GB hard disk by SanDisk (see "SanDisk launches 64 gigabyte solid state drives for notebook PCs, meeting needs for higher capacity," available at the Web site URL of http://biz.yahoo.com/cnw/070604/sandisk.html?.v=1). See also the Web article on the 256 GB hard disk by PQI ("PQI unveils 256 GB solid state drive," available at the URL of vvww.guru3d.com/newsitem.php?id=5392). Based on the popular floating-gate technology, the dominance of flash memories is likely to continue.

Some problems exist that may limit the improvement of flash memories with respect to their speed, reliability, longevity, and storage capacity. Flash memories may have a limited lifetime due to the quality degradation caused by block erasures; a flash memory can endure only about $10^5$~$10^6$ block erasures before it becomes no longer usable (see S. Aritome et al., *Proceedings of the IEEE*, 81(5):776-788 (1993), and P. Cappelletti et al., ibid. Removing charge from any single cell for data modification may require the block to be erased and all the $10^5$ or so cells in it to be reprogrammed (or programmed to another block). The writing speed may be constrained by a conservative cell-programming process that is about ten times slower than reading. One purpose of such conservative programming is to avoid over-programming, a serious error that may only be correctable by block erasure and reprogramming. Data reliability may be limited by errors caused by charge leakage, disturbs, and the like. See S. Aritome et al., ibid; P. Cappelletti et al., ibid; and P. Pavan et al., *Proceedings of The IEEE*, 85(8):1248-1271 (August 1997). The errors become more common when multi-level cells are used to increase the storage capacity.

SUMMARY

In some examples, a minimum push-up scheme to store data in flash memories is described. In some embodiments, the minimum push-up scheme starts with data values $v=[v_1, v_2, \ldots, v_n] \in S_n$ that are received to be stored in data storage containing current values $u=[u_1, u_2, \ldots, u_n] \in S_n$. Next, v is defined as an element of S where S is defined as a set of symbols in a rank modulation coding scheme. Further, n is defined as a number of ranks in v to be stored in a group of n rank locations in data storage of the data device. The group of n rank locations are programmed according to the rank modulation coding scheme and the value v such that for $i=n-1, n-2, \ldots 1$ the programmed value of a rank location $v_i$ is increased until it is greater than the value of a rank location $v_{i+1}$ by a minimum cell differentiation amount.

In some embodiments each of the n rank locations may comprise a cell of the device data storage. In further embodiments, each rank location may comprise a plurality of cells of the device data storage. In other embodiments, each rank location may comprise an equal number of cells of the device data storage. In still further embodiments, programming may comprise increasing the value of all cells in the rank location $v_i$ until the value in each of the cells $v_i$ is greater than the value in each of the cells in the rank location $v_{1+1}$. In other embodiments, the current values of $u=[u_1, u_2, \ldots, u_n] \in S_n$ are read from the device data storage before the programming of the group of n rank locations with v.

In another aspect, a new scheme, multi-cells, used for storing data in flash memories is provided. NAND flash memory is the most widely used type for general storage purpose. In NAND flash, several floating gate transistors are connected in series where we can read or write only one of them at a time. Each transistor is replaced with a multi-cell of m transistors connected in parallel. The control gates, the sources and the drains of the transistors are connected together. That way, their current sums together in read operations, and the read precision increases by m times, allowing the storages of mg levels in a single multi-cell. In write operations, the same value is written to all the transistors, such that the sum of their charge levels provides the desired total level.

In some embodiments processes for manufacturing and operating a data device are provided. A plurality of transistors, each of which is capable of storing charge, are disposed on a device. Each of the plurality of transistors comprises a gate, a source, and a drain. Connections are formed between the sources, gates and drains of each of the plurality of transistors. Each connection is capable of carrying electrical current. Next, data is stored in the plurality of transistors. The data corresponds to a sum of charges stored in each of the plurality of transistors. In further embodiments connections may be formed between the gates of each of the plurality of transistors.

In yet further embodiments, a process for operating a data device is provided. First, a code word is generated that has a plurality of symbols selected from a set of symbols. Each of the plurality of symbols is stored in a data storage location of the data device. Each data storage location comprises a plurality of parallel connected devices. In some embodiments the plurality of parallel connected devices may comprise transistors.

In yet another aspect, multi-permutations, used for storing data in flash memories is provided. The paradigm of representing information with permutations is generalized to the case where the number of cells in each level is a constant greater than 1, multi-permutations.

Namely, the states that the cells can take are no longer permutations of a set, but permutations of a multiset. For example, if the number of cells at each level is 22, the two cells in each level do not need to be identical in their analog values, they just need to be distinguishable with other levels (but do not need to be mutually distinguishable). Hence, the encoding and decoding use relative levels, and the scheme has good resistance to drift; namely, the advantages of the permutation based relative scheme that we described above still apply. The case where the multiplicities of all the elements in the multiset are equal, is denoted by z. This generalization becomes interesting especially when z is large, and n is still much larger than z. In that case (if q is still much larger than r), it can be proven that the upper bound on the total capacity is 2q bits per cell, and that there exists a construction that approaches this bound. The instantaneous capacity of the construction is approaching 2 bits per cell.

In some embodiments, a computer method of operating a data device where a predetermined rank configuration $(d_1, d_2 \ldots d_n)$ is defined. Further, $d_i$ is the number of cells in the $i^{th}$ rank. A new multi-permutation is received and defined by $v=[v_1, v_2, \ldots, v_n] \in S$ that fits the predetermined rank configuration. A process is then initiated in response to receiving the new multi-permutation, adding charge to each cell in a plurality of memory locations such that the plurality of cells represent the new multi-permutation. The process may be continued.

In other embodiments, the sequential order of an initial analog level of a stored value in each cell of a plurality of cells in a data device is determined. The sequential order is defined as a value x comprising $[\{x_1, x_2, \ldots, x_{d_1}\}, \{x_{d_1+1}, x_{d_1+2}, \ldots, x_{d_1+d_2}\}, \ldots, \{x_{1+\Sigma_{i=1}^{n-1} d_i}, x_{2+\Sigma_{i=1}^{n-1} d_i}, \ldots, x_{\Sigma_{i=1}^{n} d_i}\}]$.

In further embodiments, a predetermined rank configuration $(d_1, d_2 \ldots d_n)$ is defined, wherein $d_i$ is the number of cells in the $i^{th}$ rank. A new multi-permutation is received and defined by $v=[v_1, v_2, \ldots, v_n] \in S$ that fits the predetermined rank configuration. The analog levels of cells of a rank n in v are retained. Finally, the cells of rank i in v for I=n−1, n−2 . . . 1 such that the analog levels of cells in a rank i are programmed to all be higher than the analog levels of the cells of rank i+1 in v by at least a minimum rank differentiation. The process may be continued.

In yet another aspect, a new data representation and rewrite model, used for storing data in flash memories is provided. A construction is illustrated which shows how to construct rank modulation codes achieving rate approaching two on each write. This construction takes advantage of the recently discovered polar codes which were recently used in the construction of WOM codes.

In some embodiments, a computer method of operating a data device where a data value is received comprising a plurality of data sets wherein each data set is a set of values representing a rank in a plurality of ranks. A new data set for a rank of a plurality of ranks is received to store in the memory device wherein the memory device comprises a plurality of cells. A current state of candidate cells is read within the plurality of cells wherein candidate cells are used to store the new data set. A binary representation of the plurality of cells is created and used to store the new data set. A WOM code is used to combine the binary representation with the new data set to create a binary WOM vector. The binary WOM vector is modified to equal quantities of 1's and 0's within the candidate cells creating a new data vector. The new data vector is written to the candidate cells. If a new data vector has been written for each rank of the plurality of ranks the process may continue. If all of the data vectors have not been written, then prior steps starting with receiving a new data set may be repeated until all the new data vectors have been written to the memory.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7A is a schematic diagram of a traditional arrangement of a NAND flash memory structure accordance with the description herein.

FIG. 7B is a schematic diagram of a multi-cell arrangement of a NAND flash memory structure accordance with the description herein.

FIG. 9 is a representation of a memory cell arrangement in accordance with the description herein.

FIG. 10 is a representation of a memory cell arrangement in accordance with the description herein.

FIG. 11 is a representation of a memory cell arrangement in accordance with the description herein.

FIG. 12 is a representation of a memory cell arrangement in accordance with the description herein.

FIG. 13 is a representation of system model for compressed rank modulation in accordance with the description herein.

DETAILED DESCRIPTION

Figure 1:
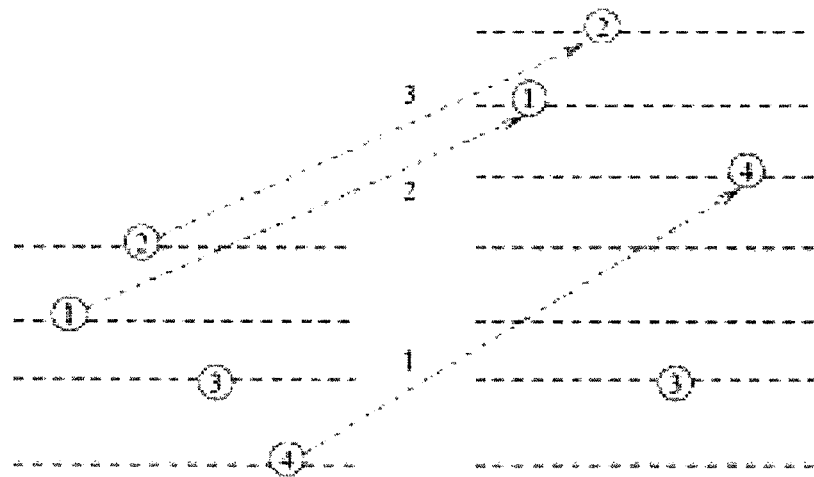
FIG. 1 is a representation of a memory cell arrangement using "push to the top" operations in accordance with the description herein.

The contents of this Detailed Description are organized under the following headings:
  I. Introduction to Rank Modulation
  II. Permutation "Minimum Push Up"
    A. Rewrite Model and the Transition Graph
    B. Worst-case Decoding Scheme for Rewrite
  III. Multi-Cells
    A. Multi-Cell Flash Memory
    B. Notations and Model Properties
    C. Upper Bounds
    D. Construction for the Average Case
    E. Existence for the Worst Case
  IV. Multi-Permutations
    A. Compressed Rank Modulation
      1. Initial Write
      2. Subsequent Rewrites
      3. Programming Symmetric Cells
      4. Rebalancing Permutations
      5. Record Weights
  V. Rank-Modulation Rewriting Codes
    A. Definitions of the Rewrite Model
    B. Description of the Construction
    C. Polar WOM Codes
  VI. Example Embodiments
  VII. Conclusion
Subheadings in the description are not listed above but may be present in the description below.

I. Introduction To Rank Modulation

The amount of charge stored in a flash memory cell can be quantized into $q \geq 2$ discrete values in order to represent up to $\log_2 q$ bits. (The cell is called a single-level cell (SLC) if $q=2$, and called a multi-level cell (MLC) if $q>2$). The q states of a cell are referred to as its levels: level 0, level 1, . . . , level q−1. The charge is quantized into discrete levels by an appropriate set of threshold levels. The level of a cell can be increased by injecting charge into the cell, and decreased by removing charge from the cell. Flash memories have a property that although it is relatively easy to increase a cell's level, it is very costly to decrease it. This results from the structure of flash memory cells, which are organized in blocks of about $10^5 \sim 10^6$ cells. In order to decrease any cell's level, its entire containing block is erased first (which involves removal of the charge from all the cells of the block) and after then it can be reprogrammed. Block erasures are not only slow and energy consuming, but also significantly reduce the longevity of flash memories, because every block can endure only about $10^4 \sim 10^5$ erasures with guaranteed quality. See, for example, P. Cappelletti, C. Golla, P. Olivo, and E. Zanoni, *Flash Memories*. Kluwer Academic Publishers, 1999. Therefore, reducing the number of block erasures improves the longevity of flash memories.

In MLC flash memory, the process of programming a cell to a specific level is designed carefully. The target level is approached from below in order to avoid overshooting of the cell, which may result in an undesirable block erasure. Consequently, these attempts use multiple programming cycles, and they work only up to a moderate number of levels per cell, e.g. 8 or 16 levels. In order to avoid the problem of exact programming of a cell level, a framework of the rank modulation coding was introduced. See, for example, A. Jiang, R. Mateescu, M. Schwartz, and J. Bruck, *Rank modulation for flash memories, IEEE Trans. on Inform. Theory*, vol. 55, no. 6, pp. 2659-2673, June 2009, hereinafter Rank Modulation for flash memories. The main idea of this coding scheme is to represent the information by the relative values of the cell levels rather than by their absolute values. Given a set of N cells, their levels induce a permutation which is used to encode the data. One of the features of the rank modulation scheme is that in programming, a cell is charged to a higher level than that of the previous cell in the permutation, and therefore there is reduced risk of overshooting. Another feature of representing data by the ranking of the cells, is that the threshold levels are no longer needed. This mitigates the effects of retention in the cells (slow charge leakage).

Rank Modulation for flash memories described rewriting codes for the rank modulation scheme, in order to reuse the memory between block erasures. In general, a motivation behind rewriting codes for flash memories is to increase the number of times data can be rewritten between two erasure operations while preserving the constraint that cells only increase their level. In rank modulation, a feature is to minimize the increase in the highest charge level among the cells after a rewriting operation. An observation is that rewriting of different permutations may increase the highest charge level of the cells by different magnitudes. For example, assume the current permutation be (3,1,2), such that the first cell has the highest level, e.g. its rank is 3, then the third cell (rank 2) and finally the second cell (rank 1). Now assume the cells are rewritten and are to represent the permutation (2,3,1). This can be done by adding sufficient charge to cell 2 such that its level is greater than the first cell's level. Now consider a different case, where the cells need to represent the permutation ((1,2,3)). In this case, the level of both cell 2 and cell 3 are raised to be higher than the level of cell 1, as shown in FIG. 1. Since some gap may be needed between them, and also some gap between cell 2 and cell 1, it is possible that the increase in the level of the highest cell in the second example, may be twice as much as the increase in the first example.

A consequence from the previous operation(s) is, that if every permutation represents different information, then the number of rewrites before incurring a block erasure can vary between different input data sequences. In order to obtain a large number of rewrites, rewriting codes let multiple permutations represent the same information (that is, introducing redundancy). Thus, when a certain data is to be written, there would be at least one permutation corresponding to that data that could be written without increasing the charge of the highest cell by a large amount. In Rank Modulation for flash memories, rewriting codes were studied under a strong constraint of push-to-the-top operations. In every push-to-the-top operation, a single cell is set to be the top-charged cell. This scheme provides easy implementation and fast programming, but it suffers a relatively low rate.

The work on rank modulation coding for flash memories paved the way for additional results in this area. First, error-correcting codes in the rank modulation setup attracted a lot of attention. See, for example, A. Barg and A. Mazumdar, "Codes in permutations and error correction for rank modulation," *IEEE Trans. on Inform. Theory*, vol. 56, no. 7, pp. 3158-3165, July 2010; F. Farnoud, V. Skachek, and O. Milenkovic, "Rank modulation for translocation correction," in *Proceedings of the IEEE International Symposium on Information Theory Workshop (ISIT)*, June 2012, pp. 2988-2992; A. Jiang, M. Schwartz, and J. Bruck, "Correcting charge-constrained errors in the rank-modulation scheme," *IEEE Trans. on Inform. Theory*, vol. 56, no. 5, pp. 2112-2120, May 2010; I. Tamo and M. Schwartz, "Correcting limited-magnitude errors in the rank-modulation scheme," *IEEE Trans. on Inform. Theory*, vol. 56, no. 6, pp. 2551-2560, June 2010. Other variations of rank modulation were studied as well. A new concept of bounded/local rank modulation was introduced and its capacity was calculated. See, for example, Z. Wang, A. Jiang, and J. Bruck, "On the capacity of bounded rank modulation for flash memories," in *Proc. 2009 IEEE Int. Symp. Information Theory*, June 2009, pp. 1234-1238. Here, the data is not represented by a single permutation, but rather, a sequence of permutations of a given size, which may overlap, are used to represent the data. Yet another variation, called partial rank modulation, was introduced. See, for example, Z. Wang and J. Bruck, "Partial rank modulation for flash memories," in *Proceedings of the 2010 IEEE International Symposium on Information Theory (ISIT2010)*, Austin, Tex. U.S.A., June 2010, pp. 864-868. Now the data is represented by a single permutation, but only the highest k cell levels, for some fixed k, may be considered for the information representation.

II. Permutation "Minimum Push Up"

The cost of changing the state in the scheme namely, the cost of the rewriting step is measured by the number of "push-to-top" operations that are used, because it represents by how much the maximum cell level among the n cells has increased. See, for example, A. Jiang, R. Mateescu, M. Schwartz, and J. Bruck, "Rank modulation for flash memories," *IEEE Trans. on Inform. Theory*, vol. 55, no. 6, pp. 2659-2673, June 2009. Reducing this cell-level increment may be performed in one embodiment because the cells have a physical limit that upper bounds the cell levels. The less the cell levels are increased, the more rewrites can be performed before a block erasure operation is used, and the longer the lifetime of the memory will be.

An example is shown in FIG. 1, where the state of n=4 cells is to be changed from u=[2,1,3,4] to v=[2,1,4,3]. (Here the cells are indexed by 1, 2, ..., n. And their state is denoted by the permutation $[u_1, u_2, \ldots, u_n] \in S_n$, where cell $u_1$ has the highest charge level and $u_n$ has the lowest charge level. For i=1, ..., n, cell $u_i$ has rank i). Three "push-to-top" operations are used, where cell 4, cell 1 and cell 2 are pushed sequentially. They are represented by the three edges in FIG. 1. The cost of this rewriting is 3.

Figure 2:
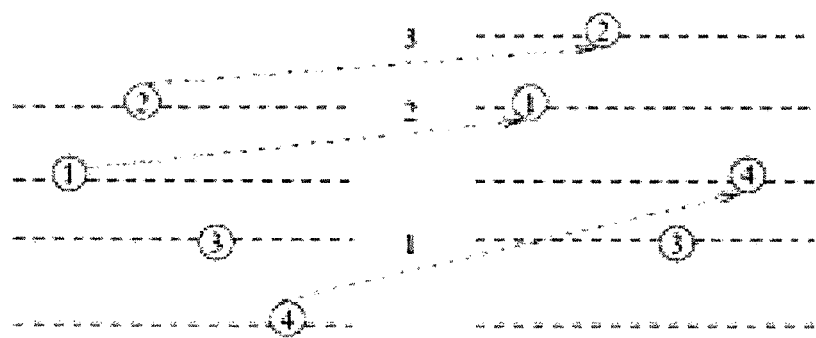
FIG. 2 is a representation of a memory cell arrangement using "minimal push up" operations in accordance with the description herein.

It can be seen from the above example, however, that the "push-to-top" operation is a conservative approach. To change the state from u=[2,1,3,4] to v=[2,1,4,3], when cell 4 is pushed, the level of cell 4 is pushed to be greater than cell 3. There is no need to make the level of cell 4 to be greater than the levels of all the other n−1=3 cells (i.e., cells 1, 2 and 3). Similarly, when cell 1 is pushed, its level is pushed to be greater than cell 3 and cell 4, instead of cells 2, 3 and 4. So a more moderate programming approach as shown in FIG. 2 can be taken, and the increment of the cell levels (in particular, the increment of the maximum cell level) can be substantially reduced. So, the cost of rewriting can be reduced, which improves the overall rewriting performance and the longevity of the memories.

Figure 6:
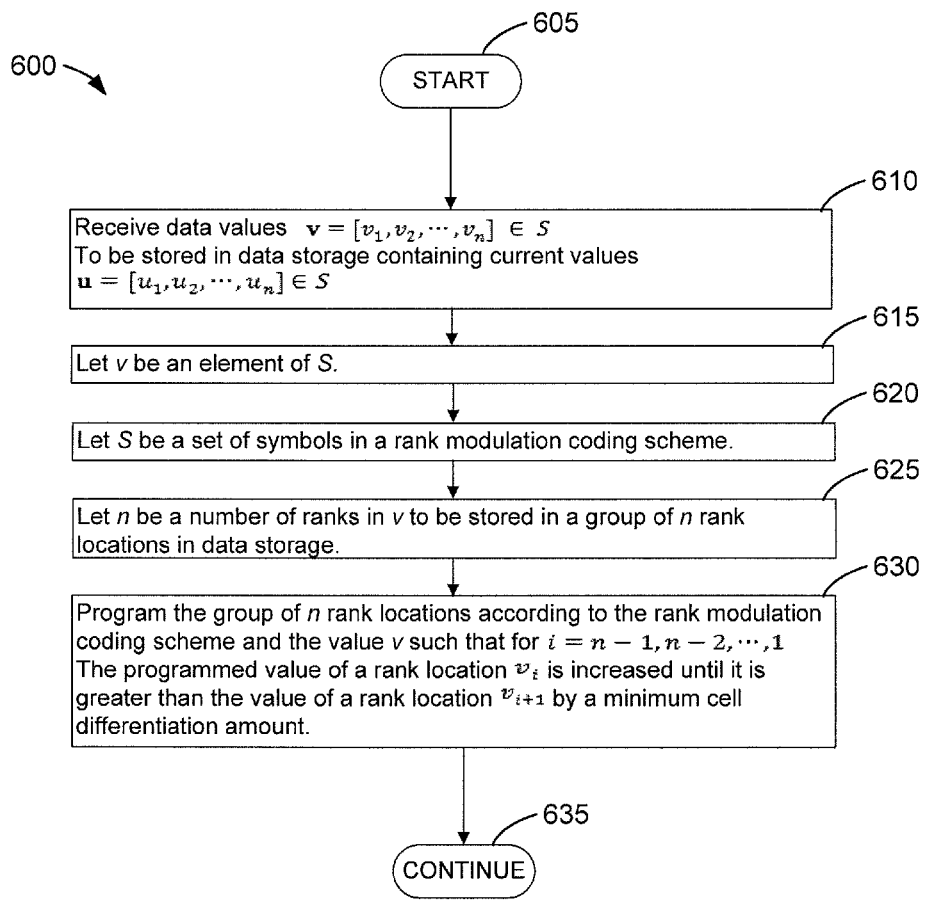
FIG. 6 is a process that depicts a programming approach that minimizes the increase of cell levels in accordance with the description herein.

Described in this disclosure is a programming approach that minimizes or otherwise reduces the increase of cell levels as illustrated in FIG. 6. To change the cell state from u=$[u_1, u_2, \ldots, u_n] \in S_n$ to v=$[v_1, v_2, \ldots v_n] \in S_n$, the cells are programmed based on their order in v, so that every cell's level increases as little as possible:

For i=n−1, n−2, ..., 1 perform:
{Increase the level of cell $v_i$, to make it greater than the level of the cell $v_{i+1}$}.

Note that in the above programming process, when cell $v_i$ is programmed, cell $v_{i+1}$ already has the highest level among the cells $v_{i+1}, v_{i+2}, \ldots, v_n$. The programming operation here is referred to as the "minimal-push-up" operation. (In comparison, if cell $v_i$ is programmed to make its level greater than the maximum level among the cells $v_1, \ldots, v_{i-1}, v_{i+1}, \ldots, v_n$, then it becomes the original "push-to-top" operation.) The "minimal-push-up" approach is robust, as it has reduced risk of overshooting. And it reduces increment of the maximum level of the n cells (e.g., the rewrite cost).

A. Rewrite Model and the Transition Graph

For coding schemes, a good robust discrete model is used for the rewriting. A discrete model is described herein for measuring the rewriting cost, which is suitable for both the "push-to-top" approach and the "minimal-push-up" approach. To rigorously describe the cost of a rewrite operation (i.e., a state transition), the concept of virtual levels is used. Let u=$[u_1, u_2, \ldots, u_n] \in S_n$ the current cell state, and let v=$[v_1, v_2, \ldots, v_n] \in S_n$ denote the new state that the cells change into via increasing cell levels. Let d (u→v) denote the number of push-up operations that are applied to the cells in order to change the state from u into v. For i=1, 2, ..., d(u→v), let $p_i[n] \triangleq \{1, 2, \ldots, n\}$ denote the integer and let $B_i \subseteq [n] \backslash \{p_i\}$ denote the subset, such that the i-th push-up operation is to increase the $p_i$ th cell's level to make it greater than the levels of all the cells in $B_i$. (For example, for the rewriting in FIG. 1, we have d(u→v)=3, $p_1$=4, $B_1$={1,2,3}, $p_2$=1, $B_2$={2,3,4}, $p_3$=2, $B_3$={1,3,4}. And for the rewriting in FIG. 2, we have d(u→v)=3, $p_1$=4, $B_1$={3}, $p_2$=1, $B_2$={3,4}, $p_3$=2, $B_3$={1,3,4}.) Such push-up operations have reduced risk of overshooting.

For the current state u, we assign the virtual levels n, n−1, ..., 2,1 to the cells $u_1, u_2, \ldots, u_{n-1}, u_n$, respectively. The greater a cell's level is, the greater its virtual level is. It is noted that when the virtual level increases by one, the increase in the actual cell level is not a constant because it depends on the actual programming process, which is noisy. However, when a cell a is programmed to make its level higher than a cell b, the difference between the two cell levels will concentrate around an expected value. (For example, a one-shot programming using hot-electron injection can achieve stable programming performance at high writing speed.) Based on this, a discrete model for rewriting is provided, which may be a usable tool for designing coding schemes.

Consider the ith push-up operation (for i=1, ..., d(u→v)), where the level of cell $p_i$ is increased to make it greater than the levels of the cells in $B_i$. For any j∈[n], let $l_j$ denote cell j's virtual level before this push-up operation. Then after the push-up operation, the virtual level of cell $p_i$ may be $$1 + \max_{j \in B_i} l_{ji}$$

namely, it is greater than the maximum virtual level of the cells in $B_i$ by one. This increase represents the increment of the level of cell $p_i$. After the d(u→v) push-up operations that change the state from u to v, for i=1, ..., n let $l_i'$ denote the virtual level of cell t. The cost of the rewriting process is described as the increase in the maximum virtual level of the n cells, which is $$\max_{i \in [n]} l_i' - n = l_{v_1}' - n.$$

EXAMPLE 1

For the rewriting process shown in FIG. 1, the virtual levels of cells 1, 2, 3, 4 change as (3,4,2,1)→(3,4,2,5)→(6,4,2,5)→(6,7,2,5). Its cost is 3.

For the rewriting process shown in FIG. 2, the virtual levels of cells 1, 2, 3, 4 change as (3,4,2,1)→(3,4,2,3)→(4,4,2,3)→(4,5,2,3). Its cost is 1.

Figure 3:
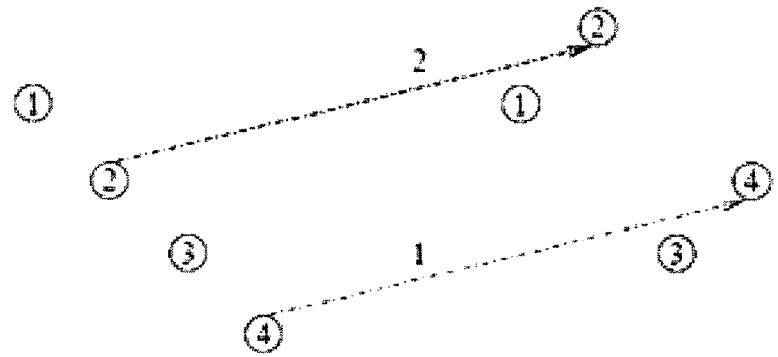
FIG. 3 is a representation of a memory cell arrangement using typical "minimal push up" operations in accordance with the description herein.
Figure 4:
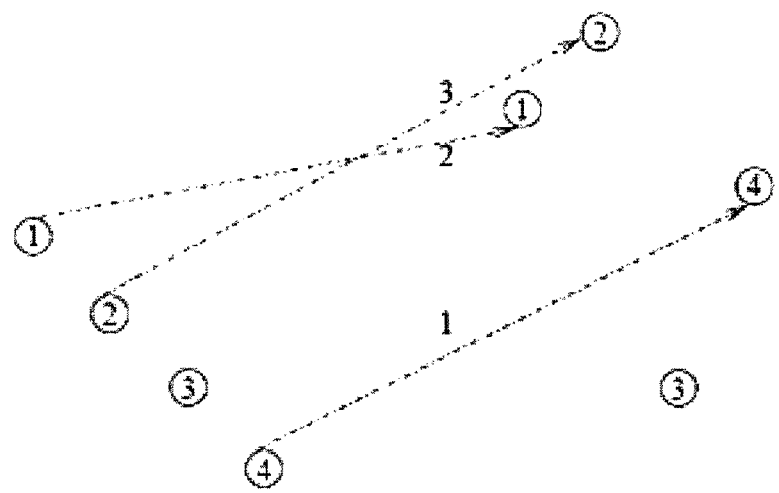
FIG. 4 is a representation of a memory cell arrangement depicting a rare case of "minimal push up" operations in accordance with the description herein.

The model captures the typical behavior of cell programming. Yet when the minimal-push-up operations are used, the number of cells to push may not always be a constant when the old and new states u, v are given. An example is shown in FIGS. 3 and 4, where the state changes from u=[1,2,3,4] to v=[2,1,4,3]. An example programming process is shown in FIG. 3, where two cells—cell 4 and then cell 2—are pushed up sequentially. (Note that based on the discrete model, the rewriting cost is 1. This is consistent with the increase of the maximum cell level here.) But as shown in FIG. 4, in the rare case where cell 4's level is significantly over-raised to the extent that it exceeds the level of cell 1, cell 1 will also be programmed, leading to three minimal-push-up operations in total. However, we would like to show that above discrete model is still a robust model for the following reasons. First, in this paper we focus on the typical (i.e., most probable) behavior of cell programming, where the rewriting cost matches the actual increase of the maximum cell level well. In the rare case where cell levels are increased by too much, additional load balancing techniques over multiple cell groups can be used to handle it. Second, the rare case—that a cell's level is overly increased—can happen not only with the minimal-push-up operation but also with the push-to-top operation; and its effect on the increment of the maximal cell level is similar for the two approaches. So the discrete model still provides a fair and robust way to evaluate the rewriting cost of different state transitions.

This disclosure describes codes based on state transitions using the minimal-push-up operations. Given two states u=[u(1), u(2), ..., u(n)]∈$S_n$, and v=[v(1), v(2), ..., v(n)]∈$S_n$, let C(u→v) denote the cost of changing the state from u to v. (Note that u(·), v(·) are both functions. Let $u^{-1}$, $v^{-1}$ be their inverse functions.) The value of C(u→v) can be computed as follows. Corresponding to the old state u, assign virtual levels n, n−1, ..., 1 to the cells u(1), u(2), ..., u(n), respectively. For i=1, 2, ..., n, let $l_i$ denote the virtual level of cell i corresponding to the new state v. Then based on the programming process described previously, $l_1, \ldots, l_n$ can be computed as follows:

1. For i=1, 2, ..., n perform:

$$\{l_{u(i)} \leftarrow n+1-i\}$$

2. For i=n−1, n−2, ..., 1 do:

$$\{l_{v(i)} \leftarrow \max\{l_{v(i+1)}+1, l_{v(i)}\}.\}$$

Then:

$$C(u \rightarrow v) = l_{v(1)} - n.$$

Figure 5:
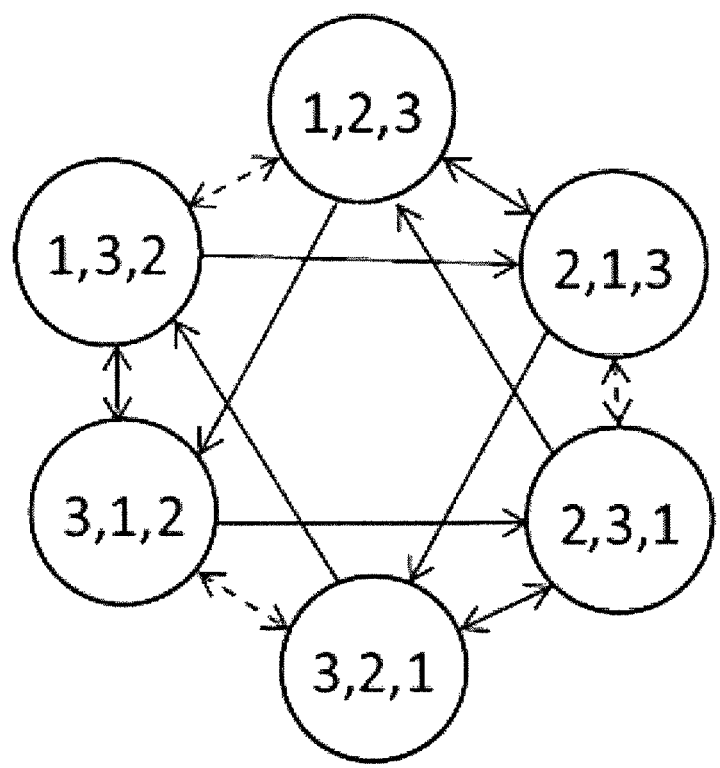
FIG. 5 is a state diagram for the states of three cells in accordance with the description herein.

It can be seen that 0≤C(u→v)n−1. An example of the rewriting cost is shown in FIG. 5.

The following theorem provides an equivalent definition of the cost. According to the theorem, the cost is equal to the maximal increase in rank among the cells.

Theorem 1.

$$C(u \rightarrow v) = \max_{i \in [n]}(v^{-1}(i) - u^{-1}(i)).$$

Proof: Assume by induction on k that $$l_{v(k)} = n+1-k + \max_{i \in [k, \ldots, n]}(i - u^{-1}(v(i))).$$

In the base case, k=n, and $l_v(n) = n+1-n+\max_{i \in [n, \ldots, n]}(i-u^{-1}(v(i))) = 1+n-u^{-1}(v(n))$. This is the result of the programming process. Now assume that the expression is true for k. For k−1, by the programming process, $$l_{v(k-1)} = \max\{l_{v(k)} + 1, n+1 - u^{-1}(v(k-1))\}$$

$$= \max\left\{n+1-k + \max_{i \in [k, \ldots, n]}(i - u^{-1}(v(i))) + 1, n+1-u^{-1}(v(k-1))\right\}$$

by the induction assumption $$= n+1-(k-1)+\max\left\{\max_{i \in [k, \ldots, n]}(i-u^{-1}(v(i))), k-1-u^{-1}(v(k-1))\right\} =$$

$$n+1-(k-1)+\max_{i \in [k-1, \ldots, n]}(i-u^{-1}(v(i)))$$

and the induction is proven.

Now $l_{v(1)}$ is assigned in the definition of the cost:

$$C(u \rightarrow v) = l_{v(1)} - n$$

$$= n+1-1+\max_{i \in [1, \ldots, n]}(i-u^{-1}(v(i))) - n$$

$$= \max_{i \in [n]}(v^{-1}(i) - u^{-1}(i))$$

Codes for rewriting data based on the "push-to-top" operation have been studied. See, for example, A. Jiang, R. Mateescu, M. Schwartz, and J. Bruck, "Rank modulation for flash memories," *IEEE Trans. on Inform. Theory*, vol. 55, no. 6, pp. 2659-2673, June 2009. Since the "minimal-push-up" approach has lower rewriting cost than the "push-to-top" operation, rewrite codes can be constructed with higher rates.

In order to discuss rewriting, a decoding scheme is defined. It is often the case that the alphabet size used by the user to input data and read stored information differs from the alphabet size used as internal representation. In one embodiment, data is stored internally in one of n! different permutations. Assume the user alphabet is Q={1, 2, ..., q}. A decoding scheme is a function D:$S_n$→Q mapping internal states to symbols from the user alphabet. Suppose the current internal state is u∈$S_n$ and the user inputs a new symbol α∈Q. A rewriting operation given α is now defined as moving from state u∈$S_n$ to state v∈$S_n$ such that D(v)=α. The cost of the rewriting operation is C(u→v).

Next, the transition graph $G_n = (V_n, A_n)$ is defined as a directed graph with $V_n = S_n$, i.e., with n! vertices representing the permutations in $S_n$. There is a directed edge u→v if and only if C(u→v)=1. Note that $G_n$ is a regular digraph. Given a vertex u∈$V_n$ and an integer r∈{0, 1, ..., n−1}, the ball $B_{n,r}(u)$ is defined as $B_{n,r}(u)$={v∈$V_n$|C(u→v)≤r}.

Theorem 2.

$$|B_{n,r}(u)|=r!(r+1)^{n-r}$$

Proof: Induction is used on n. When n=2 the statement is trivial. (So is it when n=r+1, where $|B_{r+1,r}(u)|$=(r+1)!.) Now the statement is assumed to be true for n≤$n_o$, and consider n=$n_0$+1 and n>r+1. Let u=[u(1), u(2), ..., u(n)]∈$S_n$, and without loss of generality (w.l.o.g.) let u(1)=n. Let v=[v(1), v(2), ..., v(n)]∈$B_{n,r}(u)$. Let û=[u(2), u(3), ..., u(n)]∈$S_{n-1}$, and let v̂∈$S_{n-1}$ be obtained from v by removing the element u(1)=n. By Theorem 1, the first element in u, namely u(1)=n, can take one of the first r+1 positions in v. Given that position, there is a one-to-one mapping between pushing-up the remaining n−1 elements from u to v∈$S_n$ and pushing-up those n−1 elements from û to v̂∈$S_{n-1}$, and C(û→v̂)=C(u→v)r. So the following results: $|B_{n,r}(u)|$=(r+1)$|B_{n-1,r}(û)|$= ... =$(r+1)^{n-r-1}$·(r+1)!=r!$(r+1)^{n-r}$.

Note that given u, |{v∈$S_n$||$v^{-1}$(i)−$u^{-1}$(i)|≤r for 1≤i≤n}| is the size of the ball under infinity norm. When r=1, that size is known to be a Fibonacci number. See, for example, T. Kløve, "Spheres of permutations under the infinity norm permutations with limited displacement," University of Bergen, Bergen, Norway, Tech. Rep. 376, November 2008.

In addition, we note that $|B_{n,1}(u)|=2^{n-1}$. Therefore, the out-degree of each vertex in $G_n$ is $2^{n-i}$−1. In comparison, when we allow only the "push-to-the-top" operation, $|B_{n,1}(u)|$=n. Hence we get an exponential increase in the degree, which might lead to an exponential increase in the rate of rewrite codes. In the next section we study rewrite codes under a worst-case cost constraint.

B. Worst-Case Decoding Scheme for Rewrite

Described herein are codes where the cost of the rewrite operation is limited by r.

1. The case of n≤4

The case of r=1 is evaluated first. The first non-trivial case for r=1 is n=3.

However, for this case the additional "minimal-push-up" transitions do not allow for a better rewrite code. An optimal construction for a graph with only the "push-to-top" transitions has been discussed. See, for example, A. Jiang, R. Mateescu, M. Schwartz, and J. Bruck, "Rank modulation for flash memories," *IEEE Trans. on Inform. Theory*, vol. 55, no. 6, pp. 2659-2673, June 2009. That construction assigns a symbol to each state according to the first element in the permutation, for a total of 3 symbols. This construction may also be optimal for a graph with the "minimal-push-up" transitions.

For greater values of n, in order to simplify the construction, we limit ourselves to codes that assign a symbol to each of the n! states. We call such codes full assignment codes. Note that better codes for which not all the states are assigned to symbols might exist. When all of the states are assigned to symbols, each state must have an edge in $A_n$ to at least one state labeled by each other symbol. We define a set of vertices D in $G_n$ as a dominating set if any vertex not in D is the initial vertex of an edge that ends in a vertex in D. Every denominating set is assigned to one symbol. Our goal is to partition the set of n! vertices into the maximum number of dominating sets. We start by presenting a construction for n=4.

Construction 1. Divide the 24 states of $S_4$ into 6 sets of 4 states each, where each set is a coset of ⟨(1,2,3,4)⟩, the cyclic group generated by (1,2,3,4). Here (1,2,3,4) is the permutation in the cycle notation, and ((1,2,3,4))=([1,2,3,4],[2,3,4,1], [3,4,1,2],[4,1,2,3]$]^-$. Map each set to a different symbol.

Theorem 3. Each Set in Construction 1 is a Dominating Set.

Proof: Let $I_d$ be the identity permutation, g=(1,2,3,4) and G=⟨g⟩. For each h∈$S_4$, hG is a coset of G. For each v=[v(1), ..., v(n)]∈hG and each u=[u(1), ..., u(n)]∈$S_4$ such that u(1)=v(1), u has an edge to either v or v*g. For example, in the coset $I_d$G=G, for v=$I_d$ and u∈$S_n$ such that u(1)=v(1)=1, if u(2) is 2 or 3, u has an edge to $I_d$=[1,2,3,4], and if u(2)=4, u has an edge to $i_d$*g=[4,1,2,3]. Since G is a cyclic group of order 4, for every u∈$S_4$ there exists v∈hG such that u(1)=v(1), and therefore hG is a dominating set.

For k [n] and B⊆$S_n$, define:

$Pref_k(B)$={t|s=tu for |u|=k and s∈B} where t, u are segments of the permutation s. For example, $Pref_3$({[1,2,3,4,5], [1,2,3,5,4], [1,3,2,4,5]})={[1,2],[1,3]}.

A lower bound is provided to a dominating set's size.

Theorem 4. If D is a dominating set of $G_n$, then $$|D|\frac{n!}{\frac{3}{4}\cdot 2^{n-1}}.$$

Proof: Each $p_3$∈$Pref_3(S_n)$ is a prefix of 3 different prefixes in $Pref_2(S_n)$. For example, for n=5, [1,2] is a prefix of {[1,2,3], [1,2,4], [1,2,5]}. Each v D dominates $2^{n-2}$ prefixes in $Pref_2(S_n)$. For example, for n=4, every permutation that start with [1,2], [1,3], [2,1] or [2,3] has an edge to [1,2,3,4]. This set of prefixes can be partitioned into sets of two members, each sharing the same prefix in $Pref_3(S_n)$. For one such set $B_2$={$p_{2,1},p_{2,2}$}, and $p_3$ denotes the only member of $Pref_3(B_2)$. Since D is a dominating set, all of the members of $Pref_2(S_n)$ are dominated. Therefore, the third prefix $p_{2,3}$∉$B_2$ such that {$p_3$}=$Pref_3$({$B_2,p_{2,3}$}) is dominated by some u∈D, u≠v. Moreover, u dominates also one of the prefixes in $B_2$. Therefore, at least half of the prefixes in $Pref_2(S_n)$ that v dominates are also dominated by at least one other member of D. $X_v$ denotes the set of prefixes in $Pref_2(S_n)$ that are dominated by v and not by any u≠v such that u∈D, and $Y_v$ denotes the prefixes in $Pref_2(S_n)$ that are also dominated by at least one such u≠v. Also defined is X=$\Sigma_{v\in D}|X_v|$ and Y=$\Sigma_{v\in D}|Y_v|$. It has been shown that |$X_v$|≤$2^{n-3}$; so X≤$2^{n-3}$|D|. In addition, |$X_v$|+|$Y_v$|=$2^{n-2}$, and so X+Y=$2^{n-2}$|D|. By the definition of $$Y_v, |U_{v\in D}Y_v|\leq \frac{Y}{2},$$

because every element in the above union of sets appears in at least two of the sets. So:

$$\frac{n!}{2}=|Pref_2(S_n)|$$
$$=|U_{v\in D}X_v|+|U_{v\in D}Y_v|\leq X+\frac{Y}{2}$$
$$=X+2^{n-3}|D|-\frac{X}{2}$$
$$=\frac{X}{2}+2^{n-3}|D|\leq(2^{n-4}+2^{n-3})|D|$$
$$=3\cdot 2^{n-4}|D|$$

Therefore $$|D|\geq \frac{n!}{3\cdot 2^{n-s}},$$

Using the above bound, the rate of any full assignment code $\mathcal{C}$ is $$R(\mathcal{C}) \leq 1 \frac{1}{n}\log_2 \frac{8}{3} \text{ bits per cell.}$$

For the case of n=4, |D|≥4. Therefore Construction 1 is an optimal full assignment code.

2. The case of n=5

In the case of n=5, a dominating set comprises of at least $$\frac{5!}{3 \cdot 2^{5-s}} = 10 \text{ members.}$$

An optimal full assignment code construction is presented with dominating sets of 10 members.

Construction 2. Divide the 120 states of $S_5$ into 12 sets of 10 states each, where each set is composed of five cosets of $\langle(4,5)\rangle$, and two permutations with the same parity are in the same set if and only if they belong to the same coset of $\langle(1,2,4,3,5)\rangle$. Map each set to a different symbol.

Let $g_1=(4,5)$ and $g_2=(1,2,4,3,5)$. An example of a dominating set where each row is a coset of $g_1$ and each column is a coset of $g_2$ is:

$$\left\{\begin{array}{l}[1, 2, 3, 4, 5], [1, 2, 3, 4, 5]\\ [2, 4, 5, 3, 1], [2, 4, 5, 1, 3]\\ [4, 3, 1, 5, 2], [4, 3, 1, 2, 5]\\ [3, 5, 2, 1, 4], [3, 5, 2, 4, 1]\\ [5, 1, 4, 2, 3], [5, 1, 4, 3, 2]\end{array}\right\}$$

Theorem 5. Each set D in Construction 2 is a dominating set.

Proof: Each coset of $\langle g_1 \rangle$ dominates 4 prefixes in $\text{Pref}_3$ ($S_5$). For example, the coset $\langle g_1 \rangle = \{I_d=[1,2,3,4,5],g_1=[1,2,3,5,4]\}$ dominates the prefixes $\{[1,2], [1,3],[2,1], [2,3]\}$. Each coset representative is treated as a representative of the domination over the 4 prefixes in $\text{Pref}_3(s_5)$ that are dominated by the coset. According to the construction, a set of representatives in D that share the same parity is a coset of $\langle_2\rangle$,* Let one of the cosets of $\langle g_2\rangle$ in D be called C. For each v C, the subset $\{v,g_2*v\}$ represents a domination over a single disjoint prefix in $\text{Pref}_4(S_5)$. For example, for $v=I_d$, the subset $\{I_d=[1,2,3,4,5],g_2*I_d=[2,4,5,3,1]\}$ represent a domination over the prefix [2]. Since $|\langle g_2\rangle|=5$, C represents a complete domination over $\text{Pref}_4(S_5)$, and therefore D is a dominating set.

The rate of the code may be $$R = \frac{1}{5}\log_2 12 = 0.717 \text{ bits per cell}$$

Recall that optimal codes with "push-to-top" operations use only n symbols for n cells. Therefore, a rate improvement of $$\frac{\left(\frac{1}{5}\log_2 12\right)}{\left(\frac{1}{5}\log_2 5\right)-1} = 54.4\%$$

may be achieved.

3. The case of r≤2

When the cost constraint is greater than 1, the constructions studied above can be generalized. For a construction for the case r=n−4, the construction begins by dividing the n! states $S_n$ into $$\frac{n!}{120}$$

sets, where two states are in the same set if and only if their first n−5 elements are the same. The sets are all dominating sets, because we can get to any set by at most n−5 "push-to-top" operations. Each of these sets to 12 sets of 10 members is further divided, in the same way as in Construction 2, according to the last 5 elements of the permutations. By the properties of construction 2, each of the smaller sets is still a dominating set. The rate of the code is $$R = \frac{1}{n}\log_2 \frac{n!}{10} \text{ bits per cell.}$$

An example method 600 of operating a data device is illustrated in FIG. 6. Method 600 may include one or more operations, actions, or functions as illustrated by one or more of blocks 605, 610, 615, 620, 625, 630 and 635. Although illustrated as discrete blocks, various blocks may be divided into additional blocks, combined into fewer blocks, or eliminated, depending on the particular implementation.

At block 605 the process can be started. Block 605 can be followed by block 610, where data values V $[v_1, v_2, \ldots, v_n]\epsilon S$ can be received and are to be stored in data storage containing current values u=$[u_1, u_2, \ldots, u_n]\epsilon S$. Block 610 can be followed by block 615, where v can be defined as an element of S. Block 615 can be followed by block 620, where S can be defined as a set of symbols in a rank modulation coding scheme. Block 620 can be followed by block 625, where n can be defined as a number of ranks in v to be stored in a group of n rank locations in data storage of the data device. Block 625 can be followed by block 630, where the group of n rank locations can be programmed according to the rank modulation coding scheme and the value v such that for i=n−1, n−2, . . . , 1 the programmed value of a rank location v, is increased until it is greater than the value of a rank location $v_{i+1}$ by a minimum cell differentiation amount. Block 630 can be followed by block 635, where the process may be continued.

In some embodiments each of the n rank locations may comprise a cell of the device data storage. In further embodiments, each rank location may comprise a plurality of cells of the device data storage. In other embodiments, each rank location may comprise an equal number of cells of the device data storage. In still further embodiments, programming may comprise increasing the value of all cells in the rank location v, until the value in each of the cells $v_i$ is greater than the value in each of the cells in the rank location $v_{i+1}$. In other embodiments, the current values of u=$[u_1, u_2, \ldots, u_n]\epsilon S$ are read from the device data storage before the programming of the group of n rank locations with v.

III. Multi-Cells

We can store $\log_2 q$ bits on a flash cell with q levels. That way, each time we want to update the data on the memory, we would have to erase the whole block. We call this representation method "the trivial scheme". We could also use a bit more sophisticated update schemes. For example, we could store only 1 bit in each cell, according to the parity of the level of the cell. If the cell is in level 3, for example, it stores the value 1. Using this scheme, we can update the data q−1 times before a block erasure will be required. We call this scheme "the parity scheme". Update schemes like the parity scheme can be especially useful for enterprise applications of flash memory, where the endurance of the memory becomes a major design concern. Update schemes are also known as write once memory (WOM) codes. See, for example, A. Fiat and A. Shamir, "Generalized "write-once" memories," *IEEE Trans. on Inform. Theory*, vol. IT-30, no. 3, pp. 470-480, May 1984; F.-W. Fu and A. J. Han Vinck, "On the capacity of generalized write-once memory with state transitions described by an arbitrary directed acyclic graph," *IEEE Trans. on Inform. Theory*, vol. 45, no. 1, pp. 308-313, January 1999; R. L. Rivest and A. Shamir, "How to reuse a "write-once" memory," *Inform. and Control*, vol. 55, pp. 1-19, 1982.

While the values of the cells in the relative scheme don't need to be quantized, discrete levels can be used for analysis to simplify the calculations. This is to allow a more easy and useful analysis, and because there should still be a certain charge difference between the cells in order to avoid errors. When the cells have q levels, the data can be stored on a set of q cells according to their relative levels. In other words, $\log_2(q!)$ bits can be stored on q cells, or each cell can be used to store $(1/q)\log_2(q!)$ bits. If q is large, the capacity of the trivial scheme described above. However, various update schemes described herein can be employed that may use relative levels, such as n cells of q levels, where n<q. As described further below, a high total capacity can be achieved with update schemes that use relative cell's levels. More specifically, some described examples may achieve an instantaneous capacity of n bits and a total capacity of (q−1)n bits using relative cell's levels.

Update schemes with high total capacity can become useful when q has a high value.

However, in practical flash memory devices, q may have a moderately small number. Various example methods described herein may achieve high values of q with the existing cell technology. The main idea is to combine several floating gate transistors into a virtual cell, which we call a multi-cell.

A. Multi-Cell Flash Memory

NAND flash memory is a widely used type of memory for general storage purposes. In NAND flash, several floating gate transistors are typically coupled in series (see FIG. 7A), where read or write operations occur one at a time. The present disclosure proposes to replace various transistors with a multi-cell of m transistors that are coupled together in parallel, with commonly controlled gates, as shown in FIG. 7B. In read operations, the currents of the transistors sum together, and the read precision may increase by m times, allowing to store mq levels in a single multi-cell. In write operations, the same value can be written into all of the transistors coupled together with a common gate, such that the sum of their charge levels gives the desired total level. The resulting error rates of read and write operations of the configuration in FIG. 7B are substantially the same as those error rates found in a traditional flash cell.

If data is stored by n transistors that form n/m multi-cells of mq levels each, and if the trivial scheme is used, an instantaneous and total capacity of $(n/m)\log_2(mq)$ bits results that is less than the $n\log_2 q$ bits would result using traditional cells. However, if an update scheme such as the relative schemes presented in the present disclosure, then a total capacity may approach n(q−1) bits both with multi-cells and with traditional cells. In order to use a permutation of cell's levels, the number of levels in each should be at least the number of cells. To approach a total capacity of n(q−1) bits with permutations, the number of updates the scheme can take should be greater than the number of cells we use. By using multi-cells, the number of updates may increase at the expense of the instantaneous capacity, and the total capacity is approached faster.

B. Notations and Model Properties

In order to allow easy and fair analysis, discrete levels for the cell's charge values can be utilized. In practice there is generally no need for threshold levels, and analog values can be used for the cell's charge values. For example, let $c = (c_1, c_2, \ldots, c_n)$, with $c_i \in \{0, 1, \ldots, q-1\}$ as the state of an array of n flash cells, each cell having q discrete levels, where $c_i \neq c_j$ for all $i \neq j$. The n variables may induce a permutation such as $\sigma = [\sigma(1), \sigma(2), \ldots, \sigma(n)] \in S_n$, where $s_n$ denotes the set of all permutations over $[n] = \{1, 2, \ldots, n\}$. The permutation $\sigma$ may be uniquely defined by the constraints $c_{\sigma(i)} > c_{\sigma(j)}$ for all i>j, i.e., when c is sorted in ascending order as $c_{j_1} < c_{j_2} < \ldots < c_{j_n}$, then $\sigma(i) = j_i$ for all $1 \leq i \leq n$.

To change the permutation from $\sigma$ to $\sigma'$, the cells can be programmed based on their order in $\sigma'$, so that each cell's level may increase as little as possible. For example, let $c' = (c'_1, c'_2, \ldots, c'_n)$ denote the new cell's levels to be set. Initially $c'_{\sigma'(1)} = \sigma_{\sigma 1(1)}$, and then, for i=2, 3, ..., n, $c'_{\sigma'(i)} = \max\{c\sigma'(1), c'_{\sigma'(i-1)}+1\}$. Given two cell states c and c', let cost (c→c') denote the cost of changing the cell state from c to c'. The cost can be defined as the difference between the levels of the highest cell, before and after the update operation. Namely, cost $(c \to c') = c'_{\sigma'(n)} - c_{\sigma(n)}$. As illustrated by this example, the cost may be a function of $\sigma^{-1}$ and $\sigma'^{-1}$, where $\sigma^{-1}$ is the inverse of the permutation $\sigma$. See, for example, E. En Gad, A. Jiang, and J. Bruck, "Compressed encoding for rank modulation," in *Proceedings of the* 2011 *IEEE Int. Symp. on Inform. Theory, ISIT* 2011, St. Petersburg, Russia, August 2011, pp. 884-888. The cost can be written as:

$$\text{cost}(\sigma \to \sigma') = \max_{i \in [n]}(\sigma^{-1}(i) - \sigma'^{-1}(i)).$$

In other words, the cost is the $L_\infty$ quasimetric.

EXAMPLE 1

Let c=(0,1,2,3). So $\sigma$=[1,2,3,4]. Now let $\sigma'$=[3,1,4,2]. The levels of the cells to represent $\sigma'$ can be increased as follows: set $c'_3 = c_3 = 2$; $c'_1 = \max\{c_1, c'_3 + 1\} = \max\{0,3\} = 3$; and $c'_4 = 4$ and $c'_2 = 5$. The cost of the update can be determined as $c'_2 - c_4 = 5 - 3 = 2$. The cost can also be calculated directly from the permutations: $\sigma^{-1}$=[1,2,3,4], and $\sigma'^{-1}$=[2,4,1,3]. Since $\sigma^{-1} - \sigma'^{-1}$=[−2,2,1] and the maximum is 2, so this is the cost.

The set of all the values that the data can take can be denoted as D. An update scheme, or update code, $\mathcal{C}$ may include a decoding function f and an update function g. The decoding function $f : S_n \to D$ may identify the permutation $\sigma \in S_n$ as a representation of the data $f(\sigma) \in D$. The update function (which may represent an update operation), $g : S_n \times D \to S_n$, may identify the current permutation $\sigma \in S_n$ and the update can change the data to $d \in D$, and the update code can change the permutation to $g(\sigma, d)$, where $f(g(\sigma, d))$ may be equal to d. Note that if $f(\sigma) = d$, then $g(\sigma, d) = \sigma$, which corresponds to the case where w the stored data does not need to change.

Let $C_i(\mathcal{C})$ be the instantaneous capacity of an update code $\mathcal{C}$. The instantaneous capacity can be defined as $C_i(\mathcal{C}) = (1/n)\log|D|$, where the binary logarithm can be used. Let $t_w(\mathcal{C})$ be the maximal number of updates that $\mathcal{C}$ can support for all update sequences. The worst-case total capacity per level can be defined as $c_w(\mathcal{C})=t_w(\mathcal{C})C_i(\mathcal{C})/(q-1)$. Similarly, $t_\alpha(\mathcal{C})$ can be defined as the average number of times the memory can be modified before a block erasure is required, where we assume that in each update, the data value can be uniformly distributed, $C_\alpha(\mathcal{C})=t_\alpha(\mathcal{C})C_i(\mathcal{C})/(q-1)$ can be the average total capacity per level of the update code, and see that $\lim_{q/n,n\to\infty}C_\alpha(\mathcal{C})=C_i\mathcal{C}(c)/E(\text{cost})$, where $E(\text{cost})$ is the expectation of the cost.

Finally, for a fixed $\sigma \in S_n$, set $$B_{n,r}(\sigma)=\{\sigma' \in S_2 | \text{cost}(\sigma \to \sigma') \leq r\}, k_{n,r}=|B_{n,r}(\sigma)|.$$

We note that $k_{n,r}$ is independent of $\sigma$. It was shown in [2] that $k_{n,r}=(r+1)^{n-(r+1)}(r+1)!$.

C. Upper Bounds

In this section, a bound is derived for $C_w\mathcal{C}$ and $C_\alpha(\mathcal{C})$, when q and n are large numbers, and q is much greater than n. In addition, a bound for $C_i(\mathcal{C})$ is derived in the cases where $C_w(\mathcal{C})$ and $C_\alpha(\mathcal{C})$ are asymptotically optimal.

1. Worst Case

To derive a bound, $k_{n,r}$, the size of the ball of radius r can be used. To guarantee that the cost of each update operation is no more than r, $|D| \leq k_{n,r}$. Otherwise, to write the data state d, there is no guarantee that there is a permutation in $B_{n,r}(\sigma)$ that represents d. The resulting instantaneous capacity can be determined as $(1/n)\log(k_{n,r})$. Let $K_r=\lim_{n\to\infty}(1/n)\log(k_{n,r})$. By setting $C_i(\mathcal{C})<K_r$, we cannot guarantee to write more than $(q-n)/r$ times, so $C_w(\mathcal{C})=t_w(\mathcal{C})C_i(\mathcal{C})/(q-1)$ is less than $K_r/r$. In the following $K_r/r$ is decreasing in r, which means that $K_1$ is an upper bound to the worst case total capacity.

Lemma 1. $K_r/r$ is strictly decreasing in r when $r \geq 1$.
Proof:

$$(1/nr)\log k_r = (1/nr)\log((r+1)^{n-(r+1)}(r+1)!)$$
$$\geq (1/nr)(n\log(r+1)-(r+1))$$
$$= (1/r)\log(r+1)-(r+1)/(nr)$$
$$\to (1/r)\log(r+1), n \to \infty$$

So $K_r/r \geq (1/r)\log(r+1)$. On the other hand, $$(1/(n(r+1)))\log k_{r+1} = \frac{\log((r+2)^{n-(r+2)}(r+2)!)}{n(r+1)} \leq (1/(r+1))\log(r+2)$$

So $$K_{r+1}/(r+1) \leq (1/(r+1))\log(r+2) < (1/r)\log(r+1) \leq K_r/r$$

So $K_r/r$ is strictly decreasing.

It also follows that when $C_w(\mathcal{C})$ is asymptotically optimal, $C_i(\mathcal{C})$ is bounded by $K_1$ as well. And when $C_i(\mathcal{C})$ is asymptotically optimal, $t_w(\mathcal{C})$ is optimal, since r=1. As noted, both upper bounds are determined as $K_1$. We can calculate $K_1$ quickly: $K_1=\lim_{n\to\infty}(1/n)\log 2^{n-1}=1$. In section 6 we show that there exists a code that approaches both of the bounds.

2. Average Case

We now find a bound for the average case. Since $t_w(\mathcal{C}) < t_\alpha(\mathcal{C})$, the average total capacity is at least that of the worst case. In the following theorem we show that, asymptotically, the average total capacity is also bounded by $K_1$.

Theorem 1. Let $\mathcal{C}$ be a permutation based update code. Then $\lim_{q/n,n\to\infty}C_\alpha(\mathcal{C}) \leq K_1$. Proof: Let r be the largest integer such that $\lim_{n\to\infty}C_i(\mathcal{C})>K_r$. Therefore, $\lim_{n\to\infty}C_i(\mathcal{C})\leq K_{r+1}$. Let $d \in D$ be a data state that needs to be stored, and $\sigma \in S_n$ the current permutation of the cells. Since $f(\sigma)$ is the decoding function, let $f^{-1}(d)$ be the set of permutations that are decoded to d. We start by bounding E(cost), the expected cost of an update:

$$E(\text{cost}) = \sum_{i=0}^{n-1} iPr\{\text{cost}=i\} \geq (r+1)Pr[\text{cost} \geq r+1]$$
$$= (r+1)Pr\{f^{-1}(d) \cap B_{n,r}(\sigma) = \emptyset\}$$
$$\geq (r+1)(1-Pr\{dk_{n,r}\})$$
$$= (r+1)(1-k_{n,r}/D)$$
$$= (r+1)(1-2^{n(K_r-C_i(\mathcal{C}))})$$

$$C_a(\mathcal{C}) = t_a(\mathcal{C})C_i(\mathcal{C})/(q-1) \leq$$
$$(q-n)C_i(\mathcal{C})/((q-1)E(\text{cost})) \leq C_i(\mathcal{C})/\left((r+1)\left(1-2^{n(K_r-C_i(\mathcal{C}))}\right)\right)$$

Since $\lim_{n\to\infty}C_i(\mathcal{C})K_{r+1}$, $$\lim_{q/n,n\to\infty}C_a(\mathcal{C}) \leq \lim_{q/n,n\to\infty}K_{r+1}/\left((r+1)\left(1-2^{n(K_r-C_i(\mathcal{C}))}\right)\right) =$$
$$K_{r+1}/(r+1) \leq K_1$$

where the last step is due to Lemma 1.

Once $\lim_{n/q,n\to\infty}C_\alpha(\mathcal{C})$ is optimized, we also want to optimize $C_i(\mathcal{C})$. We now derive an upper bound for that case.

Theorem 2. Let $\mathcal{C}$ be a permutation based update code. If $C_\alpha(\mathcal{C}) \to K_1$ when $g/n,n \to \infty$, then $\lim_{n\to\infty}C_i(\mathcal{C}) \leq K_1$.

Proof: Set r as before. Therefore, $\lim_{n\to\infty}C_i(\mathcal{C}) \leq K_{r+1}$. If $r \geq 1$, $\lim_{q/n,n\to\infty}C_\alpha(\mathcal{C}) \leq K_{r+1}/(r+1)<K_1$, since $K_r/r$ is strictly decreasing, and we have a contradiction, since $C_\alpha(\mathcal{C})$ doesn't approach $K_1$. So r=0, and therefore $\lim_{n\to\infty}C_i(\mathcal{C}) \leq K_1$.

We see that once $C_i(\mathcal{C})$ is asymptotically optimal, $t_\alpha\mathcal{C}$ is asymptotically optimal as well.

D. Construction for the Average Case

We now present a code that achieves both bounds with efficient decoding and update procedures. For convenience, we assume that both log n and n/log n are integers.

Let each data state be a factorial number (also known as a reflected inversion vector) with n/log n digits, $d=(d_0, \ldots, d_{n/\log n-1})$. The i-th digit from the right in a factorial number has base i, which means that the digit is less than i. Therefore, the base of digit $d_i$ is n/log n-i.

We can see that the instantaneous capacity of the code is asymptotically optimal. That is because:

$$C_i(\mathcal{C}) = (1/n)\log|D|$$
$$= (1/n)\log((n/\log n)!)$$
$$\geq \frac{n}{n\log n}(\log n - \log(2\log n))$$
$$= 1 - \log(2\log n)/\log n \to 1, n \to \infty$$

Construction 1. Permutation Based Update Code.
Decoding:
The decoding function, $f(\sigma)$, can be used to decode a permutation a to σ data state d. The permutation a can be written as a sequence of log n permutations, $\sigma=\{\sigma_0, \sigma_1, \ldots, \sigma_{\log n-1}\}$, each taken over n/log n cells. For the purpose of decoding, we first represent the permutations as factorial numbers. Namely, for each permutation $\sigma_j$, its factorial is $V_j=(V_j(0), V_j(1), \ldots, V_j(n/\log n-1))$, with $V_j(i)=|\{k|k>i \text{ and } \sigma_j(k)>\sigma_i(i)\}|$. In other words, each element is the number of elements following the element in the permutation that are greater than it.

The decoding function may be composed of a sequence of digit functions $f_0, f_1, \ldots, f_{n/\log n-1}$, each decoding a different digit. Each digit function $$f_i: \left\{0, 1, \ldots, \frac{n}{\log n} - 1 - i\right\}^{\log n} \to \left\{0, 1, \ldots, \frac{n}{\log n} - 1 - i\right\}$$

can be used to decode the digit $d_i$ according to the vector $V(i)=\{V_0(i), V_1(i), \ldots, V_{\log n-1}(i)\}$. Together, $f(\sigma)=f(V)=(f_0(V(0)), f_1(V(1)), \ldots, f_{n/\log n-1}(V(n/\log n-1))$. Each function $f_i(V(i))$ can take the value of the sum of the digits with index i in the log n factorial numbers. The sum can be taken as a modulo of the base of the digit, $(n/\log n - i)$:

$$f_i V(i) = \Sigma_{j=0}^{\log n - 1} V_j(i) \bmod (n/\log n - i)$$

Update:

The update function, $g(\sigma, d)$, updates the permutation $\sigma$ into a permutation $\sigma'$, such that $f(\sigma')=d$. The function takes place sequentially from $d_0$ to $d_{n/\log n-1}$. The update function is described by the following algorithm:

1: Set $\sigma'=\sigma$, $V'_j$ the factorial number of $\sigma'_j$, and start with digit $d_0$, i.e. i=0.

2: Identify a sequence $s=(s_0, s_1, \ldots, s_{\log n-1})$ of log n bits, such that if, for each f, we perform the transposition $(i, i+s_j)$ on $\sigma'_j$, then $f_i(V'(i))=d_i$. If such a sequence is found, perform the transpositions according to s and repeat phase 2 for the next digit, $d_{i+1}$.

3: If there is no binary sequence s such that $f_i(V'(i))=d_i$, identify a ternary sequence of length log n, i.e., $s_j \in \{0,1,2\}$, such that $f_i(V'(i))=d_i$. If such a sequence is identified, the transpositions can be performed according to s and repeat phase 2 for the next digit.

4: If there is still no appropriate binary sequence s, an arbitrary index j is selected, and update $\sigma_j$ to an appropriate $\sigma'_j$ such that $f(V')=d$.

EXAMPLE 2

Let n=16. Let $\sigma_j=[1,2,3,4]$ for j=0,1,2,3. For each j, $V_j(0)=3$, since there are 3 elements following the element 1 in $\sigma_j$ that are greater that 1. Now we decode the data from the permutations. $f_0(V(0))=3+3+3+3 \bmod(4-0)=0$, so $d_0=0$. Similarly, $d_1=2\times 4 \bmod(4-1)=2$, $d_2=4 \bmod 2=0$ and $d_3=0$. Note that $d_{n/\log n-1}=0$.

We now assume that we want to update the data state to d=(2,2,0,0). We start with encoding $d_0=2$. We look for a binary sequence s such that $f_0(V'(0))=2$. We notice that for each j, if $s_j=0$, then $V'_j(0)=3$, and if $s_j=1$, then $V'_j(0)=2$. So we can choose, for example, the sequence s=(1,1,0,0), and get $f_0(V'(0))=2+2+3+3 \bmod 4=2$. In the same way we can encode each digit in the data state.

We remember that the cost of update is the $L_\infty$ quasimetric: cost $(\sigma \to \sigma') = \max_{i \in [n]} (\sigma^{-1}(i) - \sigma^{-1}(i))$. Therefore, if all the digits are updated by phase 2, the cost of the update operation is 1. The number of binary sequences of length log n is n, and therefore the algorithm can check all of them in polynomial time. In order to avoid the calculation of the sum for each sequence, the algorithm can use a binary reflected Gray code, and calculate only the difference of one transposition in each step.

If at least one digit is updated by phase 3, the cost of the update is 2. The running time of the algorithm remains polynomial in that case. If the algorithm reaches phase 4, the cost can be determined as $n/\log n - 1$, but the running time remains polynomial, since we can choose the elements of $V'_j$ quickly.

Since all the steps in the update algorithm take polynomial time, the worst-case complexity is polynomial in n.

We now analyze the expected cost of update. We assume that $\sigma$ and d are drawn according to uniform distributions, and start with calculating the probability that the cost is greater than 1. For every binary sequence s, $Pr(f_i(V'(i))=d_i)$ is at least $\log(n)/n$, since the base of $d_i$ is at most $n/\log n$. So the probability that s is not good is at most $1-(\log n/n)$. s can take one of n values, and for each different value that probability is independent. Therefore, the probability that there is no good sequence s is at most $(1-(\log n/n))^n$. That probability is independent for different digits of d. Therefore, by the union bound, the probability that at least one digit is updated according to phase 3 is at most $(n/\log n)(1-(\log n/n))^n$. This is the probability that the update cost will be greater than 1. Similarly, the probability that the update cost is greater than 2 is at most $(n/\log n)(1-(\log n/n))^{3^{\log n}}$, since phase 3 uses ternary sequences. We now show that the expected cost of the update algorithm is approaching 1:

$$E(\text{cost}) = \sum_{i=0}^{n/\log n - 1} i Pr(\text{cost} = i) \le$$

$$1 Pr(\text{cost} = 1) + 2 Pr(\text{cost} = 2) + (n/\log n) Pr(\text{cost} > 2) \le$$

$$1 + 2(n/\log n)(1 - (\log n/n))^n + (n^2/\log^2 n)(1 - (\log n/n))^{3\log n} \le$$

$$1 + (2n/\log n)\exp(-\log n) + (n^2/\log^2 n)\exp(-n^{\log 3 - 1}\log n) \to 1, n \to \infty$$

So $C_\alpha(\mathcal{C})=t_+ C_i(\mathcal{C})/(q-1) \to 1$ when $g/n, n \to \infty$, and the code approaches the bounds for the instantaneous and the average total capacity.

E. Existence for the Worst Case

In this section we show that there exists a code such that $C_i(\mathcal{C})$, $C_w(\mathcal{C})$ both approach $K_1$ when $q/n, n \to \infty$.

Theorem 3. There exists a permutation based update code $\mathcal{C}$, such that $C_i(\mathcal{C})$, $C_w(\mathcal{C}) \to K_1$ for $q/n, n \to \infty$.

Proof:

Let $|D|=k_{n,1}/n^{1+\epsilon}$, where $\epsilon$ is a positive constant. In the following we show that there exists a $\{D,n\}$ code with worst case update cost of 1. We first calculate the instantaneous capacity of the code:

$$C_i(\mathcal{C}) = (1/n)\log|D|$$

$$= (1/n)\log k_{n,1} - (1/n)(1 + \epsilon)\log n \to K_1, n \to \infty$$

So the instantaneous capacity of such a code is asymptotically optimal. If we show that the worst-case cost is 1, it follows that the worst-case total capacity is also asymptotically optimal.

Suppose if $\{f^{-1}(d)\}_{d=1}^{|D|}$ is a partition of $S_n$, i.e., $f^{-1}(d) \cap f^{-1}(d')=\emptyset$, $d \ne d'$; and $\cup_{d=1}^{|D|} f^{-1}(d)=S_n$. We now show that there exists a partition of $S_n$, such that for any $\sigma \in S_n$ and any $d \in D$, there exists a vector $\sigma' \in f^{-1}(d)$, such that cost $(\sigma \to \sigma')=1$. We use a random coding method. With every $\sigma \in S_n$, we connect a random index $\gamma_b$ which is uniformly distributed over the data set D, and all these random indices are independent. Then if $\{f^{-1}(d)\}_{d=1}^{|D|}$ forms a random partition of $S_n$. Fix $d \in D$ and $\sigma \in S_n$, then $$Pr\{f^{-1}(d) \cap B_{n,r}(\sigma) = \emptyset\} = Pr\{\forall \ \sigma B_{n,r}(\sigma), r_b \neq d\}$$
$$= [1 - 1/|D|]^{k_{n,1}} \exp\{-k_{n,1}/|D|\}$$
$$= \exp\{-n^{1+s}\}$$

Therefore,
$$Pr\{\exists \ d \in D \text{ and } \sigma \in S_n, \text{ s.t. } f^{-1}(d) \cap B_{n,r}(\sigma) = \emptyset\} \leq$$
$$|D||S_n|\exp\{-n^{1+s}\} \leq 2^n n! \exp\{-n^{1+s}\} \leq$$
$$\exp\{n(1 + \ln n - n^{\varepsilon})\} \to 0, n \to \infty$$

This implies that when n is sufficiently large, there exists a partition of $S_n$ such that the cost of each update is 1.

Figure 8A:
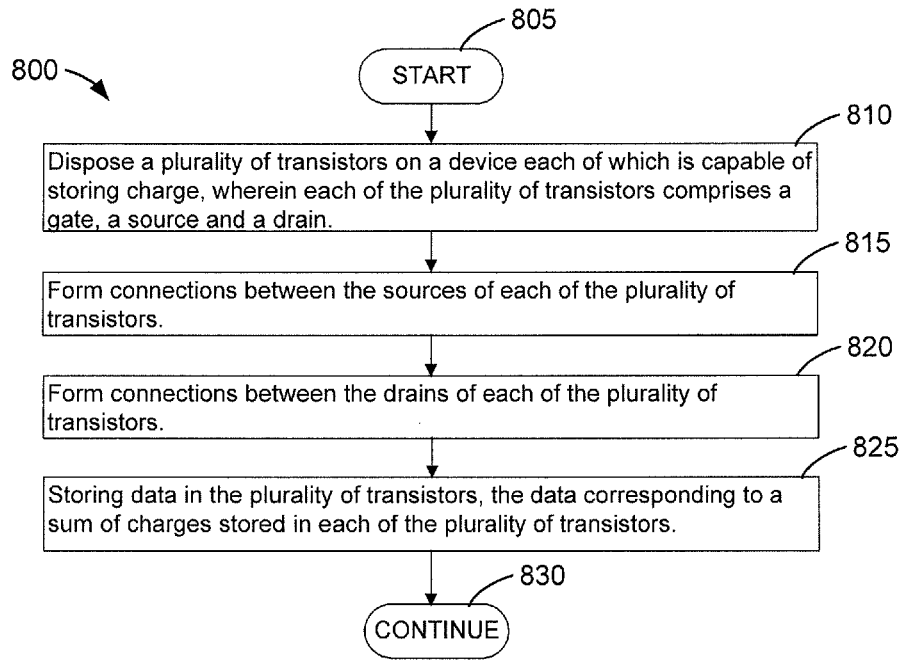
FIG. 8A is a process for manufacturing and operating a data storage device in accordance with the description herein.

FIG. 8A depicts a process 800 for manufacturing and operating a data device. Process 800 may include one or more operations, actions, or functions as illustrated by one or more of blocks 805, 810, 815, 820, 825 and 830. Although illustrated as discrete blocks, various blocks may be divided into additional blocks, combined into fewer blocks, or eliminated, depending on the particular implementation. The process starts with block 805. In block 810 a plurality of transistors each of which is capable of storing charge are disposed on a device. Each of the plurality of transistors comprises a gate, a source, and a drain. In block 815 connections are formed between the sources of each of the plurality of transistors. Each connection is capable of carrying electrical current. In block 820 connections are formed between the drains of each of the plurality of transistors. Each connection is capable of carrying electrical current. In block 825 data is stored in the plurality of transistors. The data corresponds to a sum of charges stored in each of the plurality of transistors. In block 830 the process may continue. In some embodiments connections may be formed between the gates of each of the plurality of transistors.

Figure 8B:
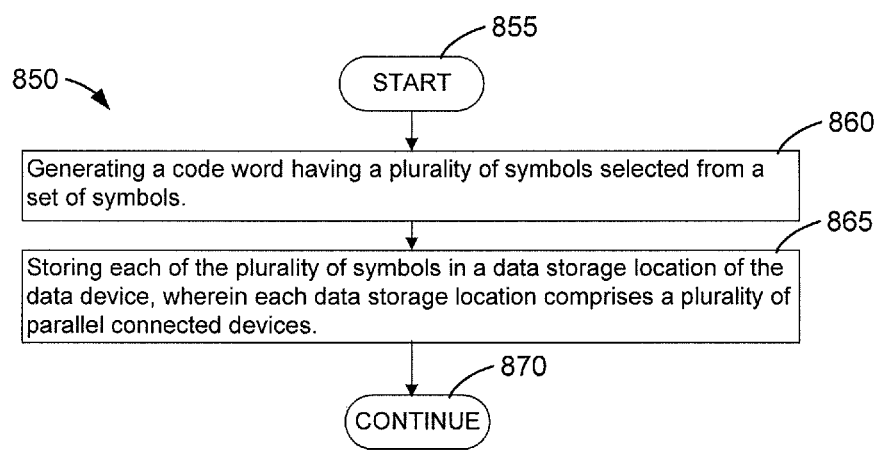
FIG. 8B is a process for operating a data storage device in accordance with the description herein.

FIG. 8B depicts a process 850 for operating a data device. Process 850 may include one or more operations, actions, or functions as illustrated by one or more of blocks 855, 860, 865 and 870. Although illustrated as discrete blocks, various blocks may be divided into additional blocks, combined into fewer blocks, or eliminated, depending on the particular implementation. The process starts with block 855. In block 860 a code word is generated that has a plurality of symbols selected from a set of symbols. In block 865 each of the plurality of symbols is stored in a data storage location of the data device. Each data storage location comprises a plurality of parallel connected devices. In block 870 the process may be continued. In some embodiments the plurality of parallel connected devices may comprise transistors.

IV. Multi-Permutations

We further generalize the paradigm of representing information with permutations to the case where the number of cells in each level is a constant greater than 1, multi-permutations.

Namely, the states that the cells can take are no longer permutations of a set, but permutations of a multiset. For example, if the number of cells at each level is 2, the two cells in each level do not need to be identical in their analog values, they just need to be distinguishable with other levels (but do not need to be mutually distinguishable). Hence, the encoding and decoding may use relative levels, and the scheme has good resistance to drift; namely, the advantages of the permutation based relative scheme that we described above still apply. Another example is the case where the number of levels is 2, and there are many cells in each level. In this case, the multi-permutations are balance binary sequences.

We consider the case where the multiplicities of all the elements in the multiset are equal, and denote it by z. This generalization becomes interesting especially when z is large, and n is still much larger than z. In that case (if q is still much larger than n), we can prove that the upper bound on the total capacity is 2q bits per cell, and that there exists a construction that approaches this bound. The instantaneous capacity of the construction is approaching 2 bits per cell. These results can be proved using similar techniques to those we used in the theorems described in this paper. Since the cost of each update is at least 1, the number of updates is at most q−1. We note that when the number of updates is at most q−1, it follows that the total capacity of an update scheme, even without relative levels, is no higher than 2q bits per cell, and that there exists a code that achieves this bound. See, for example, F.-W. Fu and A. J. Han Vinck, "On the capacity of generalized write-once memory with state transitions described by an arbitrary directed acyclic graph," *IEEE Trans. on Inform. Theory*, vol. 45, no. 1, pp. 308-313, January 1999. However, our generalization makes a stronger claim— that there exists a code that uses multisets (relative levels) and achieves the total capacity of 2q bits per cell. It is still an open problem to find a construction that achieves 2q bits per cell.

A. Compressed Rank Modulation

We will focus on the new multi-permutations scheme introduced above, which we call Compressed Rank Modulation. Before we do that, let us first review the terms in the original rank modulation scheme. There are n cells, whose analog levels can be denoted by $c_1, c_2, \ldots, c_n$. (For flash memories, the analog level of a cell may correspond to its charge level or threshold-voltage level. For phase-change memories and memristors, the analog level of a cell may correspond to its resistance level.) They induce a permutation $[x_1, x_2, \ldots, x_n]$ of the set $\{1, 2, \ldots, n\}$, such that $$c_{x_1} < c_{x_2} < \ldots < c_{x_n}.$$

For i=1, 2, . . . , n, the $x_i$-th cell is said to have rank i. An example is shown in FIG. 9, where n=4 cells induce the permutation [4,2,1,3].

Rank modulation may have two advantages:
  Cell programming is efficient and robust. We can program cells from the lowest level to the highest level, without the risk of overshooting, and there may be no need to accurately control the level of any cell.
  The state of the cells can be read in a simple way. For the n cells, their ranks can be determined by sorting. That is, we just need to measure the order of the cell levels. There may be no need to measure the exact value of the cell levels.

We now introduce the new scheme called, Compressed Rank Modulation. Let n and $d_1, d_2, \ldots, d_n$ be parameters that are positive integers. There are $d_1+d_2+\ldots+d_n$ cells, whose analog levels are denoted by $c_1, c_2, \ldots, c_{d_1+d_2+\ldots+d_n}$. They are assigned n different ranks based on their analog levels, where the $d_1$ cells of the lowest analog levels are assigned rank 1, the next $d_2$ cells are assigned rank 2, . . . , and the top $d_n$ cells are assigned rank n. An example is shown in FIG. 10, where n=3, $d_1=d_2=d_3=2$, and the induced permutation is

[{4,5}, {2,3}, {1,5}]

(namely, cell 4 and cell 6 have rank 1 (the lowest rank), cell 2 and cell 3 have rank 2 (the middle rank), and cell 1 and cell 5 have rank 3 (the highest rank)).

Another example is as follows:

EXAMPLE 3

Let n=3, $d_1$=2, $d_2$=3, $d_3$=4. We assign $\Sigma_{i=1}^n d_i$=9 cells to n=3 ranks, such that $d_1$ cells are assigned to rank 1, $d_2$ cells are assigned to rank 2, and $d_3$ cells are assigned to rank 3. For example, the following permutation is valid:

[{1,5}, {2,3,8}, {4,6,7,9}].

The main advantage of Compressed Rank Modulation, compared to rank modulation, is that cells of the same rank can be programmed to very close analog levels. In the original rank modulation, in order to tolerate noise, we want there to be a sufficiently large gap between every two analog cell levels. In the compressed rank modulation, however, for cells of the same rank, their analog levels can be arbitrarily close. (And when we program cells, we would like to make cells of the same rank to have very close analog levels, so that the gap between the analog cell levels of different ranks can be large.) This way, we can pack more cells into the group of cells that use rank modulation. And the storage capacity can be increased.

EXAMPLE 4

This Example illustrates that the compressed rank modulation can improve the storage capacity. In this example, cells of the same rank can be programmed to arbitrarily close analog levels (just for the sake of explanation). For cells of adjacent ranks, in this example, the gap between their analog levels can be assumed to be $\Delta$.

Consider the compressed rank modulation with n=3 and $d_1=d_2=d_3=2$. The rank modulation can represent $$\binom{6}{2}\binom{4}{2} = 90 \text{ symbols.}$$

For fair comparison, for the original rank modulation scheme, consider 6 cells that we partition equally into 2 groups, where every group employs the rank modulation scheme. Since each group can represent 3!=6 symbols, the two groups can together represent 6×6=36<90 symbols. So the compressed rank modulation achieves higher storage capacity.

The compressed rank modulation scheme may have the advantages of the original rank modulation scheme:
  Cell programming is efficient and robust. When programming cells, we program them from the lowest rank to the highest rank, without the risk of overshooting. Note that for cells of the same rank, the order of their analog levels does not matter. There is no need to accurately control the analog level of any cell.
  The state of the cells can be read in a simple way. All we need is still just sorting. The $d_1$ cells of the lowest analog levels have rank 1, the next $d_2$ cells have rank 2, and the top $d_n$ cells have rank n.

We emphasize again that for cells of the same rank, their analog levels can have arbitrary orders. That makes programming simple. For example, the examples in FIGS. 11 and 12 may induce the same permutation as the example in FIG. 10. Of course, given the permutation [{4,6}, {2,3}, {1,5}], we prefer to program it as FIG. 10 or FIG. 12 instead of FIG. 11, in order to have larger gaps between the analog cell levels of different ranks.

1. Initial Write

In this section, we discuss how to write data in the compressed rank modulation scheme.

For flash memories (or PCMs, etc.), when data are written to cells for the first time, typically, all the cells are in the same initial state. (Typically, they all have the lowest analog levels.) So given a permutation [$\{x_1, x_2, \ldots, x_{d_1}\}, \{x_{d_1+1}, x_{d_1+2}, \ldots, x_{d_1+d_2}\}, \ldots, \{x_{1+\sum_{i=1}^{n-1} d_i}, x_{2+\sum_{i=1}^{n-s} d_i}, \ldots, x_{\sum_{i=1}^{n} d_i}\}$], we can program the cells from the lowest rank to the highest rank, in the following way:

1. Let $\Delta>0$ be a parameter we choose. Let cells of rank 1 —namely, the $x_1$th cell, the $x_2$th cell, ..., the $x_{d_1}$th cell—retain their analog levels.

2. For i=2, 3, ..., n, do:
  Program the cells of rank i such that their analog levels are all higher than the analog levels of the cells of rank i−1 by at least $\Delta$.

It is easy to see that the above programming method has little to no risk of overshooting, and enables cells to be programmed efficiently without the need to accurately control analog cell levels. It is especially useful for flash memories, where cell levels can only be increased before the very costly block erasure operation is taken.

2. Subsequent Rewrites

After data are written into cells, there are at two scenarios where it may be necessary to program the cells again. In the first scenario, the value of the data needs to be changed. In the second scenario, the analog cell levels of the cells are disturbed by noise, and cells need to be reprogrammed to ensure data reliability. If various cells need to be reprogrammed by increasing cell levels (which is performed for flash memories and sometimes also for PCMs), the cells can be programmed with the following method.

Let $(c_1, c_2, \ldots, c_{d_1+d_2+\ldots+d_n})$ denote the initial analog levels of the cells. Let [$\{x_1, x_2, \ldots, x_{d_1}\}, \{x_{d_1+1}, x_{d_1+2}, \ldots, x_{d_1+d_2}\}, \ldots, \{x_{1+\sum_{i=1}^{n-i} d_i}, x_{2+\sum_{i=1}^{n-1} d_i}, \ldots, x_{\sum_{i=1}^{n} d_i}\}$] denote the new permutation we need to program into the cells, and let $(c_1', c_2', \ldots, c_{d_1+d_2+\ldots+d_n}')$ denote the new analog cell levels to be set. We can program the cells from the lowest rank to the highest rank as follows:

1. Let $\Delta>0$ be a parameter we choose. For cells of rank 1 —namely, the $x_1$th cell, the $x_2$th cell, ..., the $x_{d_1}$th cell—they can either retain their analog levels, or be programmed slightly such that their analog levels become close to each other.

2. For i=2, 3, ..., n, do:
  Program the cells of rank i such that their analog levels are higher than the analog levels of the cells of rank i−1 by at least $\Delta$. In addition, if desirable, we can also make their analog levels be close to each other.

It can be seen that the programming method is essentially the same as the one for the initial write. It also avoids overshooting programming errors, and is robust and efficient.

3. Programming Symmetric Cells

For some memories (such as phase-change memories and memristors), their cell levels can be both increased and decreased without block erasures. In such a symmetric case, it becomes even easier to program cells for the compressed rank modulation scheme. Those skilled in the art will understand how to program cells for this case.

4. Rebalancing Permutations

A compressed rank modulation code has $$\binom{d_1+d_2+\ldots+d_n}{d_1}\binom{d_2+d_3+\ldots+d_n}{d_2}\cdots\binom{d_{n-1}+d_n}{d_{n-1}}$$

permutations. We can directly use them to encode data, either with a one-to-one mapping or with an error-correcting code. In the following, we describe two additional methods for encoding data, which can be especially useful if the number of cells $d_1+d_2+\ldots+d_n$ is large.

Suppose the input data is a vector $(v_1, v_2, \ldots, v_{d_2+d_2+\ldots+d_n}) \in \{0, 1, \ldots, n-1\}^{d_1 d_2 + \cdots + d_n}$, where each integer $v_i$ can independently be any integer in the alphabet $\{0, 1, \ldots, n-1\}$. (Note that coding schemes for such vectors have been extensively studied in the past.) We would like to change it into a "similar" permutation so that we can store it using the compressed rank modulation scheme, and use a small amount of metadata to remember how the change happened.

The key is to rebalance the vector in an efficient way so that it becomes a permutation with the required weight distribution $(d_1, d_2, \ldots, d_n)$. The approach is illustrated with the following example.

EXAMPLE 5

Let n=4 and $d_1=d_2=d_3=d_4$, =5. Suppose we have a codeword of $(d_1+d_2+d_3+d_4) \log_2 n = 40$ bits:

10 01 00 11 01 10 11 01 11 11 10 01 01 10 11 11 00 00 01 10

Such a codeword can be easily converted to a vector $(v_1, v_2, \ldots, v_{20}) \in \{0,1,2,3\}^{20}$ with the simple mapping: 00→0, 01→1, 10→2, 11→3, and get 2 1 0 3 1 2 3 1 3 3 2 1 1 2 3 3 0 0 1 2

(Certainly, we may also choose to use a Gray code for the mapping. But that is not related to our discussion here.)

To get a permutation where each of the n=4 ranks has S cells, we can do it in three steps. First, we transform it to a codeword where the number of 0s or 1s equals the number of 2s or 3s. By inverting the first i=1 cell (where we change 0 to 3, change 1 to 2, change 2 to 1, and change 3 to 0), we get 1 1 0 3 1 2 3 1 3 3 2 1 1 2 3 3 0 0 1 2 which has 10 0s or 1s, and 10 2s or 3s.

The subsequence that contains 0s or 1s in the above codeword is 1 1 0 1 1 1 1 0 0 1

To make it balanced, we invert the first is i=2 cells (where we change 0 to 1, and change 1 to 0), and get 0 0 1 1 1 0 0 1

The subsequence that contains 2s or 3s in the above codeword is 3 2 3 3 3 2 2 3 3 2

To make it balanced, we invert the first i=1 cell (where we change 2 to 3, and change 3 to 2), and get 2 2 3 3 3 2 2 3 3 2

We merge the above two subsequences based on their original positions, and get 0 0 0 2 1 2 3 1 3 3 2 1 1 2 3 3 0 0 1 2

We can now store it as a compressed rank modulation code, where each of the n=4 ranks has cells.

The additional information about the inverting namely, i=1, is =2 and i=1—can be stored as meta-data in additional cells (possibly using compressed rank modulation as well). (Note that in the above example, the mapping used in inverting cell levels is not unique. For example, we can change 0 to 2 instead of 3, or change 1 to 3 instead of 2, etc. (The key is to switch $\{0,1\}$ with $\{2,3\}$ when inverting cells.))

So we can see that it is feasible to represent existing codes e.g., BCH codes, Reed-Solomon codes, LDPC codes, and other codes—with compressed rank modulation. The system model is shown in FIG. 13.

5. Record Weights

We now discuss an alternative approach. Suppose the input data is a vector $(v_1, v_2, \ldots, v_{d_2 d_2 + \ldots d_n}) \in \{0, 1, \ldots, n-1\}^{d_2 d_2 + \cdots + d_n}$, where each integer $v_i$ can independently be any integer in the alphabet $\{0, 1, \ldots, n-1\}$. For i=0, 1, \ldots n-1, let $d_{i+1}$ denote the number of entries in the vector that are equal to i; that is, $d_{i+1} = |\{j | 1 \leq j \leq d_1 + d_2 + \ldots + d_n, v_j = i\}|$. We record the weight distribution $(d_1, d_2, \ldots, d_n)$ as metadata. And then, we can store the vector directly as a compressed rank modulation permutation. (If any of the $d_i$'s happens to be 0, the compressed rank modulation scheme can be extended easily to cover this case.)

EXAMPLES

Figure 14A:
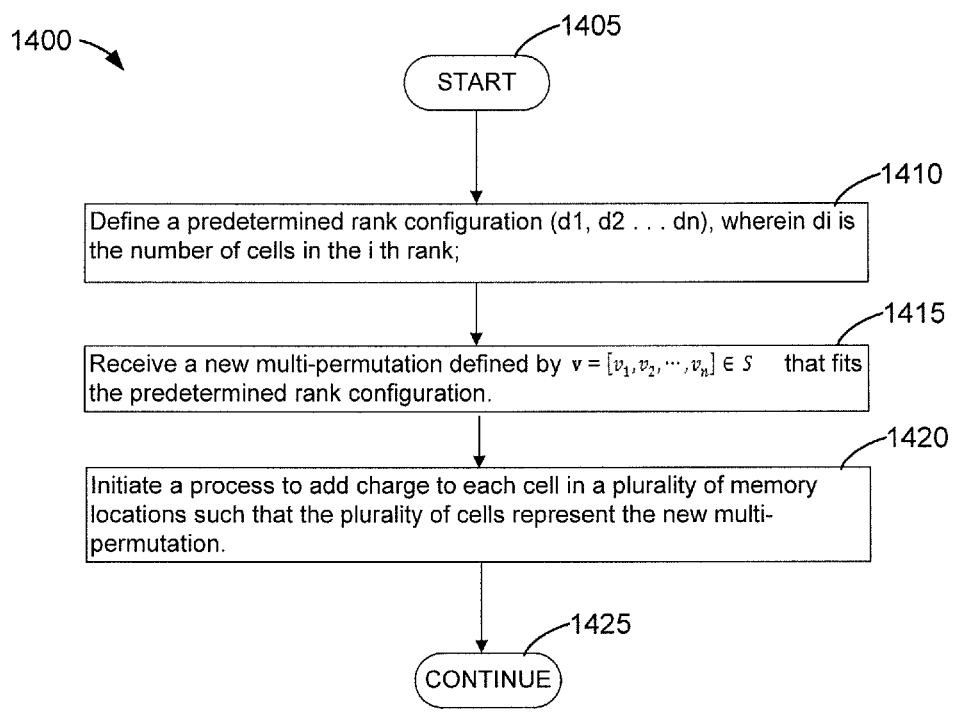
FIG. 14A is a process for operating a data device in accordance with the description herein.

FIG. 14A depicts a process 1400 for operating a data device. The process 1400 may include one or more operations, actions, or functions as illustrated by one or more of blocks 1405, 1410, 1415, 1420, and 1425. Although illustrated as discrete blocks, various blocks may be divided into additional blocks, combined into fewer blocks, or eliminated, depending on the particular implementation. The process starts with block 1405. In block 1410 a predetermined rank configuration $(d_1, d_2 \ldots d_n)$ is defined, wherein $d_i$ is the number of cells in the $i^{th}$ rank. In block 1415, a new multi-permutation is received and defined by $v=[v_1, v_2, \ldots, v_n] \in S$ that fits the predetermined rank configuration. In block 1420 a process is initiated in response to receiving the new multi-permutation, adding charge to each cell in a plurality of memory locations such that the plurality of cells represent the new multi-permutation. In block 1425 the process may be continued.

Figure 14B:
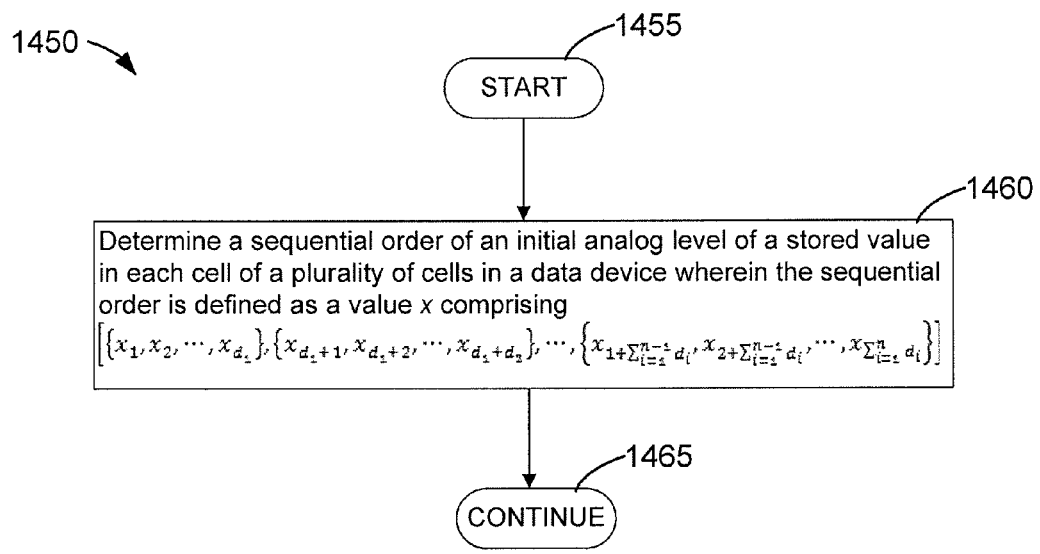
FIG. 14B is a process for reading a data device in accordance with the description herein.

FIG. 14B depicts a process 1450 for reading a data device. The process 1450 starts with block 1455. In block 1460 the sequential order of an initial analog level of a stored value in each cell of a plurality of cells in a data device is determined. The sequential order is defined as a value x comprising $[\{x_1, x_2, \ldots, x_{d_1\}, \{x_{d_1+1}, x_{d_1+2}, \ldots, x_{d_2+d_2}\}, \ldots, \{x_{1+\Sigma_{i=1}^{n-1} d_i}, x_{2+\Sigma_{i=1}^{n-1} d_i}, \ldots, x_{\Sigma_{i=1}^{n} d_i}\}]$. In block 1465 the process may be continued.

Figure 15A:
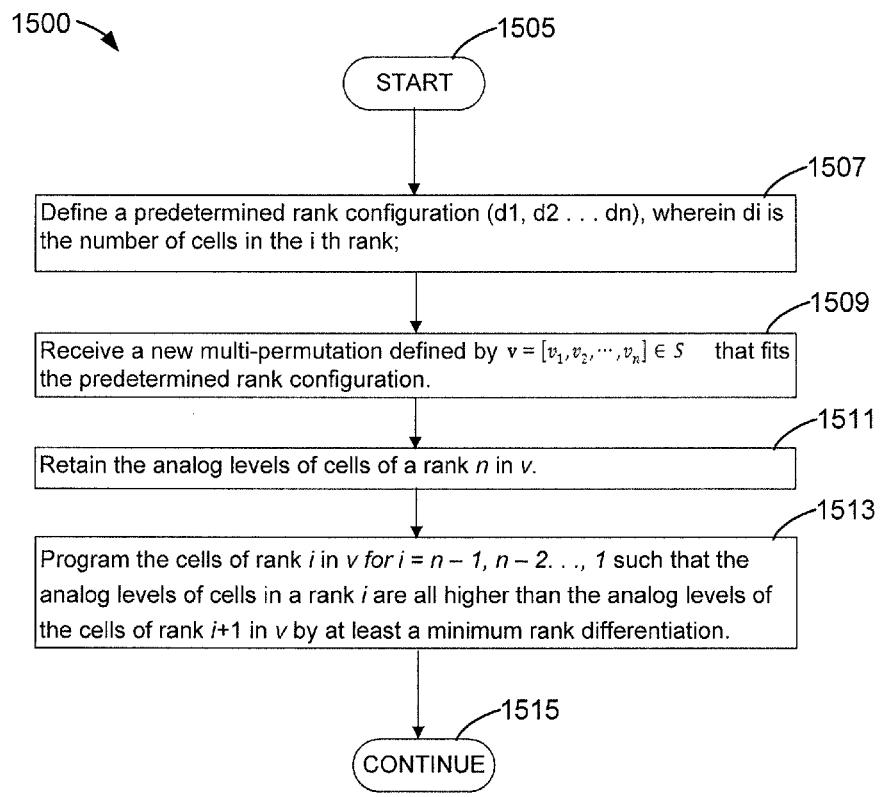
FIG. 15A is a process for writing to a data device in accordance with the description herein.

FIG. 15A depicts a process 1500 for writing to a data device. The process 1500 may include one or more operations, actions, or functions as illustrated by one or more of blocks 1505, 1507, 1509, 1511, 1513, and 1515. Although illustrated as discrete blocks, various blocks may be divided into additional blocks, combined into fewer blocks, or eliminated, depending on the particular implementation. The process starts with block 1505. In block 1507 a predetermined rank configuration $(d_1, d_2 \ldots d_n)$ is defined, wherein $d_1$ is the number of cells in the $i^{th}$ rank. In block 1509, a new multi-permutation is received and defined by $v=[v_1, v_2, \ldots, v_n] \in S$ that fits the predetermined rank configuration. In block 1511 the analog levels of cells of a rank n in v are retained. In block 1513 the cells of rank i in v for I=n−1, n−2 \ldots, 1 such that the analog levels of cells in a rank i are programmed to all be higher than the analog levels of the cells of rank i+1 in v by at least a minimum rank differentiation. In block 1515 the process may be continued.

VI. Rank-Modulation Rewriting Codes

Various embodiments disclosed herein construct rank modulation codes that achieve a rate approaching two on each write. One embodiment takes advantage of the recently discovered polar codes which were recently used in the construction of WOM codes. See, for example, D. Burshtein and A. Strugatski, "Polar write once memory codes," in *Proceedings of the* 2012 *IEEE International Symposium on Information Theory, ISIT*2012, Cambridge, Mass., USA, July 2012, pp. 1982-1986.

A. Definitions of the Rewrite Model

The features of the rank-modulation scheme come from the fact that it avoids the discretization of the cell levels. However, in order to design coding schemes, a discrete model for the rewriting is very helpful. In addition, as demonstrated in the example in Section I, there is a need for a certain gap between the levels of cells in different rankings. Furthermore, remember that the cells can only store a limited amount of charge. Therefore, a limited number of ranks can be represented within a set of cells. We denote the number of "virtual levels" that every cell can represent by q. The levels are virtual in the sense that they do not correspond to a discretization of the cell level, but to the resolution of the charge detection and the power of the noise that might affect the relative levels of the cells. The q virtual levels allow the analysis and comparison of different rewriting methods. If the memory has N cells then we denote $c=(c_1, c_2, \ldots, c_N)$, where $c_i \{0, 1, \ldots, q-1\}$, to be the cell-state vector.

In recent work, the data was encoded by permutations, that is, only a single cell in each rank. See, for example, A. Jiang, R. Mateescu, M. Schwartz, and J. Bruck, "Rank modulation for flash memories," *IEEE Trans. on Inform. Theory*, vol. 55, no. 6, pp. 2659-2673, June 2009. Here we allow more than one cell in each rank, where the number of cells in each rank is predetermined, and we call it the multiplicity of the rank. The generalized ranking now becomes a permutation of a multiset of the ranks, which we define to be a multipermutation. Assume there are m ranks, the multiplicity of the i-th rank is denoted by $z_i$, and in case that all multiplicities are equal, we denote this number by z. Remember that when considering the discrete model, we allow to place two cells with the same rank in the same discrete level, since we don't need a gap in order to distinguish their rank or to prevent errors.

Since there are m ranks in our multipermutations and the multiplicity of the i-th rank, $1 \leq i \leq m$, is $z_i$, we have that $N=\Sigma_{i=1}^m z_i$. We let $P_m$ be the set of all N cells multipermutations $\sigma=\sigma(1), \sigma(2), \ldots, \sigma(N))$ with m ranks. That is, for $1 \leq j \leq N$, $\sigma(j) \in \{1, \ldots, m\}$. For $1 \leq i \leq m$, $\sigma^{-1}(i)$ is the set of all cells with rank i, i.e., $\sigma^{-1}(i)=\{j|\sigma(j)=i\}$. We call the vector $z=\{z_1, z_2, \ldots, z_m\}$ a multiplicity vector. The set of all multipermutations of m ranks with multiplicity vector z is denoted by $P_{m,z}$. Hence, $\sigma=(\sigma(1), \sigma(2), \ldots, \sigma(N)) \in P_{m,z}$ if and only if for $1 \leq i \leq m$, $|\sigma^{-1}(i)|=z_i$. In case that $z=z_i$ for all $1 \leq i \leq m$, we denote the set $P_{m,z}$ simply by $P_{m,z}$, and we will follow the same analogy in the other definitions in the paper which include the multiplicity vector z.

Given a cell-state vector $c=(c_1, c_2, \ldots, c_N)$ and a multiplicity vector $z=(z_1, z_2, \ldots, z_m)$, the multipermutation $\sigma_{c,z}=(\sigma(1), \sigma(2), \ldots, \sigma(N))$ is derived as follows. First, let $i_1, \ldots, i_N$ be an order of the cells such that $c_{i_1} \leq c_{i_2} \leq \ldots \leq c_{i_N}$. Then, the cells $i_1, \ldots i_{z_1}$ get the rank 1, the cells $i_{z_1+1}, \ldots, i_{z_1+z_2}$ get the rank 2 and so on. More rigorously, for $1 \leq i \leq m$, the cells $i_{m_i}, i_{m_i}+1, \ldots, i_{M_i}$ get the rank i, where $m_i=1+\Sigma_{l=1}^{i-1} z_l$ and $M_i=\Sigma_{l=1}^i z_l$, i.e., $\sigma(i_{m_i})=\sigma(i_{m_i}+1)=\ldots=\sigma(i_{M_i})=i$. Note that a given cell-state vector can generate different multipermutations in case that there is equality between the levels of cells in adjacent ranks. In this case, we will define the multipermutation to be illegal and denote $\sigma_{c,z}=F$. Given a multiplicity vector $z=\{z_1, z_2, \ldots, z_m\}$, we let $Q_z$ be the set of all cell-state vectors which result with a valid multipermutation, that is, $Q_z=\{c \in \{0, 1, \ldots, q-1\}^N | \sigma_{c,z} \neq F\}$.

The other attribute of the model studied previously is its process of programming. See, for example, A. Jiang, R. Mateescu, M. Schwartz, and J. Bruck, "Rank modulation for flash memories," *IEEE Trans. on Inform. Theory*, vol. 55, no. 6, pp. 2659-2673, June 2009. On every rewrite step, a single cell could be programmed to be only the highest level. Therefore, if the length of the permutation is N, N different permutations could be written without increasing the top level by more than one level (including the original permutation). In this work, however, we introduce a more opportunistic approach for rewriting with the powerful property that the number of permutations (or multipermutations) that can be written without increasing the top level by more than one level becomes exponential in N.

The programming method we suggest is designed to minimize the increase in the cell charge levels. Let c be the current cell-state, and $\sigma_{c',z}$ the multipermutation we wish to write. For $i=2, 3, \ldots, m$, we increase the level of the cells in $\sigma_{c',z}^{-1}(i)$ to be higher than the highest cell in $\sigma_{c',z}^{-1}(i-1)$. In the discrete model, the cells in $\sigma_{c',z}^{-1}(i)$ take the level $\max\{c_j | \sigma_{c',z}(j)=i-1\}+1$. We can see that writing in this method does not bear a risk of overshooting, since there is no upper threshold for the cell programming. In addition, it is straightforward to observe that the method in fact minimizes the increase in the levels of the cells, and specifically the level of the highest cell.

The initial state of all the cells is the all-zero vector, 0. The goal is to reuse the memory for T successive rewrites without incurring an erasure operation. We consider only the case where the encoder knows and the decoder does not know the previous state of the memory. The encoder and decoder can use the same code for every cycle, and there are no decoding errors (zero-error case). For the cell states c and c', we denote $c \leq c'$ if and only if $c_i \leq c'_i$, for all $i=1, 2, \ldots, N$. We are now ready to define the rewriting codes.

Definition 1. An $(N,q,T,D,z=(z_1, z_2, \ldots, z_m))$ rank-modulation rewriting code is a coding scheme $\mathcal{C}$ (f, g) comprising of N q-level cells and a pair of encoding function f and decoding functions g. Let $I=\{1, \ldots D\}$ be the set of input information symbols. The encoding function $f: I \times Q_z \to Q_z$, and the decoding function $g: Q_z \to I$ satisfy the following constraints:

1) For any $d \in I$ and $c \in Q_z$, $\leq f(d,c)$.
2) For any $d \in I$ and $c \in Q_z$, $g(f(d,c))=d$.
3) For any $c_1, c_2 \in Q_z$, if $\sigma_{c_1,z}=\sigma_{c_2,z}$ then $g(c_1)=g(c_2)$.
4) The code $\mathcal{C}$ (f,g) supports any sequence of T writes $(d_1, \ldots, d_T)I^T$.

The instantaneous rate of the code is $\mathcal{R}_{inst}=(1/N)\log_2 \log_2 D$ and the sum-rate is $\mathcal{R}_{sum}=T\mathcal{R}_{inst}$.

One goal in the design of rank-modulation rewriting codes is to maximize the sum-rate. For that, we first try to maximize the number of writes and then maximize the instantaneous rate on each write. This is achieved carefully in a way that the maximum level on each write increases with high probability by one level. Another goal we will draw our attention to in the design of such codes is low complexity of the encoding and decoding functions. The design of codes with high rate and low complexities will be the topic of the next chapter, where we explain the construction of our rank-modulation rewriting codes.

B. Description of the Construction

Our point of departure in constructing rank-modulation rewriting codes is to design such codes while the increase on each write of the maximum level is no greater than one. That is, given a rank-modulation rewriting code $\mathcal{C}$ (f,g), for every $d \in I$ and $c \in Q_z$, if $c'=f(d,c)$, then $\max_i\{c'_i\}-\max_i\{c_i\} \leq 1$. An important observation to notice here is that if there exists i such that $\sigma_{c,z}(i)-\sigma_{c',z}(i)>1$, then the value $\max_i\{c'_i\}-\max_i\{c_i\}$ might be greater than 1. Consider, for example, the case where $m=4$, $z=1$ and $c=(1,2,3,4)$. Here, if $\sigma_{c,z}(3)-\sigma_{c',z}(3)=2$, then cell 3 must be the lowest cell in c', and $\max_i\{c_i\}-\max_i\{c'_i\} \geq 2$.

To avoid such scenarios we choose to constraint the value of $\sigma_{c',z}(i)$ to be at least $\sigma_{c,z}(i)-1$. That is, in case the rank of a cell decreases, it cannot decrease by more than one rank. Hence, the cells in the first rank in c' can only be the ones from the first or second rank of c, i.e. $\sigma_{c',z}^{-1}(1)$ is a subset of $\sigma_{c,z}^{-1}(1) \cup \sigma_{c,z}^{-1}(2)$. Similarly, the cells in the second rank of c' can only be the ones from the first, second, or third rank of c, which are not already assigned to the first rank of c'. Mathematically speaking, we note that $$\sigma_{c'_z}^{-1}(2) \subseteq \{\sigma_{c_z}^{-1}(1) \cup \sigma_{c_z}^{-1}(2) \cup \sigma_{c_z}^{-1}(3)\} \setminus \sigma_{c'_z}^{-1}(1).$$

and in general, for i=1, . . . , m−1, given the selection of $\sigma_{c'_z}^{-1}(1), \sigma_{c'_z}^{-1}(2), \ldots, \sigma_{c'_z}^{-1}(i-1)$, the set $\sigma_{c'_z}^{-1}(i)$ satisfies $$\sigma_{c'_z}^{-1}(i) \subseteq \{\cup_{j=1}^{i+1} \sigma_{c_z}^{-1}(j)\} \setminus \{\cup_{j=1}^{i-1} \sigma_{c'_z}^{-1}(j)\}.$$

Motivated by this observation, the value of c'=f (d, C) is encoded by a sequence of functions, each making a subset choice according to a different part of the input data d. Assume the input data d is partitioned into m−1 parts and let $(d_1, d_2, \ldots, d_{m-1})$ be the data parts associated with each rank, where rank m doesn't represent any information. The first function determines the cells from $\sigma_{c_z}^{-1}(1) \cup \sigma_{c_z}^{-1}(2)$ which are assigned to be the set $\sigma_{c'_z}^{-1}(1)$ as a function of the input data $d_1$. Thus we can write, $\sigma_{c'_z}^{-1}(1) = f_1(d_1, \sigma_{c_z}^{-1}(1) \cup \sigma_{c_z}^{-1}(2))$, for some function $f_1$. Similarly, for i=2, 3, . . . , m−1, there exists a function $f_i$ such that $$\sigma_{c'_z}^{-1}(i) = f_i(d_i, \{\cup_{j=1}^{i+1} \sigma_{c_z}^{-1}(j)\} \setminus \{\cup_{j=1}^{i-1} \sigma_{c'_z}^{-1}(j)\}).$$

The decoder will operate in a similar way which will be explained in the sequel as part of the construction details.

Assume that the multiplicities of all the ranks are the same, so $z_1 = \ldots = z_m = z$. Then, for each i=1, . . . , m−1

$$|\{\cup_{j=1}^{i+1} \sigma_{c_z}^{-1}(j)\} \setminus \{\cup_{j=1}^{i-1} \sigma_{c'_z}^{-1}(j)\}| = 2z.$$

Hence, in the encoding function $f_i$, if we consider the cells in the set $\{\cup_{j=1}^{i+1} \sigma_{c_z}^{-1}(j)\} \setminus \{\cup_{j=1}^{i-1} \sigma_{c'_z}^{-1}(j)\}$ as binary cells of value zero and all other cells of value one, then we can only program the zero cells to be one. Therefore, the key point in designing these encoding functions is to observe the similarity to the binary write-once memory (WOM) problem.

A write-once memory comprises of a number of "write once" cells, where each cell is initially in state "0" and can be irreversibly programmed to state "1". Rivest and Shamir demonstrated that it is possible to rewrite such a write-once memory multiple times, using coding techniques, called WOM codes. See, for example, R. L. Rivest and A. Shamir, "How to reuse a "write-once" memory," *Inform. and Control*, vol. 55, pp. 1-19, 1982. Back to the problem of encoding a single rank, we can think of $\{\cup_{j=1}^{i} \sigma_{c_z}^{-1}(j)\} \setminus \{\cup_{j=1}^{i-1} \sigma_{c'_z}^{-1}(j)\}$ as cells that were not written on the first write of a two-write WOM code, while all other cells were already written as value one on the first write.

However, there is an important difference between the problem of encoding a second write in a two-write WOM code and our problem of encoding a single rank. While in a two-write WOM code there is no significance to the number of cells that are written on the second write, in our codes we seek to write such that exactly $z_i$ of the cells will remain in level zero. If we have a WOM code that writes a constant number of cells in the second write, we could use that code to write more than twice, since we know the number of cells which were not programmed after the second write, and we could keep using the same code (with different parameters) for the subsequent writes. So in fact, a WOM code that might be suitable for our problem should be a code which allows more than two writes to the memory. Since we are interested in WOM codes with high rates, it is natural to consider the recently proposed polar WOM codes. Polar WOM codes were introduced by Burshtein and Strugatski, and they are the first WOM codes that allow to write more than twice with sum-rate which asymptotically approaches the sum-capacity, log(t+1). See, for example, D. Burshtein and A. Strugatski, "Polar write once memory codes," in *Proceedings of the* 2012 *IEEE International Symposium on Information Theory, ISIT*2012, Cambridge, Mass., USA, July 2012, pp. 1982-1986. The special property that allows high number of writes in polar WOM codes, is that on each write, the distribution of the number of written cells is close to binomial. Thus, for large N, the number of programmed cells on each write is concentrated and can be bounded with some specified value with high probability.

We use this property of polar WOM codes for our construction in a slightly different manner. Instead of looking at the concentration property as bounding the maximal number of programmed cells, we use it to bound the deviation of the number of non-programmed cells from the constant number we wish to write, $z_i$. Now, we know that with high probability, the number of non-programmed cells will be close to $z_i$. Once we have this property, we know that in most cases, after using the polar WOM codes, flipping a small number of cells will result in a binary word with exactly $z_i$ zeros.

So our technique is to flip a small number of cells in order to get a word with the desired weight, and store the indices of the flipped cells in some additional redundancy cells. We will later show that we can choose the number of redundancy cells such that with high probability they will be sufficient to accommodate the storage of all flipped cells, while the asymptotic rate of the code will not be affected.

While the number of redundancy cells can be made small, we still keep them as part of the cells in the multipermutation. That is, we still want to have a predefined number of cells in each rank. We do this in the following manner. In rank i, for each index of a flipped cell we want to store, we assign n' redundancy cells, where half of them are in rank i, and the other half in rank i+1.

Let us now describe the construction formally. To simplify the notation and representation of the construction we dropped all floors and ceilings, so some of the values are not necessarily integers as required. This may encounter a small lost in the rate of the code, however this lost will be minor and thus can be neglected.

First we state a useful assumption in our construction for the existence of WOM codes with the properties we described above.

Assumption 1. For any 0<p<1 and 0<ϵ<p/2, there exists a binary WOM code $\mathcal{C}_{p,\epsilon}$ with encoding function $f_{p,\epsilon}$ and decoding function $g_{p,\epsilon}$ such that given a cell-state vector c of N cells and weight w(c)=(1−p)N, it is possible to write a binary vector d of (p−δ)N bits, for δ arbitrarily small, such that the updated cell-state vector $c' = f_{p,s}$ (c, d) satisfies:

1) $(1-p/2-\epsilon)N \leq w(c') \leq (1-p/2+\epsilon)N.$
2) $g_{p,s}(c') = d.$
3) $c \leq c'.$ The encoder $f_{p,s}(d)$ can have a small probability that the conditions doesn't meet, in which case we say that the encoding fails.

In Section VI. C, we describe how to construct WOM codes, based on polar codes, that satisfy the conditions of $\mathcal{C}_{p,\epsilon}$ in Assumption 1. See, for example, D. Burshtein and A. Strugatski, "Polar write once memory codes," in *Proceedings of the* 2012 *IEEE International Symposium on Information Theory, ISIT*2012, Cambridge, Mass., USA, July 2012, pp. 1982-1986. However, while these polar WOM codes are good for our construction, they suffer a small probability of encoding failure, i.e., they don't work in the worst case for any sequence of writes. In this section, for the simplicity of the presentation, we do not consider the case of this encoding failure but will sketch the necessary modifications to adjust these codes to our construction in VI. D. We are now ready to present our construction.

Construction 1. Let m, z, N be positive integers such that $N=mz$. Let $p=2z/N$, $0<\epsilon<p/2$, and $\mathcal{C}_{p,\epsilon}$ is the code from Assumption 1 with encoding function $f_{p,\epsilon}$ and decoding function $g_{p,\epsilon}$. Let $N'=N$ m$\epsilon$Nn'(the value of n' will be explained later). The first N cells are called the information cells and are denoted by $c=(c_1, \ldots, c_N)$. The last $r=m\epsilon$Nn' cells are called the redundancy cells and are partitioned into m$\epsilon$N vectors $p_{k,j}$ for $1\le k\le m-1, 1\le j\le\epsilon N$, each of n' bits. We assume that there is a function $h:\{1, 2, \ldots, N\}\to\{0,1\}^{n'}$ which receives an integer between zero and N and returns a balanced vector of length n'. h can be implemented, where in both cases $\log N<n'<2 \log N$. See, for example, *The Art of Computer Programming Volume 4, Fascicle 3*. Addison Wesley, 2005 and D. E. Knuth, "Efficient balanced codes," *IEEE Trans. on Inform. Theory*, vol. 32, no. 1, pp. 51-53, 1986. We also assume that this function has an inverse function $h^{-1}:\text{lm}(h)\to\{1, 2, \ldots, N\}$.

An (N',q,T,D,Z) rank-modulation rewriting code $\mathcal{C}$ is defined according to the following encoding function f and decoding function g. The number of messages on each write is $D=2^{(2z-\delta N)(m-1)}$ and each message will be given as $m-1$ binary vectors, each of length $2z-\delta N$ bits. The number of rewrites satisfies $T=q-m+1$ and $Z=N'/m=z+\epsilon Nn'$.

On the encoding and decoding functions, on each write we have the following assumptions:

1) The information cells vector c and the redundancy cells vector r are multipermutations with m consecutive levels such that the number of cells in each level is the same. We let $l_{min}$ be the minimum cell level and $l_{max}$ be the maximum level (note that $l_{max}-l_{min}=m-1$).

2) We let $\sigma_{c,z}$ the multipermutation derived from the information cells vector. For $1\le i\le m$, let $S_i=\sigma_{c,z}^{-1}(i)$ (note that $|S_i|=z$).

3) There are $\epsilon N(m-1)$ auxiliary variables, called index variables and are denoted by $l_{k,j}$ for $1\le k\le m-1, 1\le j\le\epsilon N$. These index variables will be stored in the redundancy cells and they will indicate the information cells that their levels was intentionally changed during the encoding process.

Encoding Function $f(c, p, d')=(c',p')$: Let c be the current information cells vector, $p=(p_{1,1}, \ldots, p_{m,\epsilon N})$ be the current redundancy cells vector, and $d=(d_1, \ldots, d_{m-1})$ be the information vector, where each $d_r$ is a vector of $(p-\delta)N=2z-\delta N$ bits. The new updated information cells vector $c'=(c_1, \ldots, c_{N'})$ is determined as follows. Let $S_1$, be the set $S'_1=S_1$.

Encoding of the k-th rank, $1\le k\le m-1$:
1) Let $V_k=(v_{k,1}, \ldots, v_{k,N})\in\{0,1\}^N$ be the vector defined as follows: $v_{k,i}=0$ if and only if $i\in S'_k\cup S_{k+1}$.
2) Let $u_k=f_{p,s}(v_k, d_k)$. (Note that $u_k$ satisfies
 a) $(1-p/2-\epsilon)N\ge w(u_k)\le(1-p/2+\epsilon)N'$
 b) $g_{p,s}(u_k)=d_k$,
 c) $v_k\le u_k$.)
3) Let $w_k=w(u_k)-(1-p/2)N(|w_k|\le\epsilon N)$, and let $i_1, \ldots, i_{|w_k|}$ be the first $|w_k|$ indices in $S'_k\cup S_{k+1}$ whose value in $u_k$ is equal to $(\text{sign}(w_k)+1)/2$. The vector $u'_k$ is defined to be $u'_{k,i_j}=1-u_{k,i_j}$ for $1\le j\le|w_k|$ and for all other indices $u'_{k,i}=u_{k,i}$ (note that $w(u'_k)=(1-p/2)N$). Set the indices $I_{k,j}=$ for $1\le j\le|w_k|$ and for $|w_k|+1\le j\le\epsilon N$, $I_{k,j}=0$.
4) Let $S_k^*=\{i|u'_{k,i}=0\}$ and $S'_{k+i}=(S'_k\cup S_{k+1})\setminus S_k^*$. For every $i\in S^*_k$, set $c'_i=l_{min}+k$.

Finally, for every $i\in S_m'$, set $(c'_i)=l_{max}+1$.

The new redundancy cells vector $p'=(p'_{1,1}, \ldots, p'_{m,\epsilon N})$ is determined as follows to store the $(m-1)\epsilon n$ indices. For $1\le k\le m-1, 1\le j\le\epsilon N$, let $$p'_{k,j}=(l_{min}+k)\cdot 1+h(I_{k,j}).$$

Finally, for $1\le j\le\epsilon n$ $p'_{m,j}=p_{m,j}+1$

Decoding Function $g(c, p)=d'$: Let $c=c_1, \ldots, c_N$ be the information cells vector and $p=(p_{1,1}, \ldots, p_{m,zN})$ be the redundancy cells vectors. The information vector $d'=(d'_1, \ldots, d'_{m-1})$ is decoded as follows.

First the indices $I_{k,j}$ for $1\le k\le m-1, 1\le j\le\epsilon N$, are decoded to be $$I_{k,j}=h^{-1}(p_{k,j}-(l_{min}+k-1)\cdot 1).$$

Decoding of the k-th rank, $1\le k\le m-1$:
1) Let $\hat{u}'_k=(u_{k,1}, \ldots, u_{k,N})\in\{0,1\}^N$ be the vector defined to be $\hat{u}'_{k,i}=0$ if and only if $i\in S_k$.
2) The vector $\hat{u}_k$ defined as follows. For all $1\le j\le\epsilon N$, if $I_{k,j}\ne 0$ then $\hat{u}_{k,I_{k,j}}=1-\hat{u}_{k,I_{k,j}}$ and for all other indices i, $\hat{u}_{k,i}=u'_{k,i}$
3. $(d'_k=g_{p,s}(\hat{u}_k))$.

It is possible to use the proposed rewrite codes with a different trade-off between the rate and the number of writes. In every write, the rewrite codes increase the value of the highest level among the cells by a single level, and allow a rate of 2 bits/cell. Instead, the codes can be used such that the value of the highest cell increases by c levels in each write, with a rate of $(c+1)\log 2(c+1)-c\log 2(c)$ bits/cell. To do that, we need to replace the set $S_{\{k+1\}}$ in steps 1,3 and 4 of the encoding of the k-th rank, with the union of the sets $S_{\{k+1\}}, S_{\{k+2\}}, \ldots, S_{\{k+c\}}$. We prove the correctness of Construction 1 in the next lemmas. We note that on the first write all the cells are in level zero and thus any multipermutation of m consecutive levels between 0 and $m-1$ such that the number of cells in each level is z will be written in the information cells. We also assume that the redundancy cells will be written in a similar way to keep the multipermutation property of these cells. This will be addressed in the next lemma.

Lemma 1. For $t=1, \ldots, T$, after the t-th write, the redundancy cells vector is a multipermutation of m$\epsilon$Nn' cells with $\epsilon$Nn' cells in each of the m consecutive levels: $l_{min,t}=t-1, \ldots, l_{max,t}=t+m-2$. Furthermore, for 1 km, 1j$\epsilon$N, half of the cells in $p_{k,j}$ are in level $l_{min,t}+k-1$ and the other half in level $l_{min,t}+(k \bmod m)$.

Proof. On the first write, there is no restriction on the index variables and thus we can simply write the redundancy cells in a way that they will satisfy this property. For all subsequent writes, this property is easily verified for all redundancy cells vectors since the output of the function $h(I_{k,j})$ is a balanced binary vector. Note that one purpose of the redundancy cells vectors are $p_{m,1}, \ldots, p_{m,\epsilon N}$, is to keep all the redundancy cells as a multipermutation with the same number of cells in each level. On the first write each of these $\epsilon n$ vectors is written as a vector where n'/2 cells have the value zeros and the other n'/2 cells have the value $m-1$. On each following write, each of these cells is incremented by one level which preserves the balanced multipermutation property of all the redundancy cells.

It is verifiable that the decoded value of every index variable is the same as the one stored during the encoding function. We note here that the index variables could be stored more efficiently, however this will not be significant in the rate analysis of the code. Hence, we tried to keep the redundancy part of the code as simple as possible.

Next, we prove similar properties for the information cells.
Next, we prove similar properties for the information cells.

Lemma 2. Assume the information cells vector c is a multipermutation with m consecutive levels, between and $l_{min}$ and $l_{max}=l_{min}+m-1$ such that the number of cells in each level is z. Then, for any information vector $d=(d_1, \ldots, d_{m-1})$ the resulting updated information cells c' from $(c', p')=f(c,p,d)$ satisfies this property as well between the levels $l_{min}+1$ and $l_{max}+1$.

Proof. For every $1\le k\le m-1$, $w(v_k)=(1-p)N$ and $w(u'_k)=(1-p/2)N$. Hence, $|S^*_k|=Np/2=z$ and so exactly z cells are programmed to level $l_{min}+k$. Furthermore, $|S'_m|=z$ and thus exactly z cells are programmed to level $l_{max}+1$. This proves that the information cells vector forms a multipermutation of m levels between $l_{min}+1$ and $l_{max}+1$ and the number of cells in each level is z.

Lemma 3. On each write the following holds $g(f(c,p,d))=d$

Proof. For $k=1, \ldots, m-1$, in the encoding function, the cells which were programmed to have the k-th rank are the ones having value zero according to the vector $u'_k$. Similarly, the vector $\hat{u}'_k$ was defined to have the value zero if and only if the corresponding cell is in level k. Therefore, we have that $\hat{u}'_k = u'_k$. Since the index variables are correctly decoded by the redundancy cells, we also have that $\hat{u}_k = u_k$. Finally, we get that $$d'_k = g_{p,s}(\hat{u}_k) = g_{p,s}(u_k) = d_k,$$

and together we conclude that $g(f(c,p,d))=d$.

Theorem 1. The code $\mathcal{C}$ from Construction 1 is an (N',q,T,D,Z) rank-modulation rewriting code, where N'=N, $D=2^{(2z-\delta N(m-1))}$, $T=q-m+1$, and $Z=N'/m$ Proof. It is verifiable that for all (c,p,d), $(c,p) \leq (c,g,d)$, and for all $(c_1,p_1),(c_2,p_2) \in Q_z$ such that $\sigma_{(c_1,p_1)_z} = \sigma_{(c_2,p_2)_z}$ we have that $g(c_1,p_1)=g(c_2,p_2)$. According to Lemma 3, we have that $g(f(c,p,d))=d$. On the first write the maximum level is m-1 and according to Lemma 1 and Lemma 2, on each subsequent write the maximum level increases by one level. Hence, the code supports any sequence of $T=q-m+1$ writes.

In order to complete our construction of rank-modulation rewriting codes, we are left with presenting WOM codes which satisfy the conditions of Assumption 1. This will be the topic of the next section.

C. Polar WOM Codes

In this section we describe the recently proposed polar WOM codes and show how they are used for the implementation of the codes in Assumption 1. Polar WOM codes were proposed in order to write multiple times over a WOM. See, for example, D. Burshtein and A. Strugatski, "Polar write once memory codes," in *Proceedings of the 2012 IEEE International Symposium on Information Theory, ISIT2012*, Cambridge, Mass., USA, July 2012, pp. 1982-1986. In the following, we briefly describe the construction of polar WOM codes in order to show the modifications we introduce in these codes to satisfy the conditions of Assumption 1 and to achieve high sum-rate.

We first start with a short overview on polar codes and their usage to lossy source coding as they serve the basis to the construction of polar WOM codes. For more details, see D. Burshtein and A. Strugatski, "Polar write once memory codes," in *Proceedings of the 2012 IEEE International Symposium on Information Theory, ISIT2012*, Cambridge, Mass., USA, July 2012, pp. 1982-1986. Polar codes were first introduced by Arikan and were proved to achieve the symmetric capacity of an arbitrary binary-input channel. See, for example, E. Arikan, "Channel polarization: A method for constructing capacity achieving codes for symmetric binary-input memoryless channels," IEEE Trans. on Inform. Theory, vol. 55, no. 7, pp. 3051-3073, July 2009. Let $$G_2 = \begin{pmatrix} 1 & 0 \\ 1 & 1 \end{pmatrix},$$

$G_2 \otimes^n$ be is its n-th Kronecker product, and $N'=2^n$. Assume the data is transmitted over a memoryless binary-input channel with transition probability $W(y|x)$. The information message $n \in \{0,1\}^N$ is first encoded to be the vector $x=uG_2\otimes^n$.

Then x is transmitted over the channel and the channel output word is y. The main idea of polar codes is to define N sub-channels $$W_N^{(i)}(y, u_0^{i-1} | u_i) = P(y, u_0^{i-1} | u_i) = \frac{1}{2^{N-1}} \sum_{u_{i+1}^{N-1}} W(y|u).$$

where $u_i^j$, for $0 \leq i < j \leq N-1$, denotes the subvector $(u_i, \ldots, u_j)$.

Let I(W) denote the symmetric capacity of the channel W and $Z(W_N^{(i)})$ be the Bhattacharyya parameter of the sub-channels $W_N^{(i)}$, defined by $$Z(W_N^{(i)}) = \Sigma_{y \in \mathcal{Y}} \sqrt{W_N^{(i)}(y|0) W_N^{(i)}(y|1)}.$$

It was shown that for N large enough, approximately I(W) of the sub-channels satisfy that $Z(W_N^{(i)}) < 2^{-N^\beta}$ for any $0 < \beta < \frac{1}{2}$. See, for example, E. Arikan and E. Telatar, "On the rate of channel polarization," in *Proceedings of the IEEE International Symposium on Information Theory Workshop (ISIT)*, June 2009, pp. 1493-1495 and E. Arikan, "Channel polarization: A method for constructing capacity achieving codes for symmetric binary-input memoryless channels," IEEE Trans. on Inform. Theory, vol. 55, no. 7, pp. 3051-3073, July 2009. Accordingly, for a code rate R, a set F is defined, comprising of the N(1-R) sub-channels with the highest $Z(W_N^{(i)})$, and denoted as the frozen set. Then, the information is transmitted on the remaining NR sub-channels, while the input on the sub-channels in F is fixed to be some frozen vector $u_F$ (the elements of the vector u in the set F). The encoder transmits the word $x=uG_2 \otimes^n$ and the information u is decoded using the successive cancellation (SC) scheme and by the information of the frozen vector $u_F$. Finally, it was shown that asymptotically, if R<I(W), then it is possible to communicate reliably with encoding and decoding complexities of O(N log N).

It was shown how to use polar codes for lossy source coding. In this case, the frozen set F is defined by $$F = \{i \in \{0, \ldots, N-1\} : Z(W_N^{(i)}) \geq 1 - 2\delta_n^2\}, \quad (1)$$

where $\delta_N = 2^{-N^\beta}/(2N)$.

See, for example, S. B. Korada and R. Urbanke, "Polar codes are optimal for lossy source coding," IEEE Trans. on Inform. Theory, vol. 56, no. 4, pp. 1751-1768, April 2010. The encoder compresses the source vector y by the following SC scheme. For $i=0, 1, \ldots, N-1$, let $\hat{u}_i = u_i$ if $i \in F$. Otherwise, let $$\hat{u}_i = \begin{cases} 0 & w \cdot pL_N^{(i)}/(L_N^{(i)}+1) \\ 1 & w \cdot p1/(L_N^{(i)}+1), \end{cases}$$

where $$L_N^{(i)} = L_N^{(i)}(y, u_0^{i-1}) = \frac{W_N^{(i)}(y, u_0^{i-1} | u_i = 0)}{W_N^{(i)}(y, u_0^{i-1} | u_i = 1)}.$$

The decoder, in turn, let $x(y)=uG_2\otimes^n$ be the approximating source codeword. It has been shown that for any compression rate in the rate distortion region (where the distortion is denoted by D), x(y) satisfies $Ed(x(y),y)/N \leq D + 0(2^{-N^\beta})$ for any $0<\beta<\frac{1}{2}$ and N sufficiently large. See, for example, S. B. Korada and R. Urbanke, "Polar codes are optimal for lossy source coding," IEEE Trans. on Inform. Theory, vol. 56, no. 4, pp. 1751-1768, April 2010. The result on the average case was further improved to show that $|d(x(y),y)/N-D|$ can be made arbitrary small with probability approaching 1 for N large enough.

These results allowed the construction of multiple writes WOM codes. See, for example, D. Burshtein and A. Strugatski, "Polar write once memory codes," in *Proceedings of the 2012 IEEE International Symposium on Information Theory, ISIT*2012, Cambridge, Mass., USA, July 2012, pp. 1982-1986. Let T be number of writes to the WOM. For each write cycle, $0 \le t \le T$, let $0 \le \epsilon_t \le \frac{1}{2}$ be an estimate of the fraction of unprogrammed cells that will be written on this write, where $\epsilon_0=0$ and $\epsilon_T=\frac{1}{2}$. In addition, let $$\alpha_t \triangleq \Pi_{j=0}^{t}(1-\epsilon_j).$$

Note that the values of $\epsilon_0, \epsilon_1, \ldots, \epsilon_T$ come from the expression of the capacity region of WOM, given by $$C_T = \{(\mathcal{R}_1, \ldots, \mathcal{R}_T) | \mathcal{R}_1 < H(\epsilon_1),$$
$$\mathcal{R}_2 < (1-\epsilon_1)H(\epsilon_2), \ldots, \mathcal{R}_{T-1} < \alpha_{T-2} H(\epsilon_{T-1}),$$
$$\mathcal{R}_T < \alpha_{T-1},$$

where $0 \le \epsilon_1, \ldots, \epsilon_{T-1} \le \frac{1}{2}$ and H denotes the binary entropy function}. See, for example, F.-W. Fu and A. J. Han Vinck, "On the capacity of generalized write-once memory with state transitions described by an arbitrary directed acyclic graph," IEEE Trans. on Inform. Theory, vol. 45, no. 1, pp. 308-313, January 1999 and C. D. Heegard, "On the capacity of permanent memory," IEEE Trans. on Inform. Theory, vol. IT-31, no. 1, pp. 34-42, January 1985.

For the t-th write, $1 \le t \le T$, a test channel is considered with binary input X and an output (S, V), where S and V are binary variables as well. The probability transition function of the t-th channel is defined by, $$P_t((S, V) = (s, v) | X = x) = f(s, x \oplus v),$$

where $$f(s, b) = \begin{cases} \alpha_{t-1}(1-\epsilon_t) & \text{if } s=0, b=0, \\ \alpha_{t-1}\epsilon_t & \text{if } s=0, b=1, \\ (1-\alpha_{t-1}) & \text{if } s=1, b=0, \\ 0 & \text{if } s=1, b=1. \end{cases}$$

For the t-th test channel, a polar code is designed with block length N with a frozen set as in (1). The polar code is used for lossy source coding, with rate $$R_t = \alpha_{t-1}H(\epsilon_t) - \epsilon_t, \quad (2)$$

where $\delta_t$ is arbitrarily small for N sufficiently large.

The t-th encoder uses a common randomness source, also called dither, denoted by $g_t$, sampled from an N dimensional uniformly distributed random binary vector, and known both to the encoder and to the decoder. Let $s_t$ represents the cell-state vector before encoding on the t-th write, and let $v_t = s_t + g_t$. Finally, let $y_{t,i} = (s_{t,i}, v_{t,i})$ and $y_t = (y_1, y_2, \ldots, y_N)$.

The encoder compresses the vector $y_t$ using the t-th polar code with $u_{F_t} = \alpha_t$, where $\alpha_t$ is the information message on the t-th write. The encoder decompresses the resulting vector $u_t$ into $x_t = u_t G_2^{\otimes n}$ and sets $\hat{s}_t = x_t + g_t$ to be the new cell-state vector.

The decoder first calculates $x_k = \hat{s}_t + g_t$, and then estimates $\hat{\alpha}_t = (x(G_2^{\otimes n})^{-1})_{F_t}$, where $(z)_{F_t}$ denotes the elements of the vector z in the set $F_t$. A few slight modifications for the construction have been described, for the sake of the proof. See, for example, D. Burshtein and A. Strugatski, "Polar write once memory codes," in *Proceedings of the 2012 IEEE International Symposium on Information Theory, ISIT*2012, Cambridge, Mass., USA, July 2012, pp. 1982-1986. The following theorem summarizes the results of the polar WOM codes.

Theorem 2. Consider an arbitrary information sequence $\alpha_1, \ldots, \alpha_T$ with rates $R_1, \ldots, R_T$ that are inside the capacity region $C_T$ of the binary WOM. For any $0<\beta<\frac{1}{2}$ and N sufficiently large, the polar WOM code described above can be used to write this sequence reliably over the WOM w.p. at least $1-2^{-N^\beta}$ in encoding and decoding complexities O(N log N).

The Theorem is based on the fact that in every write, the WOM property is held, and in addition, the number of written cells in bounded. We bring this result in the following Lemma, that we then use in order to prove Assumption 1. See, for example, D. Burshtein and A. Strugatski, "Polar write once memory codes," in *Proceedings of the 2012 IEEE International Symposium on Information Theory, ISIT*2012, Cambridge, Mass., USA, July 2012, pp. 1982-1986.

Lemma 4. Consider a polar code designed for the t-th test channel. The code has rate $R_t$ defined in (2), a frozen set of sub-channels $F_t$, and some frozen vector $u_{F_t}$ which is uniformly distributed over all $|F_t|$ dimensional binary vectors. The code is used to encode a random vector (s, v) drawn by i.i.d. sampling from the distribution $P(s,v) = P(s,v|x=0)/2 + P(s,v|x=1)/2$ using the SC encoder. Denote by x the encoded codeword. Then for any $\delta>0, 0<\delta<\frac{1}{2}$ and N sufficiently large, the following holds w.p. $1-2^{-N^\beta}$, 1. $|\{k: s_k=0 \text{ and } x_k \oplus v_k=1\}| < (\epsilon_t \alpha_{t-1} + \delta)N$,
2. $\{k: s_k=1 \text{ and } x_k \oplus v_k=1\} = \emptyset$.

Based on this Lemma, we propose the following construction for the code $\mathcal{C}_{p,\epsilon}$ of Assumption 1. Assume that a polar WOM code is applied with T=2 and $\epsilon_1=1-p$, that is, $\alpha_1=p$ and $\epsilon_2=\frac{1}{2}$. Furthermore, assume that (1-p)N cells are being written in the first write. Connecting the notations of Assumption 1 to those of the polar WOM code, note that c=s and $c'=x \oplus v \oplus s$. Now, $\mathcal{C}_{p,s} = \{f_{p,s}, g_{p,s}\}$ is set to be the encoding and decoding function of the second write of the polar WOM code. In the following Lemma we prove that this code has the properties of Assumption 1.

Lemma 5. The code $\mathcal{C}_{p,s}$ described above satisfies the three properties of Assumption 1 w.p. at least $1-2^{-N^\beta}$.

Proof: First, by Lemma 4, the rate of the code is p−δ, as stated in Assumption 1. Next, note that the second property (the correctness of the decoded value) follows directly from the construction of the WOM code. The third property, $c \le c'$, follows from the second property of Lemma 4.

For the first property of Assumption 1, we write the first property of Lemma 4 in the language of Assumption 1, and get that for any $\epsilon>0$, w.p. $1-2^{-N^\beta}$, $$w(c') - w(c) < (p/2 + \epsilon)N,$$

In addition, by the proof of Lemma 4 we can also verify that, $$w(c') - w(c) > (p/2 - \epsilon)N,$$

and the property is met, completing the proof

5 Analysis of the Construction

After we showed how to use polar WOM codes in our construction, we are now left with analyzing the sum-rate of Construction 1.

By Theorem 1 and remembering that N=mz and n'≤log N=log(mZ), we get that the instantaneous rate of the code is given by $$R_{inst} = (1/N') \log_2 D \quad (3)$$
$$= \frac{(2z - \delta N)(m-1)}{N + mzNn'}$$

-continued $$= 2 \cdot \frac{m-1}{m} \cdot \frac{z - \delta zm/2}{z} \cdot \frac{1}{1+smn'}$$

$$< 2 \cdot \frac{m-1}{m} \cdot (1-\delta m/2) \cdot \frac{1}{1+\varepsilon m\log(mz)}$$

Note that by Assumption 1, δ is a constant, which does not depend on the value of N. However, p is also a constant in this assumption, and since Construction 1 uses p=2/m, δ can be a function of m as well. Therefore, we can choose for example δ=2/m² in order to let the expression δm/2 vanish when m is large enough. Similarly, ε can be also taken to be a function of m. However, it cannot be a function of z, and therefore (3) shows that when z is large, unfortunately we get that $\mathcal{R}_{inst}$ approaches zero. In order to solve this difficulty, we extend the result in [4, Lemma 1] for the case that ε is a function of N.

Lemma 6. For any $$\varepsilon > N^{\frac{\beta-1}{2}},$$

0<β<½ and N sufficiently large, the properties of Assumption 1 hold w.p. at least $1-2^{-N^\beta}$.

Proof: The case of constant ε is proven in section VI. C. The proof of this case is based on on the typical distortion of polar lossy source codes. See, for example, D. Burshtein and A. Strugatski, "Polar write once memory codes," in *Proceedings of the* 2012 *IEEE International Symposium on Information Theory, ISIT*2012, Cambridge, Mass., USA, July 2012, pp. 1982-1986. The proof of this Lemma is based on an extension of this result, and therefore, in the following, we present the definitions used for describing the typical distortion result.

Similar to the notation employed in other works, define ε-strong typical sequences x, y, $\epsilon x^N \times y^N$ with respect to the distribution p(x,y) on x×y, and denote it by $A_s^*(N)(X,Y)$, as follows. See, for example, T. Cover and J. Thomas, *Elements of Information Theory, 2nd ed.* New York: Wiley, 2006, pp. 325-326. Let C(a,b|x,y) denote the number of occurrences of the symbols a, b in y. Then $x,y \in A_s^{*(N)}(X,Y)$ if the following two conditions hold. First, for all a, b x×y with p(a, b)>0, |(C(a,b|x,y)/N−p(a,b)|<ε. Second, for all a,b x×y with p(a,b)=0, C(a,b|x,y)=0.

In our case, $x(u) = uG_2^{\otimes n}$, and since $G_2^{\otimes n}$ has a full rank, each vector u corresponds to exactly one vector x(u). We say that u, $y \in A_s^{*(N)}(U,Y)$ if $x(u), y \in A_s^{*(N)}(X,Y)$ with respect to the probability distribution p(x, y)=W(y|x)/2. Let $Q(A_s^{*(N)})$ be the probability that $x(u), y \in A_s^{*(N)}(X,Y)$. In [4, Lemma 1], it is shown that Assumption 1 holds if $x(u), y A_{s/2}^{*(N)}(X, Y)$. Therefore, in order to complete the proof of this Lemma, we need to show that for any $$\varepsilon > 2N^{\frac{\beta-1}{2}},$$

$Q(A_s^{*(N)}) > 1 - 2^{-N^\beta}$.

Define a value β' such that 0<β'<β. By the proof of [4, Theorem 1], it follows that $$Q(A_s^{*(N)}) > 1 - 2^{-N^{\beta'}} - 2e^{2s^2N}.$$

Taking $$\varepsilon > 2N^{\frac{\beta'-1}{2}},$$

we get:

$$Q(A_s^{*(N)}) > 1 - 2^{-N^{\beta'}} - 2e^{-4N^{\beta'}}$$

and therefore, for N sufficiently large, the assumption holds w.p. at least $1 - 2^{-N^\beta}$.

Notice that taking large ε decreases $\mathcal{R}_{inst}$. Therefore, we choose the smallest ε that meets the conditions of Lemma 6 for any 0<β<½, meaning $$\varepsilon = N^{\frac{1/2-1}{2}} = 1/N^{1/4}.$$

In some embodiments, ε may be even smaller, depending on an acceptable trade-off between $\mathcal{R}_{inst}$ and the probability of encoding failure. The properties of Construction 1 are now described.

Theorem 3. We note that the decoding can be done with complexity O(N log N), by performing the decoding of the k ranks in parallel. For T=q−m+1, consider an arbitrary information sequence $\alpha_1, \ldots, \alpha_T$ with rates $\mathcal{R}_{inst}$<2. For any 0<β<½ and q, m and z sufficiently large, the rank modulation rewriting code in Construction 1 can be used to write this information sequence w.p. at least $1-T2^{-N^\beta}$, in encoding and decoding complexities O(mN log N).

Proof: Setting $\varepsilon=1/N^{1/4}$ and δ=2/m², and remembering that n'<2 log N, we get that $$R_{inst} > 2 \cdot (1-1/m)^2 \cdot \frac{1}{1+2zm\log(zm)} =$$

$$2 \cdot (1-1/m)^2 \cdot \frac{1}{1+2z^{-1/4}m^{3/4}\log(zm)} =$$

$$2 \cdot (1-1/m)^2 \cdot \frac{z^{1/4}}{z^{1/4}+2m^{3/4}\log(zm)}$$

Therefore, $\mathcal{R}_{inst}$ can take any value below 2 for large enough m and z, if z/m³ is large enough as well. The probability of writing failure is achieved by the union bound. Each time $f_{p,s}$ is applied, the probability of encoding failure is at most $2^{-N^\beta}$. $f_{p,s}$ is applied m−1 times in each operation of the rank-modulation encoding, and therefore, for large enough N, the rank-modulation encoding is successful w.p. at least $1-2^{-N^\beta}$. Since the rank-modulation encoding is applied T times, the probability of successful write of the whole information sequence is at least $1-T2^{-N^\beta}$.

We prove the encoding and decoding complexities. By Theorem 2, the complexities of $f_{p,s}$ and $g_{p,s}$ are both O(NlogN). In each rank, we also apply h or $h^{-1}$, which can be performed in logarithmic time in N. See, for example, *The Art of computer Programming volume* 4, Fascicle 3. Addison Wesley, 2005 pp. 5-6 and D. E. Knuth, "Efficient balanced codes," *IEEE* Trans. On Inform. Theory, vol. 32, no 1, pp. 51-53, 1986. The functions h and $h^{-1}$ are applied at most εN times on each rank, and therefore they don't affect the complexity. Finally, since $f_{p,s}$ and $g_{p,s}$ are applied for each rank, the encoding and decoding complexities are O(mN log N).

In the rare event of an encoding error, the encoder can take one of two strategies. One option is to use a different dither value. See, for example, D. Burshtein and A. Strugatski, "Polar write once memory codes," in *Proceedings of the 2012 IEEE International Symposium on Information Theory, ISIT2012*, Cambridge, Mass., USA, July 2012, pp. 1982-1986. In this case the decoder can realize the correct dither value, either by direct communication (by using extra storage), or by switching to the next dither value upon detection (e.g., using CRC) a decoding failure.

If the methods for taking a different dither value are too expensive in practice, the encoder can take a different strategy. We bring here the idea of this strategy, without a formal description and analysis. In case of encoding error, the encoder can recalculate the vector $v_k$ in Step 1, of the encoding function of Construction 1. In the new vector $v_k$, $v_{k,i}=0$ if and only if $i \in S'_k \cup S_{k+2}$. This also involves setting $c'_i = 1_{min} + k + 1$ in Step 4 of the decoding for all ranks $1 \le k \le m-1$, and thus reduce the value of T by 1 (in fact, we do not have to increase the level of the cells with ranks below the one that failed, and perhaps take advantage of this gap in the following writes, but for the simplicity of the construction we seek to keep all the ranks to be in m consecutive levels). However, since the event of encoding error is rare, the expected value of T will not be affected by much if q is large enough compared to N. In the case of repeated errors, a different subset os size 2z of $S'_k \cup S_{k+1} \cup S_{k+2}$ could be taken each time until exhaustion. If that wouldn't be enough, $S_{k+3}$ could be added with the cost of an extra write, and so on until a successful encoding occurs.

Figure 15B:
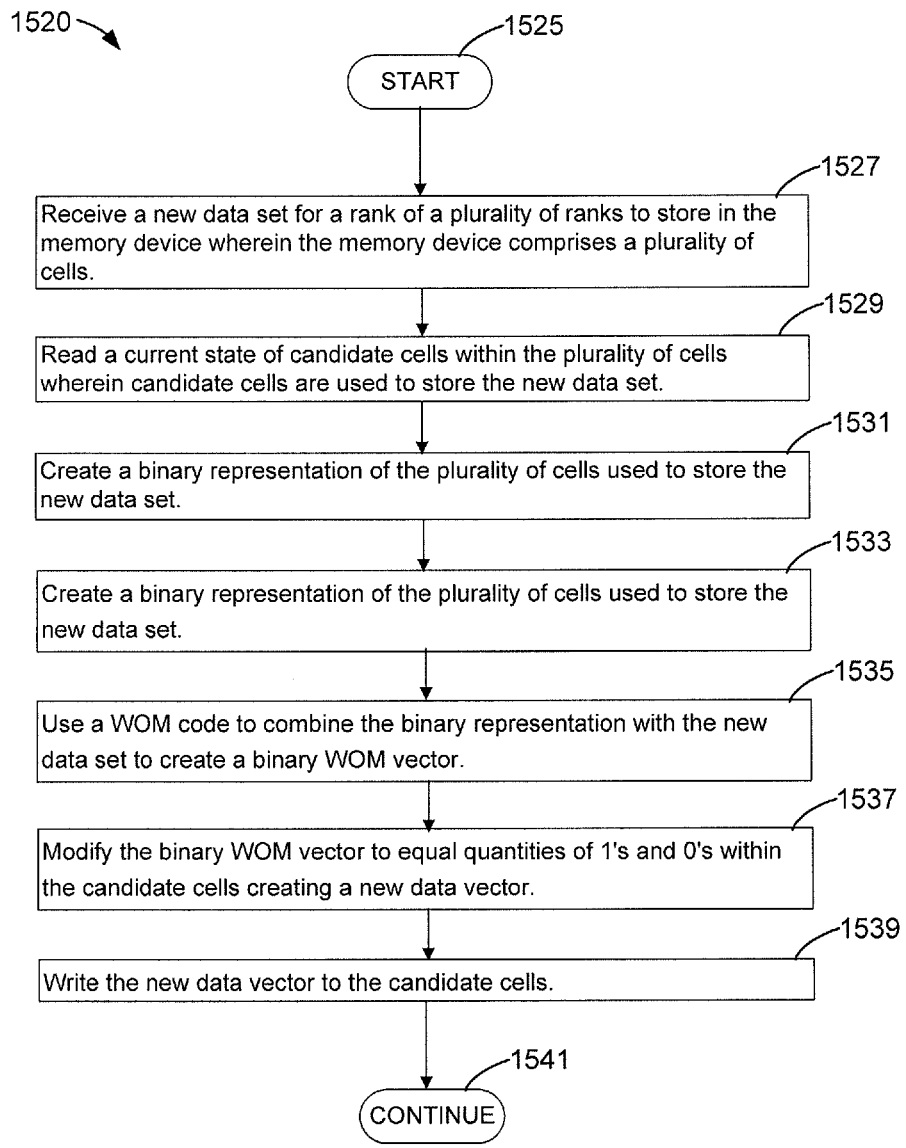
FIG. 15B is a process for operating a data device in accordance with the description herein.

FIG. 15B depicts a process 1520 for operating a data device. The process 1520 may include one or more operations, actions, or functions as illustrated by one or more of blocks 1525, 1527, 1529, 1531, 1533, 1535, 1537, 1539, and 1541. Although illustrated as discrete blocks, various blocks may be divided into additional blocks, combined into fewer blocks, or eliminated, depending on the particular implementation. The process starts with block 1525. In block 1527 a new data set for a rank of a plurality of ranks is received to store in the memory device wherein the memory device comprises a plurality of cells. In block 1529 a current state of candidate cells is read within the plurality of cells wherein candidate cells are used to store the new data set. In block 1531 a binary representation of the plurality of cells is created and used to store the new data set. In block 1533 a binary representation of the plurality of cells is used to store the new data set. In block 1535 a WOM code is used to combine the binary representation with the new data set to create a binary WOM vector. In block 1537 the binary WOM vector is modified to equal quantities of 1's and 0's within the candidate cells creating a new data vector. In block 1539 the new data vector is written to the candidate cells. In block 1541 the process may be continued. In some embodiments the WOM is a Polar WOM. In further embodiments the cost of writing is defined as a maximum level of the plurality of cells after writing the new data vector minus a maximum level of the candidate cells before writing the new data vector. In some embodiments, the cost is one. In further embodiments the method further comprises reading the new data vector from the candidate cells, modifying the new data vector to recreate the binary WOM vector and using a WOM code on the binary WOM vector to separate the binary representation from the data set.

Figure 15C:
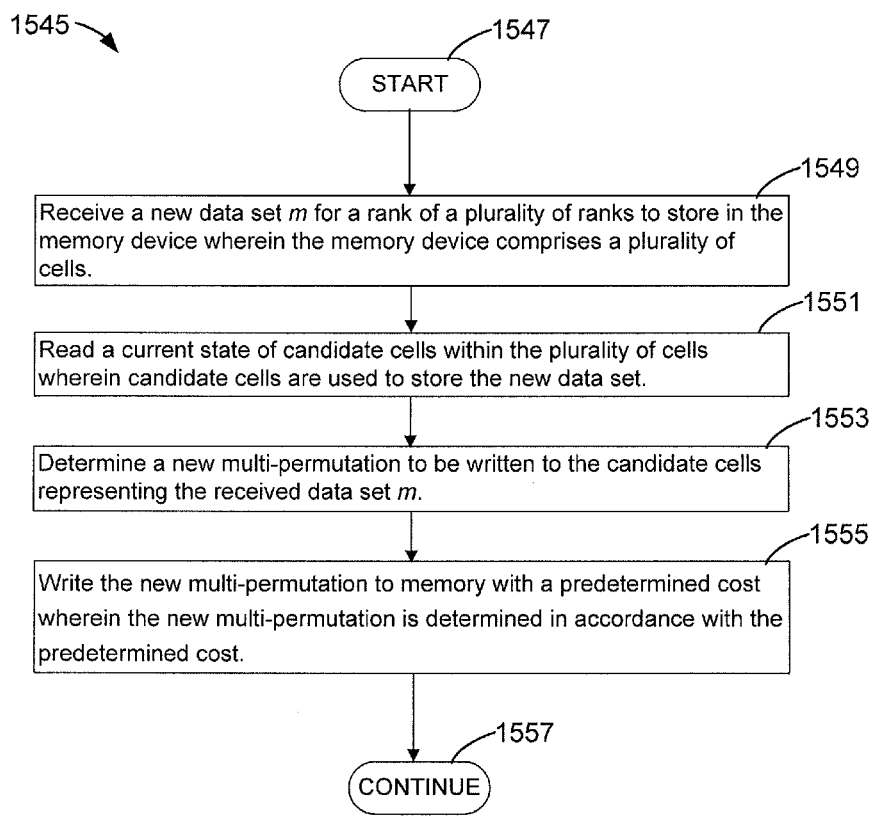
FIG. 15C is a process for operating a data device in accordance with the description herein.

FIG. 15C depicts a process 1545 for operating a data device. The process 1545 may include one or more operations, actions, or functions as illustrated by one or more of blocks 1547, 1549, 1551, 1553, 1555, and 1557. Although illustrated as discrete blocks, various blocks may be divided into additional blocks, combined into fewer blocks, or eliminated, depending on the particular implementation. The process starts with block 1547. In block 1549 a new data set m is received for a rank of a plurality of ranks to store in the memory device wherein the memory device comprises a plurality of cells. In block 1551 a current state of candidate cells is read within the plurality of cells wherein candidate cells are used to store the new data set. In block 1553 a new multi-permutation is determined and is to be written to the candidate cells representing the received data set m. In block 1555 the new multi-permutation is written to memory with a predetermined cost wherein the new multi-permutation is determined in accordance with the predetermined cost. In block 1557 the process may be continued.

Figure 15D:
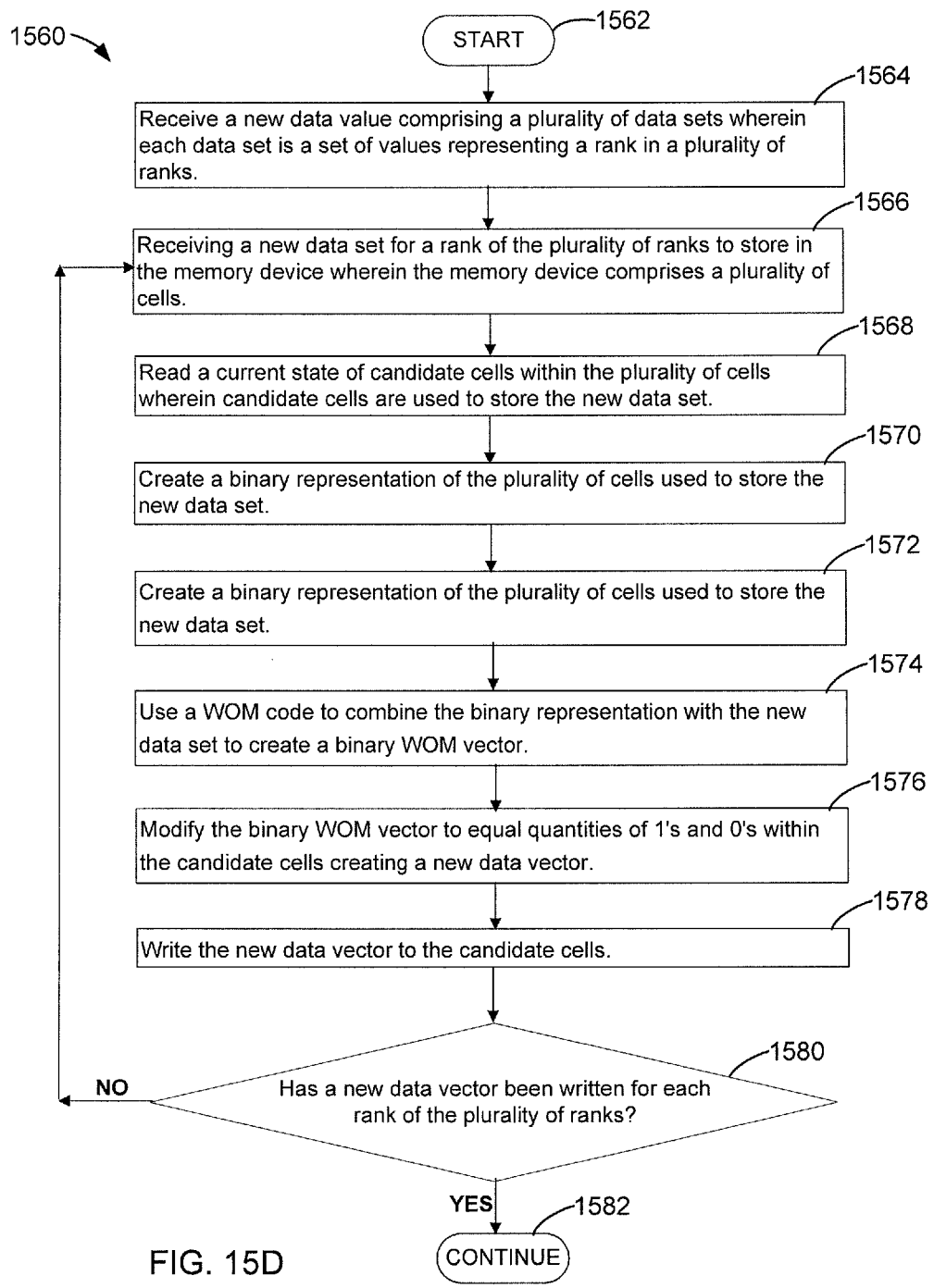
FIG. 15D is a process for operating a data device in accordance with the description herein.

FIG. 15D depicts a process 1560 for operating a data device. The process 1560 may include one or more operations, actions, or functions as illustrated by one or more of blocks 1562, 1564, 1566, 1568, 1570, 1572, 1574, 1576, 1578, and 1580. Although illustrated as discrete blocks, various blocks may be divided into additional blocks, combined into fewer blocks, or eliminated, depending on the particular implementation. The process starts with block 1562. In block 1564 a data value is received comprising a plurality of data sets wherein each data set is a set of values representing a rank in a plurality of ranks. In block 1566 a new data set for a rank of a plurality of ranks is received to store in the memory device wherein the memory device comprises a plurality of cells. In block 1568 a current state of candidate cells is read within the plurality of cells wherein candidate cells are used to store the new data set. In block 1570 a binary representation of the plurality of cells is created and used to store the new data set. In block 1572 a binary representation of the plurality of cells is created an used to store the new data set. In block 1574 a WOM code is used to combine the binary representation with the new data set to create a binary WOM vector. In block 1576 the binary WOM vector is modified to equal quantities of 1's and 0's within the candidate cells creating a new data vector. In block 1578 the new data vector is written to the candidate cells. In block 1580, if a new data vector has been written for each rank of the plurality of ranks the process may continue with block 1582. If all of the data vectors have not been written, then blocks 1566-1578 may be repeated until all the new data vectors have been written.

Figure 15E:
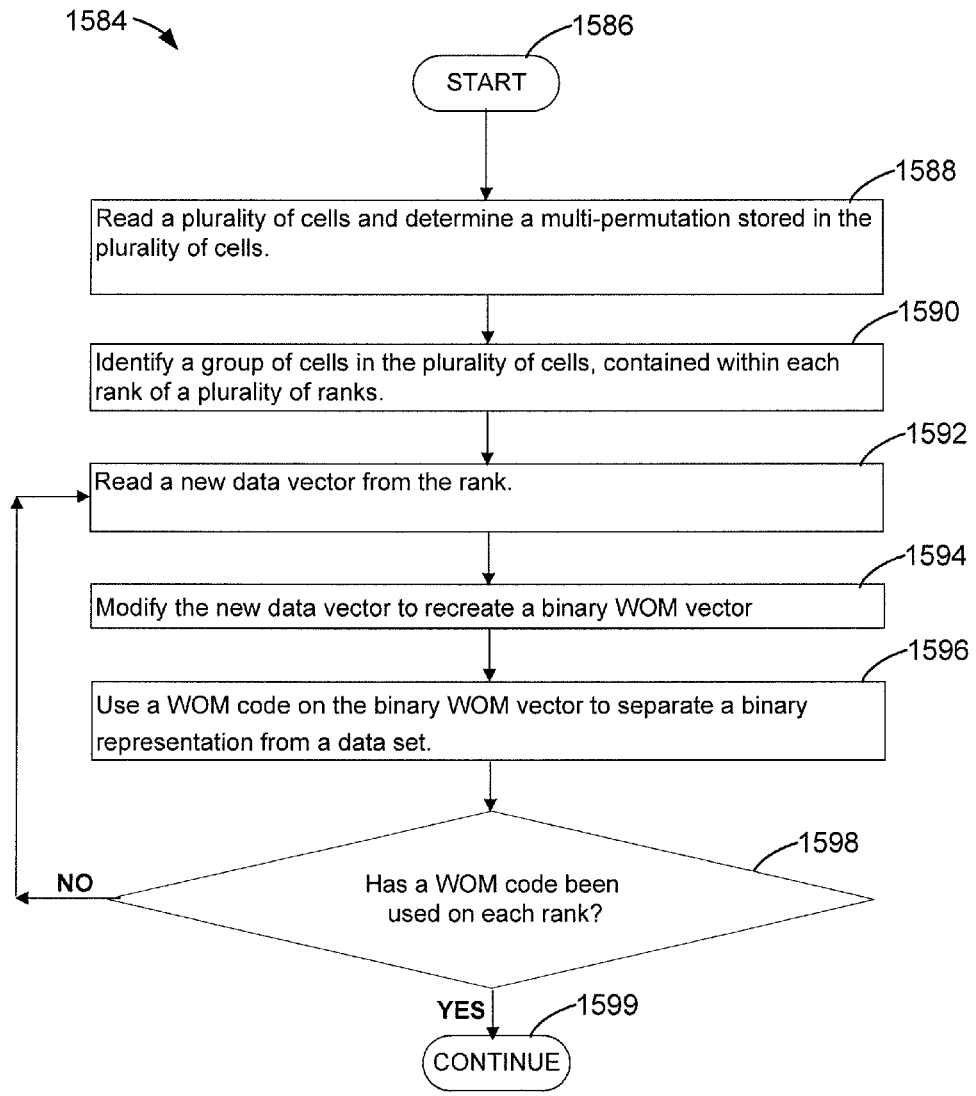
FIG. 15E is a process for operating a data device in accordance with the description herein.

FIG. 15E depicts a process 1584 for operating a data device. The process 1560 may include one or more operations, actions, or functions as illustrated by one or more of blocks 1586-1599. Although illustrated as discrete blocks, various blocks may be divided into additional blocks, combined into fewer blocks, or eliminated, depending on the particular implementation. The process 1560 may include one or more operations, actions, or functions as illustrated by one or more of the blocks. The process starts with block 1586. In block 1588 a plurality of cells are read and a multi-permutation stored in the plurality of cells is determined. In block 1590 a group of cells are identified in the plurality of cells, contained within each rank of a plurality of ranks. In block 1592 a new data vector is read from the rank. In block 1594 the new data vector is modified to recreate a binary WOM vector. In block 1596 a WOM code is used on the binary WOM vector to separate a binary representation from a data set. In block 1598 if a WOM code has been used on each rank the process may continue to block 1599. If a WOM code has not been used on each rank the blocks of 1592 through 1596 may be repeated until a WOM code has been used on each rank.

VI. Example Embodiments

Figure 16:
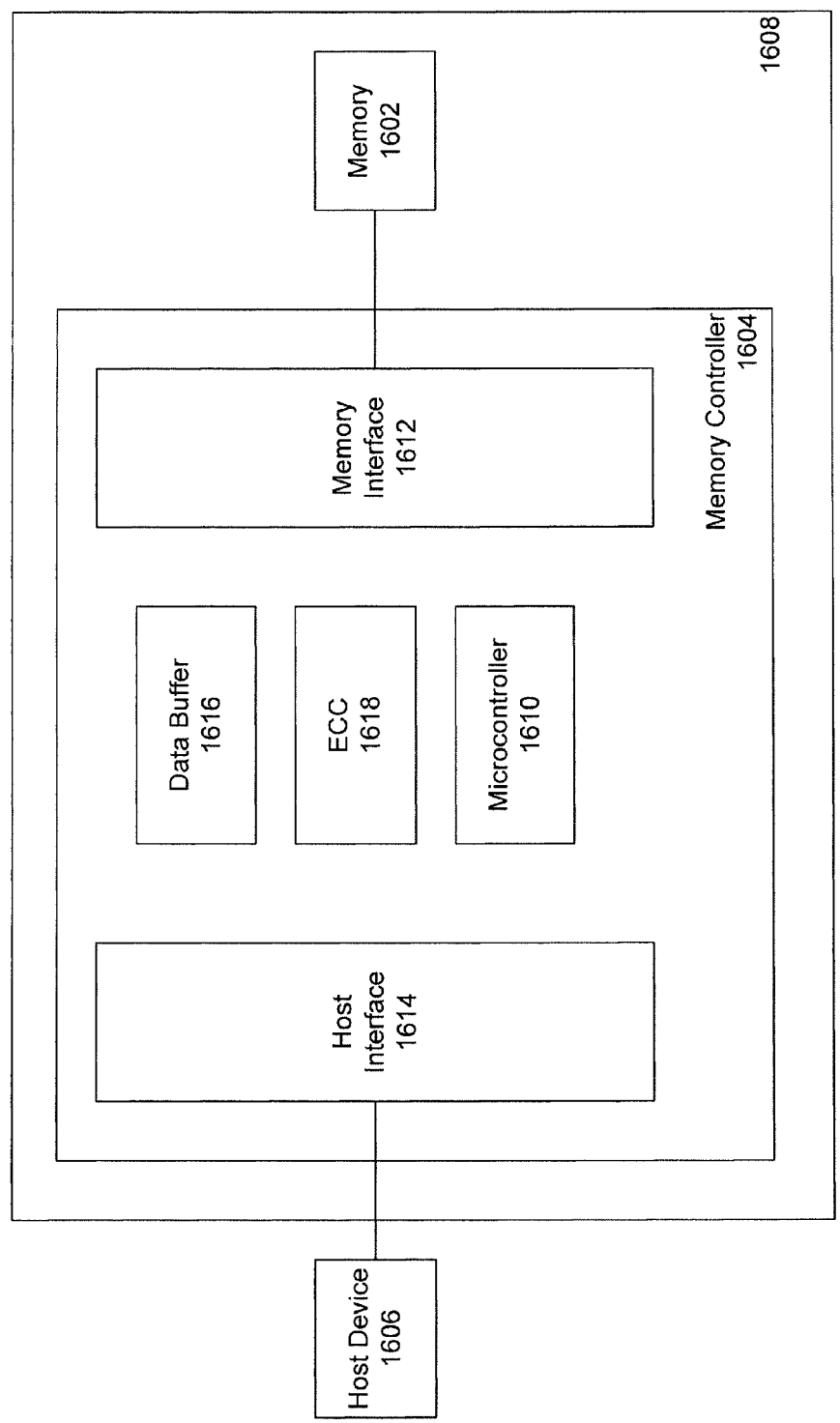
FIG. 16 is an illustration of a memory device constructed in accordance with the present invention.

FIG. 16 is an illustration of one embodiment of a data device constructed in accordance with the present disclosure. FIG. 16 shows a memory 1602 that is accessed by a memory controller 1604 that communicates with a host device 1606, which may all be operatively or communicatively coupled to each other. The memory 1602 is used for storing data that is represented in accordance with a minimum push up, multi-cell or multi-permutation scheme. The memory may be implemented, for example, as a Flash memory having multi-level cells. The memory 1602 and memory controller 1604 together comprise a data storage device 1608 that may be external to the host device or may be integrated with the host device into a single component or system. For example, the data storage device 1608 may comprise a Flash memory device (sometimes referred to as a "thumb drive") that communicates with a host computer 1606 via a USB connection, or the data storage device may comprise a solid state drive (SSD) that stores data for a host computer system. Alternatively or additionally, the data storage device may be integrated with a suitable host device to comprise a single system or component with memory employing a minimum push up, a multi-cell or a multi-permutation scheme, such as a smart phone, network router, MP3 player, or the like.

The memory controller 1604 operates under control of a microcontroller 1610, which manages communications with the memory 1602 via a memory interface 1612 and manages communications with the host device via a host interface 1614. Thus, the memory controller supervises data transfers from the host 1606 to the memory 1602 and from the memory 1602 to the host 1606. The memory controller 1604 also includes a data buffer 1616 in which data values may be temporarily stored for transmission over the data channel controller 1617 between the memory 1602 and the host 1606. The memory controller also includes an Error Correcting code (ECC) block 1618 in which data for the ECC is maintained. For example, the ECC block 1618 may comprise data and program code to perform error correction operations for a minimum push up, a multi-cell or a multi-permutation scheme. Such error correction operations are described, for example, in the U.S. Pat. No. 8,225,180 entitled "Error Correcting Codes for Rank Modulation" by Anxiao Jiang et al. issued Jul. 17, 2012. The ECC block 1618 may contain parameters for the error correction code to be used for the memory 1602, such as programmed operations for translating between received symbols and error-corrected symbols, or the ECC block may contain lookup tables for codewords or other data, or the like. The memory controller 1604 performs the operations described above for decoding data and for encoding data.

The operations described above for operating a data storage device, for reading data from a device, for programming a data storage device, and encoding and decoding, can be carried out by the operations depicted in FIGS. 6, 8A, 8B, 14 and 15 which can be performed by the microcontroller 1610 and associated components of the data storage device 1608. For example, in an implementation of the rank modulation coding scheme in a USB thumb drive, all the components of the data storage device 1608 depicted in FIG. 16 are contained within the USB thumb drive.

Figure 17:
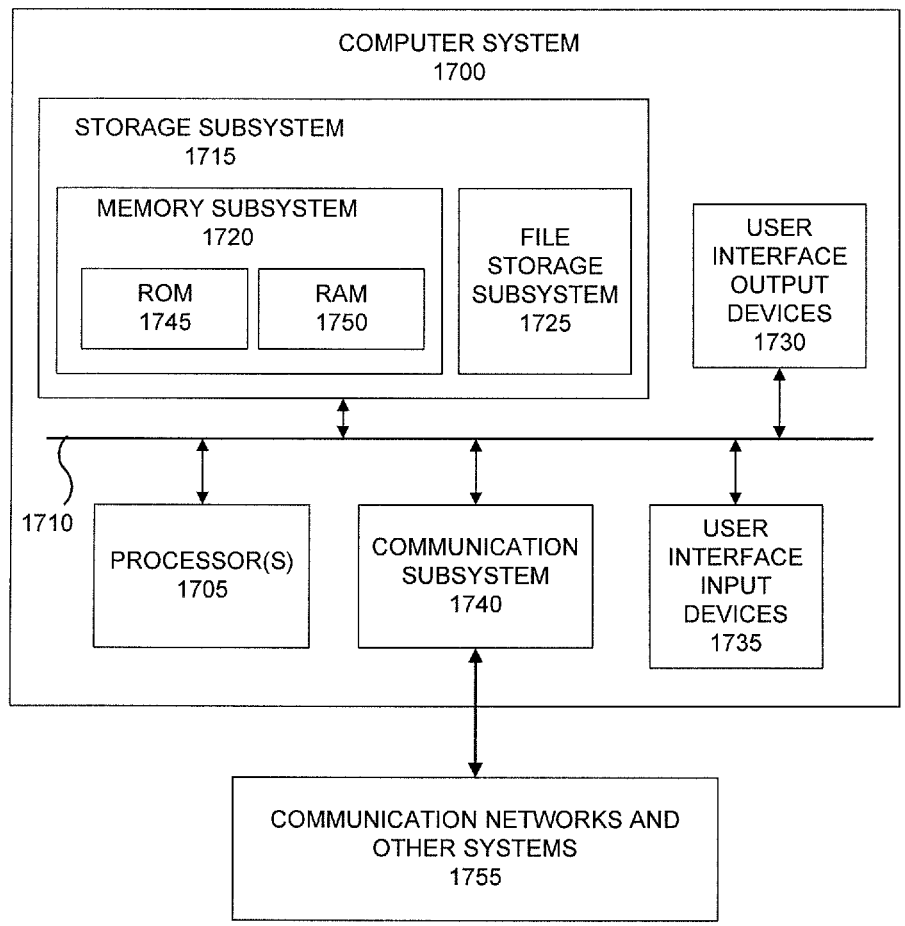
FIG. 17 is a block diagram of a computer apparatus to perform the operations of FIGS. 6, 8A, 8B, 14 and 15 for communicating with a memory device such as depicted in FIG. 16.

The processing components such as the controller 1604 and microcontroller 1610 may be implemented in the form of control logic in software or hardware or a combination of both, and may comprise processors that execute software program instructions from program memory, or as firmware, or the like. The host device 1606 may comprise a computer apparatus. A computer apparatus also may carry out the operations of FIGS. 6, 8A, 8B, 14 and 15. FIG. 17 is a block diagram of a computer apparatus 1700 sufficient to perform as a host device and sufficient to perform the operations of FIGS. 6, 8A, 8B, 14 and 15.

FIG. 17 is a block diagram of a computer system 1700 that may incorporate embodiments of the present disclosure and perform the operations described herein. The computer system 1700 may include one or more processors 1705, a system bus 1710, storage subsystem 1715 that includes a memory subsystem 1720 and a file storage subsystem 1725, user interface output devices 1730, user interface input devices 1735, a communications subsystem 1740, and the like.

In various embodiments, the computer system 1700 may include computer components such as the one or more processors 1705. The file storage subsystem 1725 can include a variety of memory storage devices, such as a read only memory (ROM) 1745 and random access memory (RAM) 1750 in the memory subsystem 1720, and direct access storage devices such as disk drives. As noted, the direct access storage device may comprise a rank modulation data storage device that operates as described herein.

The user interface output devices 1730 can comprise a variety of devices including flat panel displays, touchscreens, indicator lights, audio devices, force feedback devices, and the like. The user interface input devices 1735 can comprise a variety of devices including a computer mouse, trackball, trackpad, joystick, wireless remote, drawing tablet, voice command system, eye tracking system, and the like. The user interface input devices 1735 may allow a user to select objects, icons, text and the like that appear on the user interface output devices 1730 via a command such as a click of a button or the like.

Embodiments of the communication subsystem 1740 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 1740 may be coupled to communications networks and other external systems 1755 (e.g., a network such as a LAN or the Internet), to a FireWire bus, or the like. In other embodiments, the communications subsystem 1740 may be physically integrated on the motherboard of the computer system 1700, may be a software program, such as soft DSL, or the like.

The RAM 1750 and the file storage subsystem 1725 are examples of tangible non-transitory media configured to store data such as error correction code parameters, codewords, and program instructions to perform the operations described herein when executed by the one or more processors, including executable computer code, human readable code, or the like. Other types of tangible non-transitory media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 1725 includes reader subsystems that can transfer data from the program product media to the storage subsystem 1715 for operation and execution by the processors 1705.

The computer system 1700 may also include software that enables communications over a network (e.g., the communications network 1755) such as the DNS, TCP/IP, UDP/IP, and HTTP/HTTPS protocols, and the like. In other embodiments, other communications software and transfer protocols may also be used, for example IPX, or the like.

Many other hardware and software configurations are suitable for use with the disclosed embodiments. For example, the computer system 1700 may be a desktop, portable, rack-mounted, or tablet configuration. Additionally, the computer system 1700 may be a series of networked computers. Further, a variety of microprocessors are contemplated and are suitable for the one or more processors 1705, such as PENTIUM™ microprocessors from Intel Corporation of Santa Clara, Calif., USA; OPTERON™ or ATHLON XP™ microprocessors from Advanced Micro Devices, Inc. of Sunnyvale, Calif., USA; and the like. Further, a variety of operating systems are contemplated and are suitable, such as WINDOWS®, WINDOWS XP®, WINDOWS VISTA®, or the like from Microsoft Corporation of Redmond, Wash., USA, SOLARIS® from Sun Microsystems, Inc. of Santa Clara, Calif., USA, various Linux and UNIX distributions, and the like. In still other embodiments, the techniques described above may be implemented upon a chip or an auxiliary processing board (e.g., a programmable logic device or graphics processor unit).

The embodiments described herein can be implemented in the form of control logic in software or hardware or a combination of both. The control logic may be stored in an information storage medium as a plurality of instructions adapted to direct an information-processing device to perform the methods or portions thereof disclosed in described herein. Other ways and/or methods to implement the embodiments are possible.

The minimum push up, multi-cell and multi-permutation schemes described herein can be implemented in a variety of systems for encoding and decoding data for transmission and storage. That is, codewords are received from a source over an information channel according to a minimum push up, a multi-cell or a multi-permutation scheme and are decoded into their corresponding data values and provided to a destination, such as a memory or a processor, and data values for storage or transmission are received from a source over an information channel and are encoded into a minimum push up, multi-cell or multi-permutation scheme.

Figure 18:
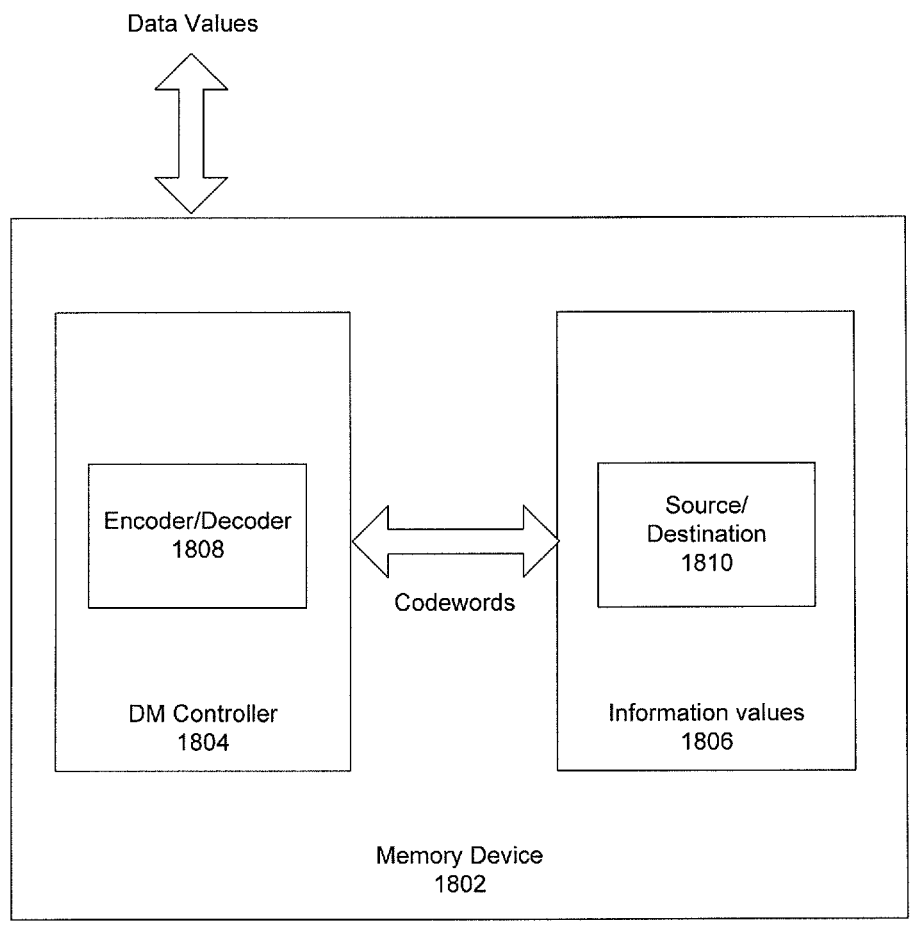
FIG. 18 is a block diagram that shows data flow in a memory device that operates according to the rank modulation scheme described herein.

The operations of encoding and decoding data according to a minimum push up, multi-cell or multi-permutation scheme can be illustrated as in FIG. 18, which shows data flow in a data device 1802 that operates according to the minimum push up, multi-cell or multi-permutation schemes described herein. In FIG. 18, the device includes a Data Modulation (DM) controller 1804 that stores and retrieves information values 1806 using one of a minimum push up, multi-cell or a multi-permutation scheme. The DM controller 1804 includes an encoder and decoder 1808 for encoding data values into codewords and decoding codewords into data values. The DM controller encodes data values and provides codewords to the source/destination block 1810, and decodes codewords from the source/destination and provides corresponding data values. The two-way nature of the data flow is indicated by the double-ended arrows labeled "data values" and "codewords". The DM controller includes interfaces through which the DM controller receives and provides the data values and the information values (codewords).

The information values 1806 comprise the means for physically representing data comprising the data values and codewords. For example, the information values 1806 may represent charge levels of memory cells, such that multiple cells are configured to operate as a virtual cell in which charge levels of the cells determine a permutation of the minimum push up, multi-cell or multi-permutation schemes. Data values are received and encoded to permutations of a minimum push up, multi-cell or multi-permutation scheme and charge levels of cells are adjusted accordingly, and codewords are determined according to cell charge levels, from which a corresponding data value is determined. Alternatively, the information values 1806 may represent features of a transmitted signal, such as signal frequency, magnitude, or duration, such that the cells or bins are defined by the signal features and determine a permutation of the minimum push up, multi-cell or multi-permutation schemes. For example, rank ordering of detected cell frequency changes over time can determine a permutation, wherein the highest signal frequency denotes the highest cell level. Other schemes for physical representation of the cells may be used.

For information values 1806 in the case of cell charge levels, the source/destination 1810 comprises memory cells in which n memory cells provide n cell values whose charge levels define a a minimum push up, multi-cell or multi-permutation scheme. For storing a codeword, the memory cells receive an encoded codeword and comprise a destination, and for reading a codeword, the memory cells provide a codeword for decoding and comprise a source. In the case of data transmission, the source/destination 1810 may comprise a transmitter/receiver that processes a signal with signal features such as frequency, magnitude, or duration that define cells or bins such that the signal features determine a permutation. That is, signal components comprising signal frequency, magnitude, or duration may be controlled and modulated by the transmitter such that a highest signal frequency component or greatest magnitude component or greatest time component corresponds to a highest cell level, followed by signal component values that correspond to other cell values and thereby define a permutation of the minimum push up, multi-cell or multi-permutation schemes. When the source/destination 1810 receives a codeword from the controller 1804, the source/destination comprises a transmitter of the device 1802 for sending an encoded signal. When the source/destination provides a codeword to the controller 1804 from a received signal, the source/destination comprises a receiver of the device for receiving an encoded signal. Signal components of the transmitted signal may be suitably modulated or otherwise transformed to define minimum push up, multi-cell or multi-permutation schemes, in view of the description herein.

VII. Conclusion

The present disclosure describes various examples that may be embodied as an apparatus, systems, methods, or a combinations thereof. In some examples, a programming method is described that may substantially reduce rewriting cost for rank modulation, and studied rewrite codes for a worst-case constraint on the cost. Some presented codes may be optimal full-assignment codes, although additional code constructions are contemplated of general code length, non-full assignment codes and average-case cost constraint.

Some examples describe a flash cell structure (multi-cell) that may enable a high number of updates between block erasures. Various update codes that are based on permutations of relative levels are also described.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein are possible in view of the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, apparatus, articles of manufacture, and/or systems, which can, of course, vary. It is also to be understood that the terminology used herein is for the purpose of describing particular embodiments only, and is not intended to be limiting.

With respect to the use of substantially any plural and/or singular terms herein, such terms can be translated from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). If a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense as would be understood for the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense as would be understood for the convention (e.g., "a system having at least one of A, B, or C" would include but not be limited to systems that have A alone, B alone, C alone, A and B together, A and C together, B and C together, and/or A, B, and C together, etc.). Virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, the disclosure is also thereby described in terms of any individual member or subgroup of members of the Markush group.

For any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. All language such as "up to," "at least," "greater than," "less than," and the like include the number recited and refer to ranges which can be subsequently broken down into subranges as discussed above. A range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

We claim:

1. A method to operate a memory device, the method comprising:
   receiving a new data set for a rank of a plurality of ranks to be stored in the memory device, wherein the memory device comprises a plurality of cells;
   reading a current state of candidate cells within the plurality of cells, wherein the candidate cells are used to store the new data set;
   creating a binary representation of the plurality of cells used to store the new data set;
   using a write once memory (WOM) code to combine the binary representation with the new data set to create a binary WOM vector;
   modifying the binary WOM vector to equal quantities of 1's and 0's within the candidate cells to create a new data vector; and
   writing the new data vector to the candidate cells.

2. The method of claim 1, wherein the WOM code includes a polar WOM code.

3. The method of claim 1, wherein a cost to write is defined as a maximum level of the plurality of cells after the new data vector is written minus a maximum level of the candidate cells before the new data vector is written.

4. The method of claim 3, wherein the cost is 1.

5. The method of claim 1, wherein the method further comprises:
   reading the new data vector from the candidate cells;
   modifying the new data vector to recreate the binary WOM vector; and
   using the WOM code on the binary WOM vector to separate the binary representation from the data set.

6. The method of claim 5, wherein the WOM code includes a polar WOM code.

7. A computer method to operate a memory device, the method comprising:
   receiving a new data set m for a rank to store in the memory device, wherein the memory device comprises a plurality of cells;
   reading a current state of the plurality of cells, wherein the plurality of cells are arranged according to a rank modulation scheme and the plurality of cells are used to store the received new data set m;
   determining a new multi-permutation to be written to the plurality of cells representing the received new data set m determined in accordance with a particular cost; and
   writing the new multi-permutation to the memory device.

8. A computer method to operate a memory device, the method comprising:
   receiving a data value comprising a plurality of data sets, wherein each data set includes a set of values representing a rank in a plurality of ranks; and repeating for the plurality of data sets in the data value:
  receiving a new data set for a rank of the plurality of ranks to be stored in the memory device, wherein the memory device comprises a plurality of cells;
  reading a current state of candidate cells within the plurality of cells, wherein the candidate cells are used to store the new data set;
  creating a binary representation of the plurality of cells used to store the new data set;
  using a write once memory (WOM) code to combine the binary representation with the new data set to create a binary WOM vector;
  modifying the binary WOM vector to equal quantities of 1's and 0's within the candidate cells creating a new data vector; and
  writing the new data vector to the candidate cells.

9. The method of claim 8, wherein the WOM code includes a polar WOM code.

10. A computer method of operate a memory device, the method comprising:
  reading a plurality of cells and determining a multi-permutation stored in the plurality of cells;
  identifying a group of cells in the plurality of cells, contained within each rank of a plurality of ranks; and
  for each rank:
    reading a new data vector from the rank;
    modifying the new data vector to recreate a binary write once memory (WOM) vector; and
    using a WOM code on the binary WOM vector to separate a binary representation from a data set.

11. The method of claim 10, wherein the WOM code includes a polar WOM code.

12. A memory controller, comprising:
  an interface configured to receive a new data set for a rank of a plurality of ranks to be stored in a memory comprising a plurality of cells; and
  a processor coupled to the interface and configured to:
    read a current state of candidate cells within the plurality of cells,
    wherein the candidate cells are used to store the new data set;
    create a binary representation of the plurality of cells used to store the new data set;
    use a write once memory (WOM) code to combine the binary representation with the new data set to create a binary WOM vector;
    modify the binary WOM vector to equal quantities of 1's and 0's within the candidate cells to create a new data vector; and
    write the new data vector to the candidate cells.

13. The memory controller of claim 12, wherein the WOM code includes a polar WOM code.

14. The memory controller of claim 12, wherein a cost to write is defined as a maximum level of the plurality of cells after the new data vector is written minus a maximum level of the candidate cells before the new data vector is written.

15. The memory controller of claim 14, wherein the cost is 1.

16. The memory controller of claim 12, wherein the processor is further configured to:
  read the new data vector from the candidate cells;
  modify the new data vector to recreate the binary WOM vector; and
  use the WOM code on the binary WOM vector to separate the binary representation from the data set.

17. The memory controller as in claim 16, wherein the WOM code includes a polar WOM code.

18. A memory controller, comprising:
  an interface configured to receive a new data set m for a rank to be stored in a memory device, wherein the memory device comprises a plurality of cells; and
  a processor coupled to the interface and configured to:
    read a current state of the plurality of cells within the plurality of cells that are arranged according to a rank modulation scheme and the plurality of cells are used to store the received new data set m;
    determine a new multi-permutation to be written to the plurality of cells that represents the received new data set m determined in accordance with a particular cost; and
    write the new multi-permutation to memory.

19. A memory controller, comprising:
  an interface configured to receive a data value comprising a plurality of data sets, wherein each data set is a set of values that represent a rank in a plurality of ranks; and
  a processor coupled to the interface and configured to perform operations repeated for the data sets in the data value, wherein the operations include:
    receive a new data set for a rank of the plurality of ranks to be stored in a memory device, wherein the memory device comprises a plurality of cells;
    read a current state of candidate cells within the plurality of cells, wherein the candidate cells are used to store the new data set;
    create a binary representation of the plurality of cells used to store the new data set;
    use a write once memory (WOM) code to combine the binary representation with the new data set to create a binary WOM vector;
    modify the binary WOM vector to equal quantities of 1's and 0's within the candidate cells to create a new data vector; and
    write the new data vector to the candidate cells.

20. The memory controller of claim 19, wherein the WOM code includes a polar WOM code.

21. A memory controller, comprising:
  an interface configured to provide access to a plurality of cells in a memory device; and
  a processor coupled to the interface and configured to:
    access the plurality of cells through the interface;
    read the plurality of cells; and
    perform operations that include:
      determine a multi-permutation stored in the plurality of cells;
      identify a group of cells in the plurality of cells contained within each rank of a plurality of ranks; and
      for each rank:
        read a new data vector from the rank;
        modify the new data vector to recreate a binary write once memory (WOM) vector; and
        us a WOM code on the binary WOM vector to separate a binary representation from a data set.

22. The memory controller of claim 21, wherein the WOM code includes a polar WOM code.

23. A data device, comprising:
  a memory configured to store data values; and
  a memory controller coupled to the memory and that is configured to store the data values in the memory by performance of operations that include:
    receive a new data set for a rank of a plurality of ranks to be stored in the data device, wherein the data device comprises a plurality of cells;

read a current state of candidate cells within the plurality of cells, wherein the candidate cells are used to store the new data set;
create a binary representation of the plurality of cells used to store the new data set;
use a write once memory (WOM) code to combine the binary representation with the new data set to create a binary WOM vector;
modify the binary WOM vector to equal quantities of 1's and 0's within the candidate cells to create a new data vector; and
write the new data vector to the candidate cells.

24. The data device of claim 23, wherein the WOM code includes a polar WOM code.

25. The data device of claim 23, wherein a cost to write is defined as a maximum level of the plurality of cells after the new data vector is written minus a maximum level of the candidate cells before the new data vector is written.

26. The data device of claim 25, wherein the cost is 1.

27. The data device of claim 23, wherein the operations further include:
read the new data vector from the candidate cells;
modify the new data vector to recreate the binary WOM vector; and
use a WOM code on the binary WOM vector to separate the binary representation from the data set.

28. The data device as in claim 27, wherein the WOM code includes a polar WOM code.

29. A data device, comprising:
a memory configured to store data values; and
a memory controller coupled to the memory and that is configured to store the data values in the memory by performance of operations that include:
receive a new data set m for a rank to store in the data device, wherein the data device comprises a plurality of cells;
read a current state of the plurality of cells, wherein the plurality of cells are arranged according to a rank modulation scheme and the plurality of cells are used to store the received new data set m;
determine a new multi-permutation to be written to the plurality of cells that represent the received new data set m determined in accordance with a particular cost; and
write the new multi-permutation to the data device.

30. A data device, comprising:
a memory configured to store data values; and
a memory controller coupled to the memory and that is configured to store the data values in the memory by performance of operations that include:
receive a data value comprising a plurality of data sets, wherein each data set is a set of values that represent a rank in a plurality of ranks, and repeat for the data sets in the data value operations include to:
receive a new data set for a rank of the plurality of ranks to be stored in the data device, wherein the data device comprises a plurality of cells;
read a current state of candidate cells within the plurality of cells, wherein the candidate cells are used to store the new data set;
create a binary representation of the plurality of cells used to store the new data set;
use a write once memory (WOM) code to combine the binary representation with the new data set to create a binary WOM vector;
modify the binary WOM vector to equal quantities of 1's and 0's within the candidate cells to create a new data vector; and
write the new data vector to the candidate cells.

31. The data device of claim 30, wherein the WOM code includes a polar WOM code.

32. An apparatus, comprising:
a data device configured to:
read a plurality of cells and determine a multi-permutation stored in the plurality of cells;
identify a group of cells in the plurality of cells, contained within each rank of a plurality of ranks; and
for each rank:
read a new data vector from the rank;
modify the new data vector to recreate a binary write once memory (WOM) vector; and
use a WOM code on the binary WOM vector to separate a binary representation from a data set.

33. The data device of claim 32, wherein the WOM code includes a polar WOM code.

* * * * *

UNITED STATES PATENT AND TRADEMARK OFFICE
CERTIFICATE OF CORRECTION

PATENT NO. : 9,086,955 B2
APPLICATION NO. : 13/791823
DATED : July 21, 2015
INVENTOR(S) : Jiang et al.

Page 1 of 6

It is certified that error appears in the above-identified patent and that said Letters Patent is hereby corrected as shown below:

In the specification

Column 1, Line 4, delete "CROSS-REFERENCES" and insert --CROSS-REFERENCE--, therefor.

Column 1, Line 56, delete "vvww.guru3d.com" and insert --www.guru3d.com--, therefor.

Column 2, Line 27, delete "i=n-1,n-2,...1" and insert --i=n-1,n-2,...,1--, therefor.

Column 2, Line 38, delete "location $v_{1+1}$." and insert --location $V_{i+1}$--, therefor.

Column 2, Line 48, delete "rn transistors" and insert --m transistors--, therefor.

Column 3, Line 27, delete "r), it can" and insert --n), it can--, therefor.

Column 3, Line 52, delete "I=n-1,n-2,...1 such" and insert --I=n-1,n-2...,1 such--, therefor.

Column 6, Line 47, delete "((1,2,3)). In" and insert --(1,2,3). In--, therefor.

Column 9, Line 59, delete "$\{1_{u(i) \leftarrow n+}1\text{-}i\}$" and insert --$\{1_{u(i) \leftarrow n+}1\text{-}i.\}$--, therefor.

Column 12, Line 60, delete "$=3.2^{n-4} \mid D \mid$" and insert --$=3.2^{n-4} \mid D \mid.$--, therefor.

Column 12, Line 65, delete "$|D| \geq \frac{n!}{3 \cdot 2^{n-s}}$," and insert --$|D| \geq \frac{n!}{3 \cdot 2^{n-s}}$.--, therefor.

Column 13, Line 43, delete "coset of $_{<2>},$*Let" and insert --coset of $<g_2>$. Let--, therefor.

Column 15, Line 52, delete "increase by in times," and insert --increase by m times,--, therefor.
In the specification Signed and Sealed this
Twenty-first Day of June, 2016

Michelle K. Lee
*Director of the United States Patent and Trademark Office*

CERTIFICATE OF CORRECTION (continued)
U.S. Pat. No. 9,086,955 B2

Column 16, Lines 51-52, delete "$\sigma^{-1} - \sigma'^{-1} = [-2,2,1]$," and insert -- $\sigma^{-1} - \sigma'^{-1} = [-1,-2,2,1]$ --, therefor.

Column 17, Line 8, delete "$\lim_{\frac{q}{n},n\to\infty} C_a(\mathcal{C}) = C_i(\mathcal{C})(C)/E(\text{cost})$," and insert -- $\lim_{q/n,n\to\infty} C_a(\mathcal{C}) = C_i(\mathcal{C})/E(\text{cost})$ --, therefor.

Column 17, Line 12, delete

"$B_{n,r}(\sigma) = \{\sigma' \in S_2 | \text{cost}(\sigma \to \sigma') \leq r\}, \quad k_{n,r} = |B_{n,r}(\sigma)|.$" and insert -- $B_{n,r}(\sigma) = \{\sigma' \in S_n | \text{cost}(\sigma \to \sigma') \leq r\}, \quad k_{n,r} = |B_{n,r}(\sigma)|.$ --, therefor.

Column 18, Line 28, delete " g/n,n→∞," and insert --$q/n, n \to \infty$,--, therefor.

Column 18, Line 60, delete "$\sigma = \{\sigma_0, \sigma_1, \ldots, \sigma_{\log n - 1}\})$" and insert --$\sigma = \{\sigma_0, \sigma_1, \ldots, \sigma_{\log n - 1}\}$--, therefor.

Column 18, Lines 63-64, delete "$V_j = (V_j((0), V_j(1), \ldots, V_j(n/\log n - 1))$," and insert --$V_j = (V_j(0), V_j(1), \ldots, V_j(n/\log n - 1))$,--, therefor.

Column 19, Line 7, delete "$f_i: \{0,1,,\ldots,\frac{n}{\log n} - 1 - i\}^{\log n} \to \{0,1,\ldots,\frac{n}{\log n} - 1 - i\}$," and insert -- $f_i: \{0,1,\ldots,\frac{n}{\log n} - 1 - i\}^{\log n} \to \{0,1,\ldots,\frac{n}{\log n} - 1 - i\}$ --, therefor.

Column 19, Line 17, delete "$f_i(V(i) = \sum_{j=0}^{\log n - 1} V_j(i) \mod (n/\log n - i)$," and insert -- $f_i(V(i)) = \sum_{j=0}^{\log n - 1} V_j(i) \mod (n/\log n - i)$ --, therefor.

Column 19, Line 25, delete "$s = (s_0, s_1, \ldots, s_{\log n - 1}$" and insert --$s = (s_0, s_1, \ldots, s_{\log n - 1})$--, therefor.

Column 19, Line 55, delete

"$\text{cost}(\sigma \to \sigma') = \max_{i \in [n]}(\sigma^{-1}(i) - \sigma^{-1}(i))$," and insert -- $\text{cost}(\sigma \to \sigma') = \max_{i \in [n]}(\sigma^{-1}(i) - \sigma'^{-1}(i))$, --, therefor.

Column 20, Line 7, delete "Pr(f$_i$(V'(i)=d$_i$)" and insert --Pr(f$_i$(V'(i))=d$_i$)--, therefor.

In the specification

Column 20, Line 33, delete "$C_a(\mathcal{C}) = t_+ C_i(\mathcal{C})/(q-1) \to 1$" and insert -- $C_a(\mathcal{C}) = t_a C_i(\mathcal{C})/(q-1) \to 1$ --, therefor.

Column 20, Line 33, delete "$g/n, n \to \infty$," and insert --$q/n, n \to \infty$,--, therefor.

Column 20, Line 37-38, delete "$C_i(\mathcal{C}), C_w \mathcal{C})$" and insert -- $C_i(\mathcal{C}), C_w(\mathcal{C})$ --, therefor.

Column 22, Line 35, delete "$c_{x_1} < c_{x_2} < \cdots < c_{x_n}$." and insert -- $c_{x_1} < c_{x_2} < \cdots < c_{x_n}$. --, therefor.

Column 22, Line 58, delete "[{4,5},{2,3},{1,5}]" and insert --[{4,6},{2,3},{1,5}]--, therefor.

Column 23, Line 67, delete "$[\{x_1,\ldots,x_{d_1}\},\{x_{d_1+1},x_{d_1+2},\ldots,x_{d_1+d_2}\},\ldots,\{x_{1+\Sigma_{i=1}^{n-1}d_i}, x_{2+\Sigma_{i=1}^{n-1}d_i},\ldots,x_{\Sigma_{i=1}^n d_i}\}]$," and insert -- $[\{x_1,x_2,\cdots,x_{d_1}\},\{x_{d_1+1},x_{d_1+2},\cdots,x_{d_1+d_2}\},\cdots,\{x_{1+\Sigma_{i=1}^{n-1}d_i}, x_{2+\Sigma_{i=1}^{n-1}d_i},\cdots,x_{\Sigma_{i=1}^n d_i}\}]$, --, therefor.

Column 24, Line 29-30, delete

"$[\{x_1, x_2, \ldots, x_{d_1}, \{x_{d_1+1}, x_{d_1+2}, \ldots, x_{d_1+d_2}\}, \ldots, \{x_{1+\Sigma_{i=1}^{n-1}d_i}, x_{2+\Sigma_{i=1}^{n-1}d_i}, \ldots, x_{\Sigma_{i=1}^n d_i}\}]$" and insert -- $[\{x_1,x_2,\cdots,x_{d_1}\},\{x_{d_1+1},x_{d_1+2},\cdots,x_{d_1+d_2}\},\cdots,\{x_{1+\Sigma_{i=1}^{n-1}d_i}, x_{2+\Sigma_{i=1}^{n-1}d_i},\cdots,x_{\Sigma_{i=1}^n d_i}\}]$ --, therefor.

Column 24, Line 32, delete "$(c_1', \bar{c}_2', \ldots, c_{d_2+d_2+\ldots+d_n}')$" and insert -- $(c_1', c_2', \cdots, c_{d_1+d_2+\cdots+d_n}')$ --, therefor.

Column 24, Line 36, delete "the $x_{d'}$ th cell" and insert -- the $x_{d_i}$ th cell --, therefor.

Column 25, Line 1-2, delete

"$(v_1, v_2, \ldots, v_{d_2+d_2+\ldots+d_n}) \in \{0, 1, \ldots, n-1\}^{d_1 d_2 + \ldots + d_n}$," and insert -- $(v_1, v_2, \cdots, v_{d_1+d_2+\cdots+d_n}) \in \{0, 1, \cdots, n-1\}^{d_1+d_2+\cdots+d_n}$, --, therefor.

Column 25, Line 17, delete "n=4 and $d_1=d_2=d_3=d_4,=5$." and insert --$d_1 = d_2 = d_3 = d_4 = 5$.--, therefor.

Column 25, Line 39, delete "00111001" and insert --0001111001--, therefor.

In the specification

Column 25, Line 52, delete "i=1, is =2 and" and insert --i=1, i=2 and--, therefor.

Column 25, Line 64, delete

"$(v_1, v_2, \ldots, v_{d_1 d_2 + \ldots d_n}) \in \{0, 1, \ldots, n-1\}^{d_2 d_2 + \ldots + d_n}$," and insert -- $(v_1, v_2, \cdots, v_{d_1+d_2+\cdots+d_n}) \in \{0,1,\cdots,n-1\}^{d_1+d_2+\cdots+d_n}$, --, therefor.

Column 26, Line 31-33, delete

"$[\{x_1, x_2, \ldots, x_{d_{l_1}+d_l+1}, x_{d_l+2}, \ldots, x_{d_l+d_l}\}, \ldots, \{x_{1+\Sigma_{l=1}^{r-1} d_i}, x_{2+\Sigma_{l=1}^{r-1} d_i}, \ldots, x_{\Sigma_{l=1}^r d_i}\}]$" and insert -- $[\{x_1, x_2, \cdots, x_{d_1}\}, \{x_{d_1+1}, x_{d_1+2}, \cdots, x_{d_1+d_2}\}, \cdots, \{x_{1+\Sigma_{i=1}^{n-1} d_i}, x_{2+\Sigma_{i=1}^{n-1} d_i}, \cdots, x_{\Sigma_{i=1}^n d_i}\}]$ --, therefor.

Column 27, Line 33, delete "σ=σ(1), σ(2), ..., σ(N))" and insert --$\sigma = (\sigma(1), \sigma(2), \ldots, \sigma(N))$--, therefor.

Column 28, Line 28, delete "Let I={1,...D}" and insert --Let I={1,...,D}--, therefor.

Column 28, Line 37, delete "$R_{inst=}(1/N)\log_2 \log_2 D$" and insert --$R_{inst=}(1/N)\log_2 D$--, therefor.

Column 29, Line 5, delete " $\sigma_{c'z}^{-1}(2) \subseteq \{\sigma_{cz}^{-1}(1) \cup \sigma_{cz}^{-1}(2) \cup \sigma_{cz}^{-1}(3)\} \backslash \sigma_{c'z}^{-1}(1).$ " and insert -- $\sigma_{c'z}^{-1}(2) \subseteq \{\sigma_{cz}^{-1}(1) \cup \sigma_{cz}^{-1}(2) \cup \sigma_{cz}^{-1}(3)\} \backslash \sigma_{c'z}^{-1}(1).$ --, therefor.

Column 29, Line 9, delete

" $\sigma_{c'z}^{-1}(i) \subseteq \{\cup_{j=1}^{i+1} \sigma_{cz}^{-1}(j)\} \dagger \{\cup_{j=1}^{i-1} \sigma_{c'z}^{-1}(j)\}.$ " and insert -- $\sigma_{c'z}^{-1}(i) \subseteq \{\cup_{j=1}^{i+1} \sigma_{cz}^{-1}(j)\} \backslash \{\cup_{j=1}^{i-1} \sigma_{c'z}^{-1}(j)\}.$ --, therefor.

Column 30, Line 47, delete " $c'=f_{p,s}(c,d)$ " and insert -- $c' = f_{p,\varepsilon}(c,d)$ --, therefor.

Column 31, Line 39, delete " $p=(p_{1,1}, \ldots, p_{m,zN})$ " and insert -- $p = (p_{1,1}, \cdots, p_{m,\varepsilon N})$ --, therefor.

Column 31, Line 48, delete "$(1-p/2-\epsilon)N \geq w(u_k) \leq (1-p/2+\epsilon)N$" and
insert --$(1 - p/2 - \varepsilon)N \leq w(u_k) \leq (1 - p/2 + \varepsilon)N$--, therefor.
In the specification

CERTIFICATE OF CORRECTION (continued)
U.S. Pat. No. 9,086,955 B2

Column 31, Line 55, delete "$I_{k,j}$=for" and insert --$I_{k,j} = i_j for$--, therefor.

Column 31, Line 65, delete "$1 \leq j \leq \varepsilon n\ p'_{m,j} = p_{m,j} + 1.$" and insert --$1 \leq j \leq \varepsilon n, p'_{m,j} = p_{m,j} + 1.$--, therefor.

Column 31, Line 67, delete "$p=(p_{1,1}, \ldots, p_{m,\varepsilon N})$" and insert --$p = (p_{1,1}, \ldots, p_{m,\varepsilon N})$--, therefor.

Column 32, Line 42, delete "$p_{m,1}, \ldots, p_{m,\varepsilon N}$" and insert --$p_{m,1}, \ldots, p_{m,\varepsilon N}$--, therefor.

Column 32, Line 61, delete "$d_{m-1}$) the" and insert --$d_{m-1}$), the--, therefor.

Column 33, Line 18, delete " N'=N," and insert --$N' = N + m\varepsilon N n'$,--, therefor.

Column 33, Line 19, delete "$D=2^{(2z-\delta N(m-1)}$" and insert --$D = 2^{(2z-\delta N)(m-1)}$--, therefor.

Column 33, Line 20, delete "(c,p,d), (c,p)≤(c,g,d)," and insert --$(c,p,d), (c,p) \leq f(c,p,d)$,--, therefor.

Column 33, Line 67, delete "$n \in \{0,1\}^N$" and insert --$u \in \{0,1\}^N$--, therefor.

Column 35, Line 10, delete "$\alpha_t \triangleq \Pi_{j=0}^t (1-\epsilon_t).$" and insert --$\alpha_t \triangleq \Pi_{j=0}^t (1-\varepsilon_t).$--, therefor.

Column 35, Line 46, delete "$R_t = \alpha_{t-1} H(\epsilon_t) - \epsilon_t$," and insert --$R_t = \alpha_{t-1} H(\varepsilon_t) - \delta_t$,--, therefor.

Column 35, Line 57, delete "$X_t = U_t G_2^{\otimes} n$" and insert --$X_t = U_t G_2^{\otimes}$--, therefor.

Column 36, Line 58-59, delete "and n'≤logN=log(mZ)," and insert --n'≥logN=log(mZ),--, therefor.

In the specification

CERTIFICATE OF CORRECTION (continued)
U.S. Pat. No. 9,086,955 B2

Column 36, Lines 65-66, delete "$= \frac{(2z-\delta N)(m-1)}{N+mzNn'}$" and insert --$= \frac{(2z-\delta N)(m-1)}{N+m\varsigma Nn'}$--, therefor.

Column 37, Line 41, delete "$A_s*(N)(X,Y)$," and insert --$A_s*^{(N)}(X,Y)$,--, therefor.

Column 37, Line 45, delete "b in y." and insert --b in x,y.--, therefor.

Column 37, Line 46-47, delete "p(a, b)>0,|(C(a,b|x,y)/N–p(a,b)|<ϵ." and insert --$p(a, b) > 0, |C(a,b|x, y)/N - p(a, b)| < \varepsilon$.--, therefor.

Column 38, Lines 36-37, delete "$R_{inst} > 2 \cdot (1 - 1/m)^2 \cdot \frac{1}{1+2zm\log(zm)} =$" and insert --$\mathcal{R}_{inst} > 2 \cdot (1 - 1/m)^2 \cdot \frac{1}{1+2zm\log(zm)}$--, therefor.

In the claims

Column 47, Line 19, Claim 10, delete "method of operate" and insert --method to operate--, therefor.

Column 47, Line 42, Claim 12, delete "the plurality of cells" and insert --the candidate cells--, therefor.

Column 47, Line 66, Claim 17, delete "controller as in claim" and insert --controller of claim--, therefor.

Column 48, Line 56, Claim 21, delete "us a WOM" and insert --use a WOM--, therefor.

Column 49, Line 27, Claim 28, delete "device as in claim" and insert --device of claim--, therefor.